(12) United States Patent
Nakajima et al.

(10) Patent No.: US 11,561,472 B2
(45) Date of Patent: Jan. 24, 2023

(54) RADIATION SENSITIVE COMPOSITION

(71) Applicant: NISSAN CHEMICAL INDUSTRIES, LTD., Tokyo (JP)

(72) Inventors: Makoto Nakajima, Toyama (JP); Kenji Takase, Funabashi (JP); Satoshi Takeda, Toyama (JP); Wataru Shibayama, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/735,498

(22) PCT Filed: Jun. 7, 2016

(86) PCT No.: PCT/JP2016/066917
§ 371 (c)(1),
(2) Date: Dec. 11, 2017

(87) PCT Pub. No.: WO2016/199762
PCT Pub. Date: Dec. 15, 2016

(65) Prior Publication Data
US 2018/0181000 A1 Jun. 28, 2018

(30) Foreign Application Priority Data
Jun. 11, 2015 (JP) .............................. JP2015-118625

(51) Int. Cl.
*G03F 7/075* (2006.01)
*G03F 7/038* (2006.01)
(Continued)

(52) U.S. Cl.
CPC .............. *G03F 7/0757* (2013.01); *C07F 7/18* (2013.01); *C07F 7/1804* (2013.01); *C08G 77/06* (2013.01); *C08G 77/14* (2013.01); *C08G 77/18* (2013.01); *C08G 77/50* (2013.01); *G03F 7/0045* (2013.01); *G03F 7/038* (2013.01); *G03F 7/075* (2013.01); *G03F 7/162* (2013.01); *G03F 7/168* (2013.01); *G03F 7/2002* (2013.01); *G03F 7/30* (2013.01); *G03F 7/322* (2013.01); *G03F 7/36* (2013.01);
(Continued)

(58) Field of Classification Search
CPC ........ G03F 7/0382; G03F 7/0757; G03F 7/30; G03F 7/36; C08G 77/18
USPC .............. 430/270.1, 272.1, 317; 528/43
See application file for complete search history.

(56) References Cited

U.S. PATENT DOCUMENTS

| 6,025,117 A | 2/2000 | Nakano et al. |
| 8,992,790 B2 * | 3/2015 | Ogihara ............... G03F 7/0002 216/48 |

(Continued)

FOREIGN PATENT DOCUMENTS

| CN | 107075302 A | 8/2017 |
| FI | 126817 B | 6/2017 |

(Continued)

OTHER PUBLICATIONS

Aug. 30, 2016 Written Opinion issued in International Patent Application No. PCT/JP2016/066917.

(Continued)

*Primary Examiner* — John S Chu
(74) *Attorney, Agent, or Firm* — Oliff PLC

(57) ABSTRACT

A radiation sensitive composition including a siloxane polymer exhibiting phenoplast crosslinking reactivity as a base resin, which is excellent in resolution and can be used as a radiation sensitive composition capable of allowing a pattern having a desired-shape to be formed with sufficient precision. A radiation sensitive composition including as a silane, a hydrolyzable silane, a hydrolysis product thereof, or a hydrolysis-condensation product thereof; and a photoacid generator, in which the hydrolyzable silane includes hydrolyzable silanes of Formula (1)

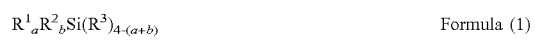

Formula (1)

wherein $R^1$ is an organic group of Formula (1-2)

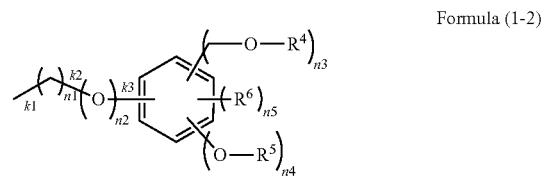

Formula (1-2)

and is bonded to a silicon atom through a Si—C bond or a Si—O bond, and $R^3$ is a hydrolyzable group; and Formula (2)

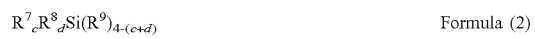

Formula (2)

wherein $R^7$ is an organic group of Formula (2-1)

Formula (2-1)

(Continued)

-continued

Formula (2-2)

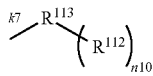

and is bonded to a silicon atom through a Si—C bond or a Si—O bond, and $R^9$ is a hydrolyzable group.

11 Claims, 1 Drawing Sheet

(51) Int. Cl.
| | |
|---|---|
| G03F 7/30 | (2006.01) |
| G03F 7/36 | (2006.01) |
| C07F 7/18 | (2006.01) |
| C08G 77/50 | (2006.01) |
| C08G 77/14 | (2006.01) |
| C08G 77/06 | (2006.01) |
| C08G 77/18 | (2006.01) |
| G03F 7/004 | (2006.01) |
| G03F 7/16 | (2006.01) |
| G03F 7/20 | (2006.01) |
| G03F 7/32 | (2006.01) |
| G03F 7/38 | (2006.01) |
| H01L 21/308 | (2006.01) |

(52) U.S. Cl.
CPC ............ G03F 7/38 (2013.01); H01L 21/3081 (2013.01); H01L 21/3086 (2013.01)

(56) References Cited

U.S. PATENT DOCUMENTS

| | | | |
|---|---|---|---|
| 2013/0210229 A1 | 8/2013 | Ogihara et al. | |
| 2014/0377957 A1* | 12/2014 | Takeda | G03F 7/11 438/703 |
| 2015/0028272 A1* | 1/2015 | Tseng | G02F 1/133512 252/586 |
| 2015/0031808 A1* | 1/2015 | Huang | G03F 7/0233 524/159 |
| 2015/0050596 A1* | 2/2015 | Wu | G03F 7/0005 430/287.1 |
| 2015/0072275 A1* | 3/2015 | Liu | G03F 7/0236 430/18 |
| 2018/0335698 A1 | 11/2018 | Nakajima et al. | |

FOREIGN PATENT DOCUMENTS

| | | |
|---|---|---|
| JP | H04-362647 A | 12/1992 |
| JP | H08-160621 A | 6/1996 |
| JP | H10-010741 A | 1/1998 |
| JP | 2003-295455 A | 10/2003 |
| JP | 3821165 B2 | 9/2006 |
| JP | 2008-248239 A | 10/2008 |
| JP | 4361527 B2 | 11/2009 |
| JP | 2010-107963 A | 5/2010 |
| JP | 2013-166812 A | 8/2013 |
| JP | 2013-230428 A | 11/2013 |
| WO | 2005/036269 A1 | 4/2005 |
| WO | 2006/126406 A1 | 11/2006 |
| WO | 2016/199762 A1 | 12/2016 |

OTHER PUBLICATIONS

Aug. 30, 2016 Search Report issued in International Patent Application No. PCT/JP2016/066917.

* cited by examiner a)　　　　　b)　　　　　c)

AFTER EXPOSURE

AFTER HEATING ON HOT PLATE AT 230 °C FOR 30 MINUTES UNDER AIR

RADIATION SENSITIVE COMPOSITION

TECHNICAL FIELD

The present invention relates to a radiation sensitive polysiloxane and a radiation sensitive composition including the radiation sensitive polysiloxane, a pattern formation method using the radiation sensitive composition, and a method for producing a semiconductor device.

BACKGROUND ART

In the field of microfabrication for producing integrated circuit elements, the development of lithography techniques using a radiation having a shorter wavelength has been pursued to increase the degree of integration.

Examples of such a shorter wavelength radiation include a bright line spectrum of a mercury-vapor lamp, far-ultraviolet rays such as excimer lasers, X-rays, and electron beams. Among these radiations, a KrF excimer laser (with a wavelength of 248 nm), an ArF excimer laser (with a wavelength of 193 nm), and EUV (with a wavelength of 13.5 nm) have been attracting attention.

Furthermore, also in the field of display and the field of micromachines such as acceleration sensors, the development of a high aspect patterning technique as well as size reduction and higher definition has been desired.

As the high aspect patterning technique, for example, a double-layer resist process is known. In the double-layer resist process, it is necessary to pattern an upper layer resist by exposure and development and transfer the pattern to a lower layer resist.

To transfer the pattern of an upper layer resist to a lower layer resist with high precision, dry etching is usually used, and accordingly, the upper layer resist is required not only to be highly sensitive and be of high resolution, but also to be highly resistant to dry etching.

As a siloxane-containing negative resist material, a system formed by making use of a crosslinking reaction of silanol and a system formed by making use of a crosslinking reaction of an organic functional group are known. Examples of the siloxane-containing negative resist material include: a composition containing a resin component and a component (a photoacid generator or a photobase generator) that generates an acid or a base when irradiated with radiation, and formed by making use of a chemical reaction of them; and a composition containing a component (a photopolymerization initiator) that generates a radical when irradiated with radiation and a resin component, and formed by making use of a radical polymerization reaction.

For example, Patent Literature 1 discloses a negative radiation sensitive composition including a siloxane resin and a photoacid or photobase generator contained in the resin.

As a negative resist formed by making use of a chemical reaction of an organic functional group, Patent Literature 2 discloses a negative radiation sensitive composition including a silane containing an epoxy group as a siloxane resist for a double layer resist.

Patent Literature 3 discloses a negative radiation sensitive composition including a silane containing an acrylic or methacrylic group.

Patent Literature 4 discloses a negative radiation sensitive composition including a silane containing a styryl group using a photopolymerization initiator. A negative radiation sensitive composition according to the present invention is of a phenoplast crosslinking type, and differs from the crosslinking type of the above-mentioned compositions.

Many siloxane-based resists including a phenolic hydroxy group as a developing-solution-soluble group are known, but any of them has been used as a positive resist. For example, Patent Literature 5 discloses a positive radiation sensitive composition including hydroxyphenyl alkyl silsesquioxane as a component, in which a photoacid generator and a phenolic or carboxylic acid compound protected with an acid-decomposable group are contained.

Patent Literature 6 discloses a positive radiation sensitive composition including a photoacid generator and a siloxane polymer in which a phenolic hydroxy group is protected with an unstable acid group, such as t-butoxycarbonyl group, t-butoxycarbonylmethyl group, trimethylsilyl group, or tetrahydropyranyl group.

In Patent Literature 7, pattern formation is performed by irradiation of electron beams or EUV, using a polyphenol compound having two or more phenolic hydroxy groups in one molecule and a phenoplast crosslinking agent containing methylol or protected methylol.

PRIOR ART DOCUMENTS

Patent Documents

Patent Document 1: Japanese Patent No. 3821165
Patent Document 2: Japanese Unexamined Patent Application Publication No. 2003-295455 (JP 2003-295455 A)
Patent Document 3: Japanese Unexamined Patent Application Publication No. 2008-248239 (JP 2008-248239 A)
Patent Document 4: Japanese Unexamined Patent Application Publication No. 10-10741 (JP 10-10741 A)
Patent Document 5: Japanese Patent No. 4361527
Patent Document 6: Japanese Unexamined Patent Application Publication No. 08-160621 (JP 08-160621 A)
Patent Document 7: Japanese Unexamined Patent Application Publication No. 2010-107963 (JP 2010-107963 A)

SUMMARY OF THE INVENTION

Problem to be Solved by the Invention

A conventional radiation sensitive composition including polysiloxane as a base resin provides a lower resolution than a conventional radiation sensitive composition including an acrylic-based resin as a base resin, and hence, the precision of a pattern obtained is insufficient when an excimer laser such as KrF laser is used as exposure light, and therefore, further improvement of the composition has been desired.

The present invention is to solve the above-mentioned problem, and an object of the present invention is to provide a radiation sensitive composition including polysiloxane as a base resin, the composition being excellent in resolution and allowing a pattern having a desired shape to be formed with sufficient precision.

Means for Solving the Problem

The inventors found that a radiation sensitive composition including a siloxane polymer having phenoplast crosslinking reactivity as a base resin and further including a photoacid generator and a solvent allows resolution to be increased, and the inventors then completed the present invention.

The present invention provides, as a first aspect, a radiation sensitive composition comprising: as a silane, a hydrolyzable silane, a hydrolysis product thereof, or a hydrolysis-condensation product thereat and a photoacid generator, in which the hydrolyzable silane includes hydrolyzable silanes of Formula (1) and Formula (2),

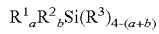   Formula (1)

[wherein $R^1$ is an organic group of Formula (1-2):

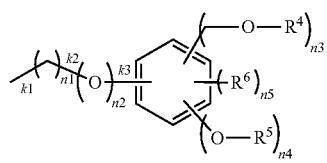   Formula (1-2)

(wherein $R^4$ is a hydrogen atom, a $C_{1-10}$ alkyl group, or an acyl group; $R^5$ is a hydrogen atom, a $C_{1-10}$ alkyl group, or a $C_{10-10}$ alkyl group having a $C_{1-10}$ alkoxy group; $R^6$ is a $C_{1-10}$ alkyl group; n1 is an integer of 0 to 10; n2 is an integer of 0 or 1; n3 is an integer satisfying 1≤n3≤5; n4 is an integer satisfying 0≤n4≤4; n5 is an integer satisfying 0≤n5≤4; n3+n4+n5 is an integer satisfying 1≤n3+n4+n5≤5; k1 is an end bonded to a silicon atom when n1 is an integer of 1 to 10; k2 is an end bonded to a silicon atom when n1 is 0 and n2 is 1; and k3 is an end bonded to a silicon atom when n1 and n2 are each 0), and is bonded to a silicon atom through a Si—C bond or a Si—O bond; $R^2$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, an amino group, or a cyano group, or a combination of these groups, and is bonded to a silicon atom through a Si—C bond; $R^3$ is an alkoxy group, an acyloxy group, or a halogen group; a is an integer of 1; b is an integer of 0 to 2; and a+b is an integer of 1 to 3],

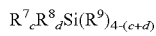   Formula (2)

[wherein $R^7$ is an organic group of Formula (2-1) or Formula (2-2):

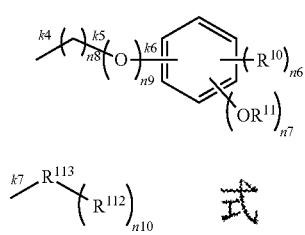

(in Formula (2-1), $R^{10}$ is a $C_{1-10}$ alkyl group; $R^{11}$ is a hydrogen atom, a $C_{10-10}$ alkyl group, or a $C_{1-10}$ alkyl group having a $C_{1-10}$ alkoxy group; n6 is an integer satisfying 0≤n6≤3; n7 is an integer satisfying 1≤n7≤3; n6+n7 is an integer satisfying 1≤n6+n7≤4; n8 is an integer satisfying 0≤n8≤10; n9 is an integer of 0 or 1; k4 is an end bonded to a silicon atom when n8 is an integer of 1 to 10; k5 is an end bonded to a silicon atom when n8 is 0 and n9 is 1; and k6 is an end bonded to a silicon atom when n8 and n9 are each 0, and in Formula (2-2), $R^{112}$ is a hydroxy group, a halogen atom, an epoxy group, an oxetane group, an acyloxy group, a (meth)acryloyl group, a silyl group, a $C_{1-10}$ alkoxy group, a $C_{1-10}$ alkoxy group having a $C_{1-10}$ alkoxy group, or a combination of these groups; $R^{113}$ is a $C_{1-10}$ alkylene group or a $C_{6-40}$ arylene group, optionally containing an oxygen atom; n10 is an integer of 1 to 4; and k7 is an end bonded to a silicon atom), and is bonded to a silicon atom through a Si—C bond; $R^8$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, an amino group, or a cyano group, or a combination of these groups, and is bonded to a silicon atom through a Si—C bond; $R^9$ is an alkoxy group, an acyloxy group, or a halogen group; c is an integer of 1; d is an integer of 0 to 2; and c+d is an integer of 1 to 3];

as a second aspect, the radiation sensitive composition according to the first aspect, in which the hydrolyzable silane is a combination of the hydrolyzable silane of Formula (1), the hydrolyzable silane of Formula (2), and other hydrolyzable silane, and the other hydrolyzable silane is at least one hydrolyzable silane selected from the group consisting of a hydrolyzable silane of Formula (3):

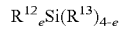   Formula (3)

(wherein $R^{12}$ is an alkyl group, an aryl group, a halogenated alkyl group, a halogenated aryl group, an alkenyl group, or an organic group having a mercapto group, a sulfonamide group, or a cyano group, or a combination of these groups, and is bonded to a silicon atom through a Si—C bond; $R^{13}$ is an alkoxy group, an acyloxy group, or a halogen group; and e is an integer of 0 to 3), and a hydrolyzable silane of Formula (4):

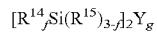   Formula (4)

(wherein $R^{14}$ is an alkyl group or an aryl group, and is bonded to a silicon atom through a Si—C bond; $R^{15}$ is an alkoxy group, an acyloxy group, or a halogen group; Y is an alkylene group, an alkenylene group, or an arylene group; f is an integer of 0 or 1; and g is an integer of 0 or 1);

as a third aspect, a radiation sensitive composition comprising, as a polymer, a hydrolysis-condensation product of a hydrolyzable silane comprising a combination of the hydrolyzable silane of Formula (1) and the hydrolyzable silane of Formula (2) according to the first aspect and the hydrolyzable silane of Formula (3) according to the second aspect;

as a fourth aspect, a radiation sensitive composition comprising, as a polymer, a hydrolysis-condensation product of a hydrolyzable silane comprising a combination of the hydrolyzable silane of Formula (1) and the hydrolyzable silane of Formula (2) according to the first aspect and the hydrolyzable silane of Formula (4) according to the second aspect;

as a fifth aspect, a radiation sensitive composition comprising, as a polymer, a hydrolysis-condensation product of a hydrolyzable silane comprising a combination of the hydrolyzable silane of Formula (1) and the hydrolyzable silane of Formula (2) according to the first aspect and the hydrolyzable silane of Formula (3) and the hydrolyzable silane of Formula (4) according to the second aspect;

as a sixth aspect, the radiation sensitive composition according to any one of the first to fifth aspects, further comprising a quencher;

as a seventh aspect, the radiation sensitive composition according to any one of the first to sixth aspects, further comprising a crosslinking agent;

as an eighth aspect, a method for forming a resist pattern, the method comprising the steps of: applying the radiation sensitive composition according to any one of the first to seventh aspects onto a semiconductor substrate and baking the composition to form a resist film; exposing the resist film to light; and after the exposure, developing the resist film to form a resist pattern;

as a ninth aspect, a method for producing a semiconductor device, the method comprising the steps of: applying the radiation sensitive composition according to any one of the first to seventh aspects onto a semiconductor substrate and baking the composition to form a resist film; exposing the resist film to light; after the exposure, developing the resist film to form a resist pattern; and processing the semiconductor substrate using the resist pattern;

as a tenth aspect, a method for producing a semiconductor device, the method comprising the steps of: forming an organic underlayer film on a semiconductor substrate; applying the radiation sensitive composition according to any one of the first to seventh aspects onto the underlayer film and baking the composition to form a resist film; exposing the resist film to light; after the exposure, developing the resist film to form a resist pattern; etching the organic underlayer film using the resist pattern; and processing the semiconductor substrate using the patterned organic underlayer film; and as an eleventh aspect, a compound of Formula (5-1), Formula (5-2), or Formula (5-3):

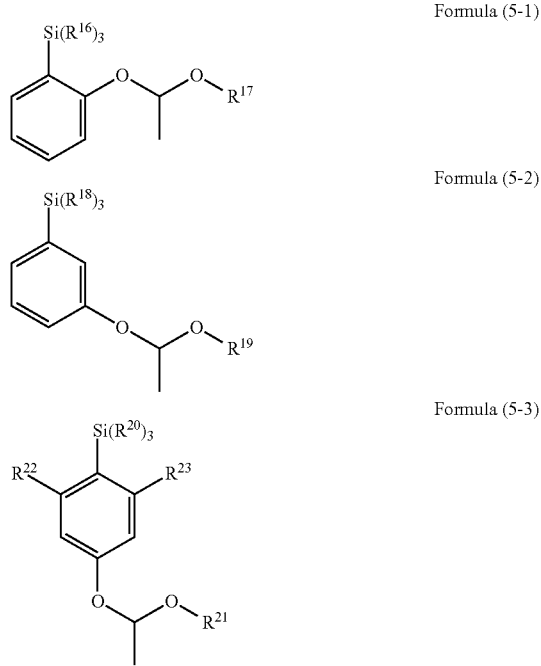

(wherein $R^{17}$, $R^{19}$, $R^{21}$, $R^{22}$, and $R^{23}$ are each independently an alkyl group; and $R^{16}$, $R^{18}$, and $R^{20}$ are each independently an alkoxy group, an acyloxy group, or a halogen group).

Effects of the Invention

The present invention provides a polysiloxane-based radiation sensitive resin that is excellent in sensitivity and resolution and includes polysiloxane as its skeleton, and has, in its side chain, a functional group capable of undergoing a phenoplast reaction making use of a crosslinking structure formed by a reaction of a protected methylol group and a protected phenolic hydroxy group.

The phenoplast reactive group in the radiation sensitive resin of the present invention includes methylol or a protected methylol group, and when the reactive group is added to a portion with an abundance of electrons of an aromatic ring in the polymer, the resin can be cured at low temperature, and thus, a negative pattern that is good as a resist for lithography can be obtained.

The radiation sensitive resin of the present invention is a polysiloxane-based radiation sensitive resin having polysiloxane at its skeleton, and accordingly, a resist pattern formed by exposure is excellent in gas etching resistance.

Therefore, the radiation sensitive resin of the present invention is also applicable to a multi-process in which, for the purpose of preventing the collapse of a finer pattern of a resist film at the time of development, the film thickness of a resist is made thinner, and an underlayer film having gas etching resistance different from that of the resist material is provided directly under the resist film.

As described above, the present invention provides a radiation sensitive composition that has high lithography characteristics and allows a pattern having a desired shape to be formed with sufficient precision.

MODES FOR CARRYING OUT THE INVENTION

Figure 1:
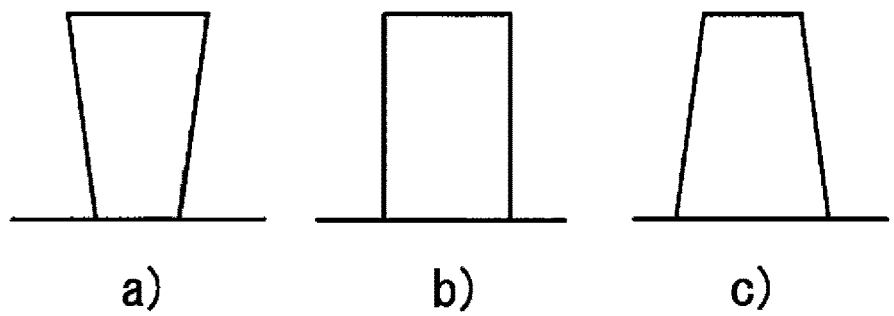
FIG. 1 illustrates a sectional view of resist pattern shapes.

The present invention provides a radiation sensitive composition comprising: as a silane, a hydrolyzable silane, a hydrolysis product thereof, or a hydrolysis-condensation product thereof; and a photoacid generator, in which the hydrolyzable silane includes hydrolyzable silanes of Formula (1) and Formula (2).

In Formula (1), $R^1$ is an organic group of Formula (1-2) and is bonded to a silicon atom through a Si—C bond or a Si—O bond. $R^2$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, an amino group, or a cyano group, or a combination of these groups, and is bonded to a silicon atom through a Si—C bond. $R^3$ is an alkoxy group, an acyloxy group, or a halogen group. a is an integer of 1; b is an integer of 0 to 2; and a+b is an integer of 1 to 3.

In Formula (1-2), $R^4$ is a hydrogen atom, a $C_{1-10}$ alkyl group, or an acyl group; $R^5$ is a hydrogen atom, a $C_{1-10}$ alkyl group, or a $C_{1-10}$ alkyl group having a $C_{1-10}$ alkoxy group; $R^6$ is a $C_{1-10}$ alkyl group; n1 is an integer of 0 to 10; n2 is an integer of 0 or 1; n3 is an integer satisfying 1≤n3≤5; n4 is an integer satisfying 0≤n4≤4; n5 is an integer satisfying 0≤n5≤4. n3+n4+n5 is an integer satisfying 1≤n3+n4+n5≤5, preferably an integer satisfying 1≤n3+n4+n5≤3.

k1, k2, or k3 is an end bonded to a silicon atom. In other words, in Formula (1-2), when n1 is 0 and n2 is 1, the organic group is bonded at k2 to a silicon atom of the silane.

When n2 is 0 and n1 is an integer other than 0, the organic group is bonded at k1 to a silicon atom of the silane. When n2 is 0 and n1 is 0, the organic group is bonded at k3 to a silicon atom of the silane.

In Formula (2), $R^7$ is an organic group of Formula (2-1) and is bonded to a silicon atom through a Si—C bond. $R^8$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, an amino group, or a cyano group, or a combination of these groups, and is bonded to a silicon atom through a Si—C bond. $R^9$ is an alkoxy group, an acyloxy group, or a halogen group. c is an integer of 1; d is an integer of 0 to 2; and c+d is an integer of 1 to 3.

In Formula (2-1), $R^{10}$ is a $C_{1-10}$ alkyl group; $R^{11}$ is a hydrogen atom, a $C_{1-10}$ alkyl group, or a $C_{1-10}$ alkyl group having a $C_{1-10}$ alkoxy group. n6 is an integer satisfying 0≤n6≤3. n7 is an integer satisfying 1≤n7≤3. n6+n7 is an integer satisfying 1≤n6+n7≤4, preferably an integer satisfying 1≤n6+n7≤3. n8 is an integer satisfying 0≤n8≤10. n9 is an integer of 0 or 1. k4, k5, or k6 is an end bonded to a silicon atom. In other words, in Formula (2-1), when n8 is 0 and n9 is 1, the organic group is bonded at k5 to a silicon atom of the silane. When n9 is 0 and n8 is an integer other than 0, the organic group is bonded at k4 to a silicon atom of the silane. When n9 is 0 and n8 is 0, the organic group is bonded at k6 to a silicon atom of the silane.

In Formula (2-2), $R^{112}$ is a hydroxy group, a halogen atom, an epoxy group, an oxetane group, an acyloxy group, a (meth)acryloyl group, a silyl group, a $C_{1-10}$ alkoxy group, a $C_{1-10}$ alkoxy group having a $C_{1-10}$ alkoxy group, or a combination of these groups; and $R^{113}$ is a $C_{1-10}$ alkylene group or a $C_{6-40}$ arylene group, optionally containing an oxygen atom. n10 is an integer of 1 to 4; and k7 is an end bonded to a silicon atom.

Examples of the above-mentioned alkoxy group include alkoxy groups listed later.

Examples of the above-mentioned halogen atom (halogen group) include halogen atoms (halogen groups) listed later.

The above-mentioned $C_{1-10}$ alkylene group is an alkylene group corresponding to a linear or cyclic alkyl group having a carbon atom number of 1 to 10 mentioned later, and examples thereof include methylene group, ethylene group, and propylene group.

The above-mentioned $C_{6-40}$ arylene group is an arylene group corresponding to a $C_{6-40}$ aryl group mentioned later, and examples thereof include phenyl group and naphthyl group.

These are monomers that generate an alcohol through decomposition caused by acid or base and monomers having an alcohol.

The composition of the present invention may include, as optional components, an acid, water, an alcohol, other organic polymers, a light-absorbing compound, and a surfactant, for example.

The radiation sensitive composition of the present invention has a solid content of, for example, 0.1% by mass to 50% by mass, 0.1% by mass to 30% by mass, or 0.1% by mass to 25% by mass. The solid content herein is obtained by subtracting a solvent component from all components of the radiation sensitive composition.

The proportion of the hydrolyzable silane, the hydrolysis product thereof, and the hydrolysis-condensation product thereof in the solids is 20% by mass or more, for example, 50% by mass to 99.9% by mass, 60% by mass to 99.9% by mass, or 70% by mass to 99.9% by mass.

The above-mentioned hydrolyzable silane, the hydrolysis product thereof, and the hydrolysis-condensation product thereof may be used in the form of a mixture thereof. A condensation product obtained by hydrolyzing the hydrolyzable silane and condensing the obtained hydrolysis product thereof may be used. Alternatively, there may be used a mixture obtained by mixing a hydrolysis-condensation product with a silane compound or a partial-hydrolysis product in which hydrolysis for obtaining the hydrolysis-condensation product has not been perfectly completed. Such a condensation product is a polymer having a polysiloxane structure.

The alkyl group is, for example, a $C_{1-10}$ alkyl group, and examples thereof include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The aryl group is, for example, a $C_{6-40}$ aryl group, and examples thereof include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The alkenyl group is, for example, a $C_{2-10}$ alkenyl group, and examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The acyl group is, for example, a $C_{2-10}$ acyl group, and examples thereof include methylcarbonyl group, ethylcarbonyl group, n-propylcarbonyl group, i-propylcarbonyl group, cyclopropylcarbonyl group, n-butylcarbonyl group, i-butylcarbonyl group, s-butylcarbonyl group, t-butylcarbonyl group, cyclobutylcarbonyl group, 1-methyl-cyclopropylcarbonyl group, 2-methyl-cyclopropylcarbonyl group, n-pentylcarbonyl group, 1-methyl-n-butylcarbonyl group, 2-methyl-n-butylcarbonyl group, 3-methyl-n-butylcarbonyl group, 1,1-dimethyl-n-propylcarbonyl group, 1,2-dimethyl-n-propylcarbonyl group, 2,2-dimethyl-n-propylcarbonyl group, 1-ethyl-n-propylcarbonyl group, cyclopentylcarbonyl group, 1-methyl-cyclobutylcarbonyl group, 2-methyl-cyclobutylcarbonyl group, 3-methyl-cyclobutylcarbonyl group, 1,2-dimethyl-cyclopropylcarbonyl group, 2,3-dimethyl-cyclopropylcarbonyl group, 1-ethyl-cyclopropylcarbonyl group, 2-ethyl-cyclopropylcarbonyl group, n-hexylcarbonyl group, 1-methyl-n-pentylcarbonyl group, 2-methyl-n-pentylcarbonyl group, 3-methyl-n-pentylcarbonyl group, 4-methyl-n-pentylcarbonyl group, 1,1-dimethyl-n-butylcarbonyl group, 1,2-dimethyl-n-butylcarbonyl group, 1,3-dimethyl-n-butylcarbonyl group, 2,2-dimethyl-n-butylcarbonyl group, 2,3-dimethyl-n-butylcarbonyl group, 3,3-dimethyl-n-butylcarbonyl group, 1-ethyl-n-butylcarbonyl group, 2-ethyl-n-butylcarbonyl group, and 1,1,2-trimethyl-n-propylcarbonyl group.

Examples of the organic group having an epoxy group include glycidoxymethyl group, glycidoxyethyl group, glycidoxypropyl group, glycidoxybutyl group, and epoxycyclohexyl group.

Examples of the organic group having an acryloyl group include acryloylmethyl group, acryloylethyl group, and acryloylpropyl group.

Examples of the organic group having a methacryloyl group include methacryloylmethyl group, methacryloylethyl group, and methacryloylpropyl group.

Examples of the organic group having a mercapto group include ethylmercapto group, butylmercapto group, hexylmercapto group, and octylmercapto group.

Examples of the organic group having an amino group include amino group, aminomethyl group, and aminoethyl group.

Examples of the organic group having a cyano group include cyanoethyl group and cyanopropyl group.

The above-mentioned alkoxy group is, for example, a $C_{1-20}$ or $C_{1-10}$ alkoxy group, and examples thereof include an alkoxy group having a linear, branched, or cyclic alkyl moiety having a carbon atom number of 1 to 20. Examples of such an alkoxy group include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Furthermore, examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

The above-mentioned acyloxy group is, for example, a $C_{1-20}$, $C_{1-10}$, $C_{2-20}$, or $C_{2-10}$ acyloxy group, and examples thereof include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the above-mentioned halogen group include fluorine, chlorine, bromine, and iodine atoms.

In the present invention, there may be used a hydrolyzable silane comprising a combination of the hydrolyzable silane of Formula (1), the hydrolyzable silane of Formula (2), and other hydrolyzable silane.

Examples of the other hydrolyzable silane include at least one hydrolyzable silane selected from the group consisting of the hydrolyzable silane of Formula (3) and the hydrolyzable silane of Formula (4).

The radiation sensitive composition may include, as a polymer, a hydrolysis-condensation product (polysiloxane) of a hydrolyzable silane comprising a combination of the hydrolyzable silane of Formula (1), the hydrolyzable silane of Formula (2), and the hydrolyzable silane of Formula (3).

Alternatively, the radiation sensitive composition may include, as a polymer, a hydrolysis-condensation product (polysiloxane) of a hydrolyzable silane comprising a combination of the hydrolyzable silane of Formula (1), the hydrolyzable silane of Formula (2), and the hydrolyzable silane of Formula (4).

Alternatively, the radiation sensitive composition may include, as a polymer, a hydrolysis-condensation product (polysiloxane) of a hydrolyzable silane comprising a combination of the hydrolyzable silane of Formula (1), the hydrolyzable silane of Formula (2), the hydrolyzable silane of Formula (3), and the hydrolyzable silane of Formula (4).

In Formula (3), $R^{12}$ is an alkyl group, an aryl group, a halogenated alkyl group, a halogenated aryl group, an alkenyl group, or an organic group having a mercapto group, a sulfonamide group, or a cyano group, or a combination of these groups, and is bonded to a silicon atom through a Si—C bond; $R^{13}$ is an alkoxy group, an acyloxy group, or a halogen group; and e is an integer of 0 to 3.

In Formula (4), $R^{14}$ is an alkyl group or an aryl group, and is bonded to a silicon atom through a Si—C bond; $R^{15}$ is an alkoxy group, an acyloxy group, or a halogen group; Y is an alkylene group, an alkenylene group, or an arylene group; f is an integer of 0 or 1; and g is an integer of 0 or 1.

The above-mentioned alkylene group is a divalent organic group derived from an alkyl group. The above-mentioned alkenylene group is a divalent organic group derived from an alkenyl group. The above-mentioned arylene group is a divalent organic group derived from an aryl group.

Examples of the alkyl group, the aryl group, the halogenated alkyl group, the halogenated aryl group, the alkoxyaryl group, the alkenyl group, or the organic group having an epoxy group, an acryloyl group, a methacryloyl group, a mercapto group, an amino group, or a cyano group, the alkoxy group, the acyloxy group, the halogen group, the alkylene group, the alkenylene group, and the arylene group include the above-mentioned examples.

Examples of the hydrolyzable silane of Formula (1) are as follows.

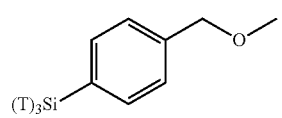
Formula (1-2-1)

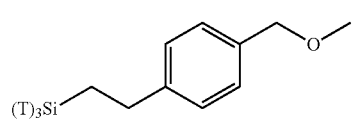
Formula (1-2-2)

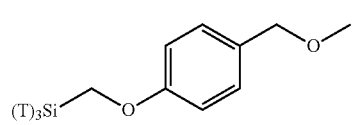
Formula (1-2-3)

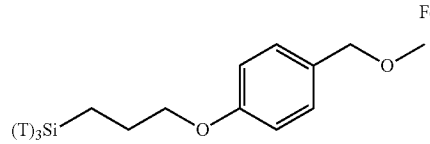
Formula (1-2-4)

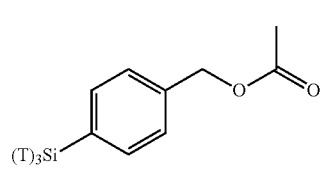
Formula (1-2-5)

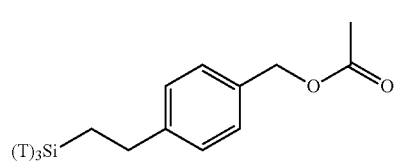
Formula (1-2-6)

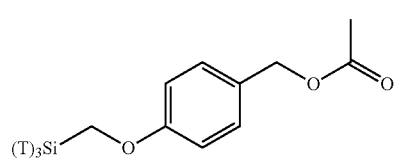
Formula (1-2-7)

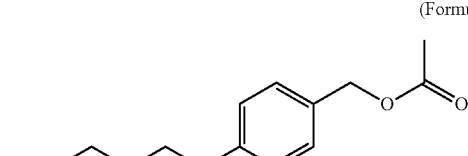
(Formula 1-2-8)

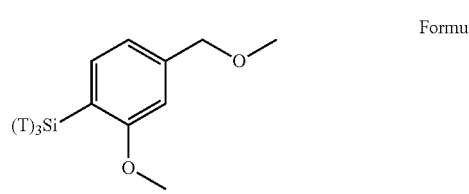
Formula (1-2-9)

Formula (1-2-10)
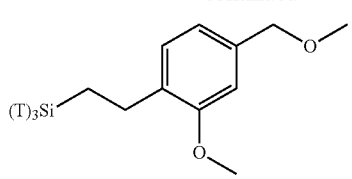

Formula (1-2-11)
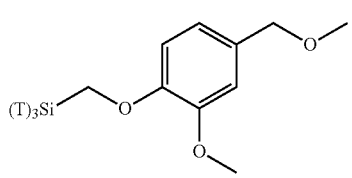

Formula (1-2-12)
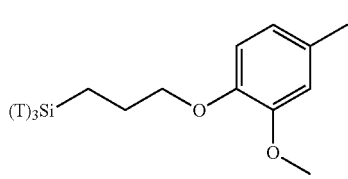

Formula (1-2-13)
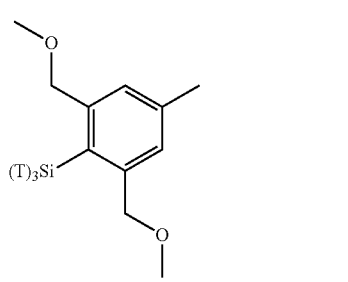

Formula (1-2-14)
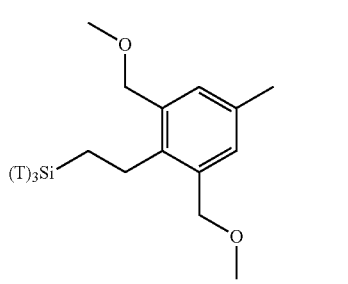

Formula (1-2-15)
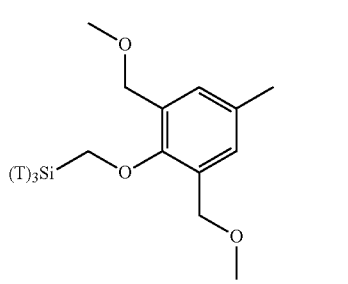

Formula (1-2-16)
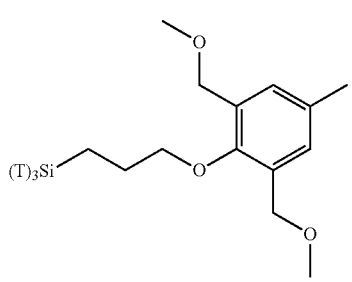

In the above-mentioned formulae, T is a hydrolyzable group, namely, the above-mentioned alkoxy group, acyloxy group, or halogen group. In particular, the alkoxy group, such as methoxy group or ethoxy group, is preferable.

Examples of the hydrolyzable silane of Formula (2) wherein $R^7$ is an organic group of Formula (2-1) are as follows.

Formula (2-1-1)
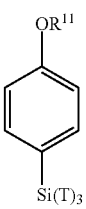

Formula (2-1-2)
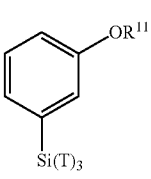

Formula (2-1-3)
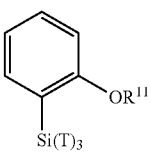

Formula (2-1-4)
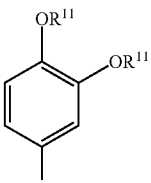

Formula (2-1-5)
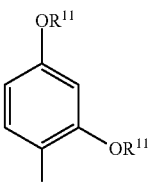

Formula (2-1-6)
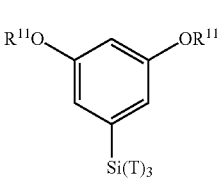

Formula (2-1-7)
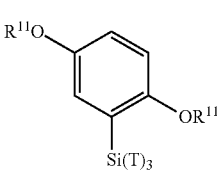

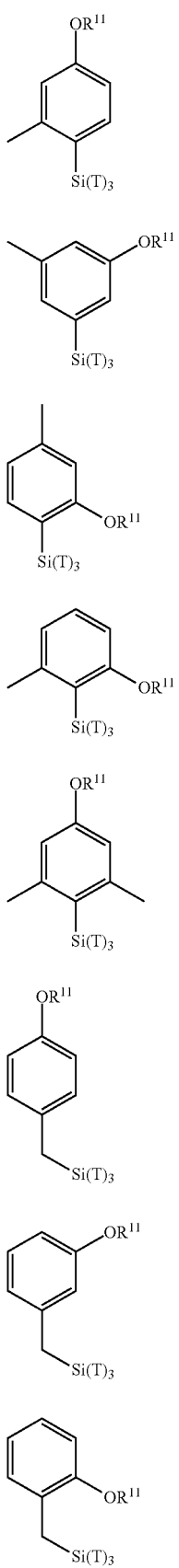
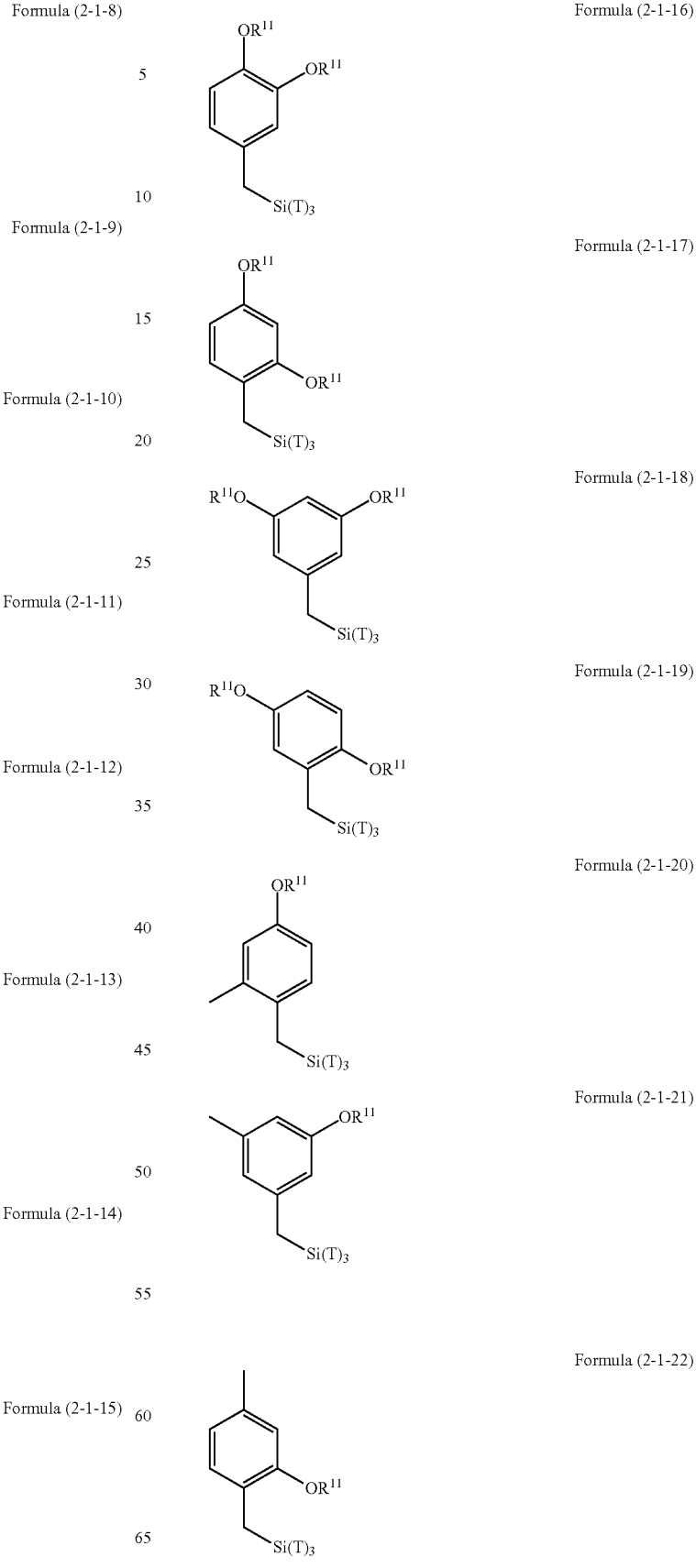

-continued
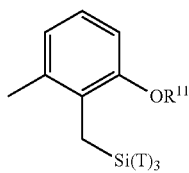
Formula (2-1-23)
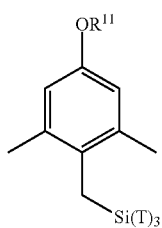
Formula (2-1-24)
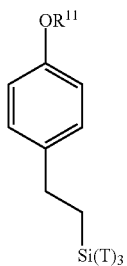
Formula (2-1-25)
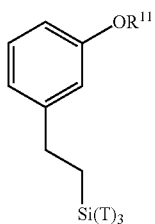
Formula (2-1-26)
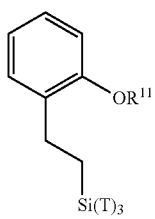
Formula (2-1-27)
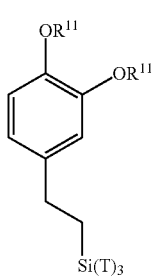
Formula (2-1-28)
-continued
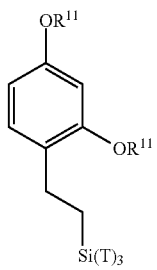
Formula (2-1-29)
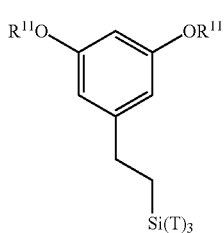
Formula (2-1-30)
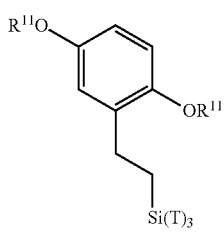
Formula (2-1-31)
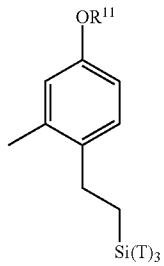
Formula (2-1-32)
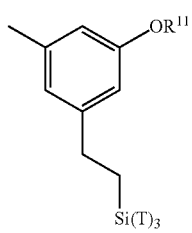
Formula (2-1-33)
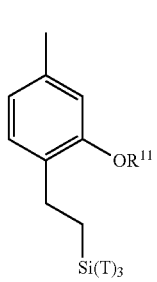
Formula (2-1-34)

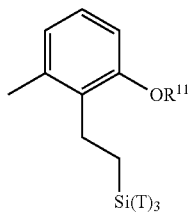
Formula (2-1-35)
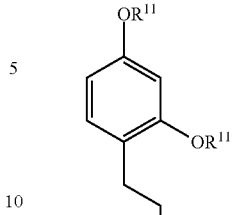
Formula (2-1-41)
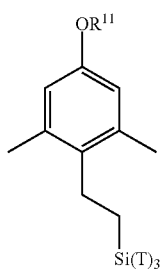
Formula (2-1-36)
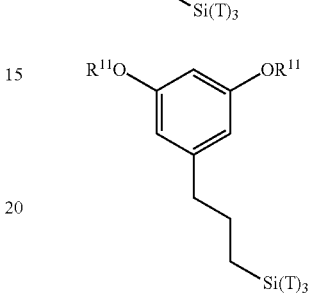
Formula (2-1-42)
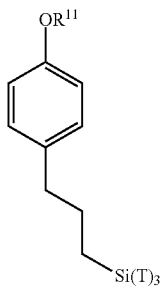
Formula (2-1-37)
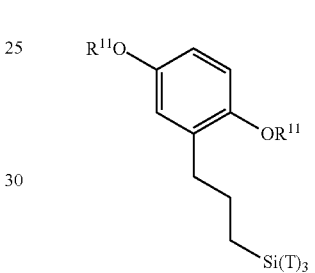
Formula (2-1-43)
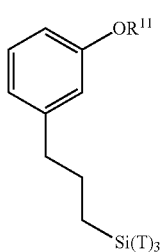
Formula (2-1-38)
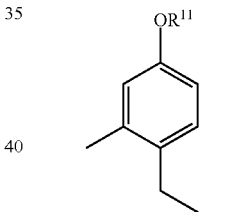
Formula (2-1-44)
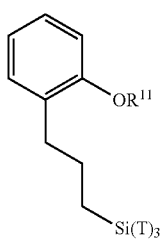
Formula (2-1-39)
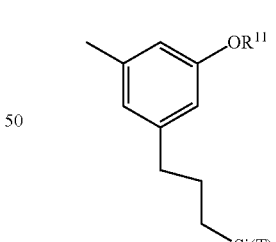
Formula (2-1-45)
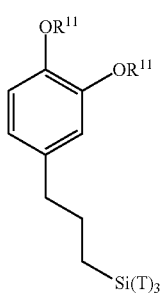
Formula (2-1-40)
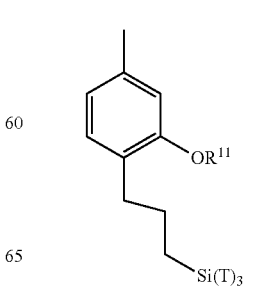
Formula (2-1-46)

Formula (2-1-47)

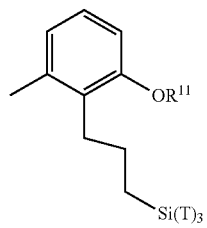

Formula (2-1-48)

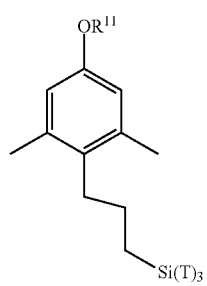

In the above-mentioned formulae, T is a hydrolyzable group, namely, the above-mentioned alkoxy group, acyloxy group, or halogen group. In particular, the alkoxy group, such as methoxy group or ethoxy group, is preferable. $R^{11}$ is a hydrogen atom, a $C_{1-10}$ alkyl group, or a $C_{1-10}$ alkyl group having a $C_{1-10}$ alkoxy group.

Examples of the hydrolyzable silane of Formula (2) wherein $R^7$ is an organic group of Formula (2-2) are as follows.

Formula (2-2-1)

Formula (2-2-2)

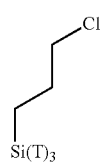

Formula (2-2-3)

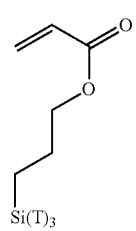

Formula (2-2-4)

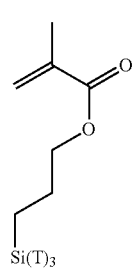

Formula (2-2-5)

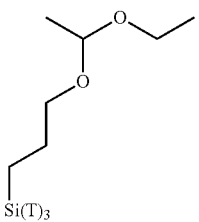

Formula (2-2-6)

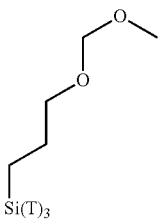

Formula (2-2-7)

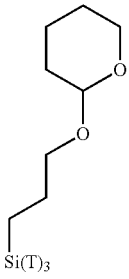

Formula (2-2-8)

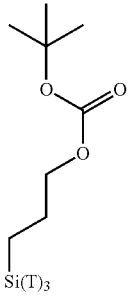

Formula (2-2-9)

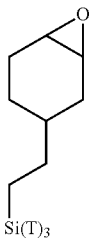

Formula (2-2-10)

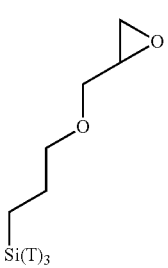

Formula (2-2-11)
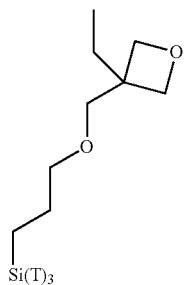
Formula (2-2-12)
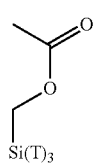
Formula (2-2-13)
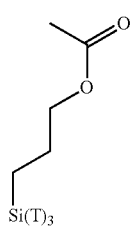
Formula (2-2-14)
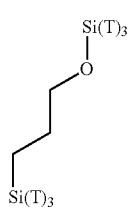
Formula (2-2-15)
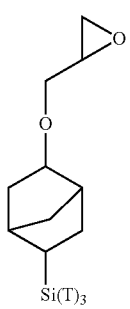
Formula (2-2-16)
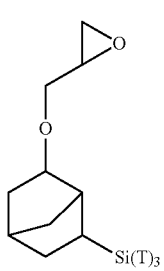
Formula (2-2-17)
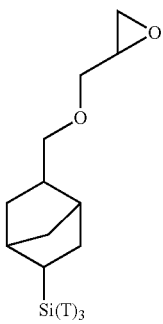
Formula (2-2-18)
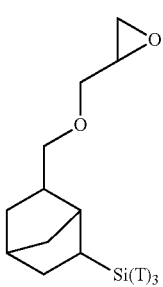
Formula (2-2-19)
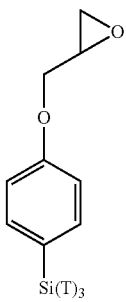
Formula (2-2-20)
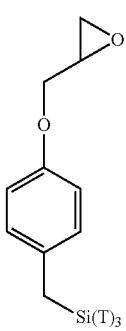
Formula (2-2-21)
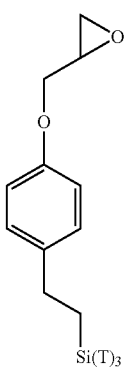

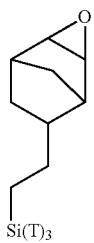
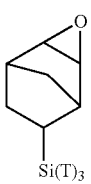
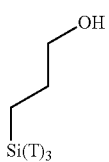
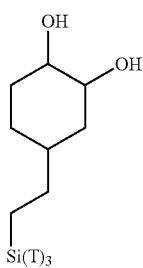
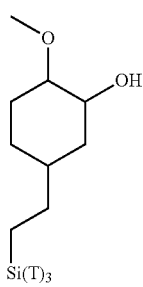
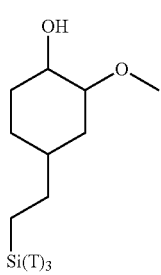
Formula (2-2-22)
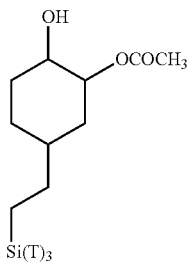
Formula (2-2-23)
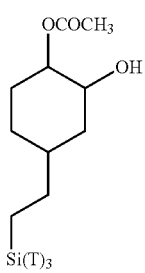
Formula (2-2-24)
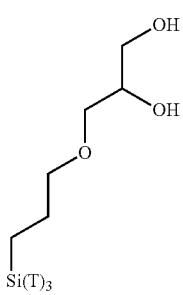
Formula (2-2-25)
Formula (2-2-26)
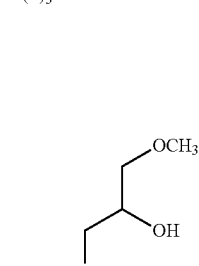
Formula (2-2-27)
Formula (2-2-28)
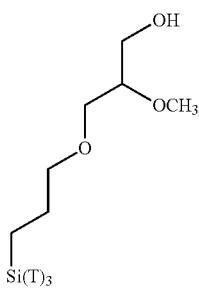
Formula (2-2-29)
Formula (2-2-30)
Formula (2-2-31)
Formula (2-2-32)
Formula (2-2-33)

Formula (2-2-34)

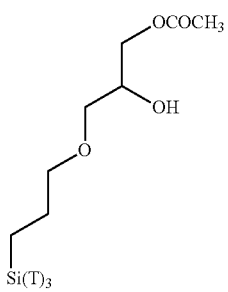

Formula (2-2-35)

Formula (2-2-36)

Formula (2-2-37)

Formula (2-2-38)

Formula (2-2-39)

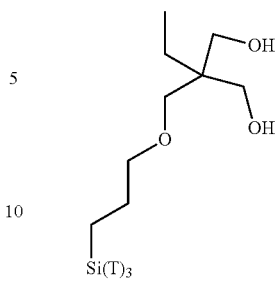

In the above-mentioned formulae, T is a hydrolyzable group, namely, the above-mentioned alkoxy group, acyloxy group, or halogen group. In particular, the alkoxy group, such as methoxy group or ethoxy group, is preferable.

Further examples of the hydrolyzable silane of Formula (2) wherein $R^7$ is an organic group of Formula (2-2) are as follows:

glycidoxymethyltrimethoxysilane, glycidoxymethyltriethoxysilane, α-glycidoxyethyltrimethoxysilane, α-glycidoxyethyltriethoxysilane,
β-glycidoxyethyltrimethoxysilane, β-glycidoxyethyltriethoxysilane,
α-glycidoxypropyltrimethoxysilane, α-glycidoxypropyltriethoxysilane,
β-glycidoxypropyltrimethoxysilane, β-glycidoxypropyltriethoxysilane,
γ-glycidoxypropyltrimethoxysilane, γ-glycidoxypropyltriethoxysilane,
γ-glycidoxypropyltripropoxysilane, γ-glycidoxypropyltributoxysilane,
γ-glycidoxypropyltriphenoxysilane, α-glycidoxybutyltrimethoxysilane,
α-glycidoxybutyltriethoxysilane, β-glycidoxybutyltriethoxysilane,
γ-glycidoxybutyltrimethoxysilane, γ-glycidoxybutyltriethoxysilane,
δ-glycidoxybutyltrimethoxysilane, δ-glycidoxybutyltriethoxysilane,
(3,4-epoxycyclohexyl)methyltrimethoxysilane,
(3,4-epoxycyclohexyl)methyltriethoxysilane,
β-(3,4-epoxycyclohexyl)ethyltrimethoxysilane,
β-(3,4-epoxycyclohexy)ethyltriethoxysilane,
β-(3,4-epoxycyclohexy)ethyltripropoxysilane,
β-(3,4-epoxycyclohexyl)ethyltributoxysilane,
β-(3,4-epoxycyclohexyDethyltriphenoxysilane,
γ-(3,4-epoxycyclohexyl)propyltrimethoxysilane,
γ-(3,4-epoxycyclohexyl)propyltriethoxysilane,
δ-(3,4-epoxycyclohexyl)butyltrimethoxysilane,
δ-(3,4-epoxycyclohexyl)butyltriethoxysilane, glycidoxymethylmethyldimethoxysilane,
glycidoxymethylmethyldiethoxysilane, α-glycidoxyethylmethyldimethoxysilane,
α-glycidoxyethylmethyldiethoxysilane, β-glycidoxyethylmethyldimethoxysilane,
β-glycidoxyethylethyldimethoxysilane, α-glycidoxypropylmethyldimethoxysilane,
α-glycidoxypropylmethyldiethoxysilane, β-glycidoxypropylmethyldimethoxysilane,
β-glycidoxypropylethyldimethoxysilane, γ-glycidoxypropylmethyldimethoxysilane,
γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane,
γ-glycidoxypropylethyldimethoxysilane, γ-glycidoxypropylethyldiethoxysilane,
γ-glycidoxypropylvinyldimethoxysilane, γ-glycidoxypropylvinyldiethoxysilane,
methoxyphenyltrimethoxysilane, methoxyphenyltriethoxysilane,
methoxyphenyltriacetoxysilane, methoxyphenyltrichlorosilane,
methoxybenzyltrimethoxysilane, methoxybenzyltriethoxysilane,
methoxybenzyltriacetoxysilane, methoxybenzyltrichlorosilane,
methoxyphenethyltrimethoxysilane, methoxyphenethyltriethoxysilane,
methoxyphenethyltriacetoxysilane, methoxyphenethyltrichlorosilane,
ethoxyphenyltrimethoxysilane, ethoxyphenyltriethoxysilane,
ethoxyphenyltriacetoxysilane, ethoxyphenyltrichlorosilane,
ethoxybenzyltrimethoxysilane, ethoxybenzyltriethoxysilane,
ethoxybenzyltriacetoxysilane, ethoxybenzyltrichlorosilane,
isopropoxyphenyltrimethoxysilane, isopropoxyphenyltriethoxysilane,
isopropoxyphenyltriacetoxysilane, isopropoxyphenyltrichlorosilane,
isopropoxybenzyltrimethoxysilane, isopropoxybenzyltriethoxysilane,
isopropoxybenzyltriacetoxysilane, isopropoxybenzyltrichlorosilane,
t-butoxyphenyltrimethoxysilane, t-butoxyphenyltriethoxysilane,
t-butoxyphenyltriacetoxysilane, t-butoxyphenyltrichlorosilane,
t-butoxybenzyltrimethoxysilane, t-butoxybenzyltriethoxysilane,
t-butoxybenzyltriacetoxysilane, t-butoxybenzyltrichlorosilane,
methoxynaphthyltrimethoxysilane, methoxynaphthyltriethoxysilane,
methoxynaphthyltriacetoxysilane, methoxynaphthyltrichlorosilane,
ethoxynaphthyltrimethoxysilane, ethoxynaphthyltriethoxysilane,
ethoxynaphthyltriacetoxysilane, ethoxynaphthyltrichlorosilane,
γ-chloropropyltrimethoxysilane, γ-chloropropyltriethoxysilane,
γ-chloropropyltriacetoxysilane, 3,3,3-trifluoropropyltrimethoxysilane,
γ-methacryloxypropyltrimethoxysilane, γ-mercaptopropyltrimethoxysilane,
γ-mercaptopropyltriethoxysilane, β-cyanoethyltriethoxysilane,
chloromethyltrimethoxysilane, chloromethyltriethoxysilane,
γ-chloropropylmethyldimethoxysilane, γ-chloropropylmethyldiethoxysilane,
γ-methacryloxypropylmethyldimethoxysilane, and γ-methacryloxypropylmethyldiethoxysilane.

Furthermore, as the hydrolyzable silane of Formula (2) wherein $R^7$ is an organic group of Formula (2-2), the following hydrolyzable silanes may also be used.

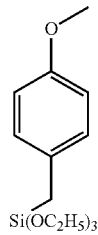

Formula (A-18)

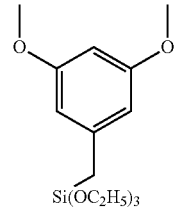

Formula (A-19)

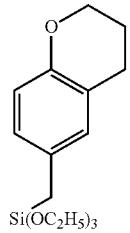

Formula (A-20)

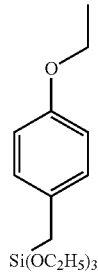

Formula (A-21)

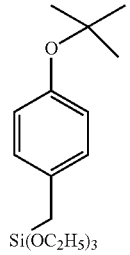

Formula (A-22)

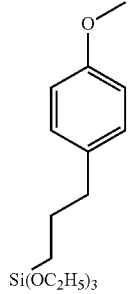

Formula (A-23)

Formula (A-24)
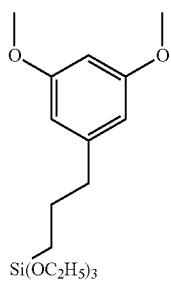
Formula (A-25)
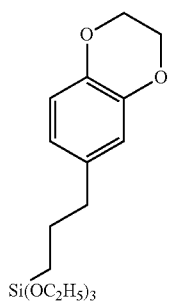
Formula (A-26)
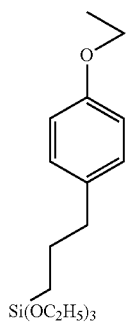
Formula (A-27)
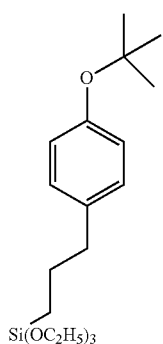
Formula (A-28)
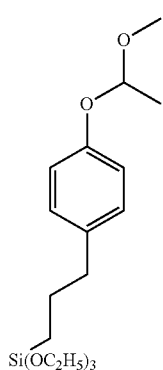
Formula (A-29)
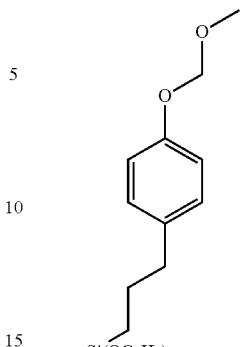
Formula (A-30)
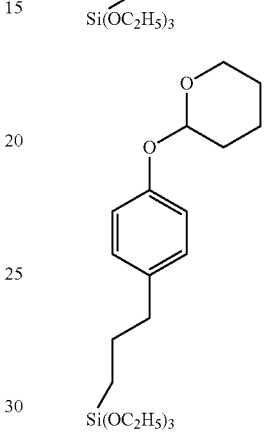
Formula (A-31)
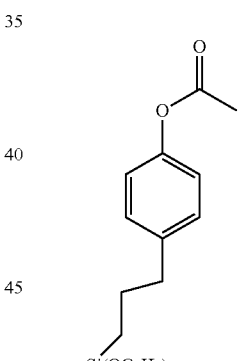
Formula (A-32)
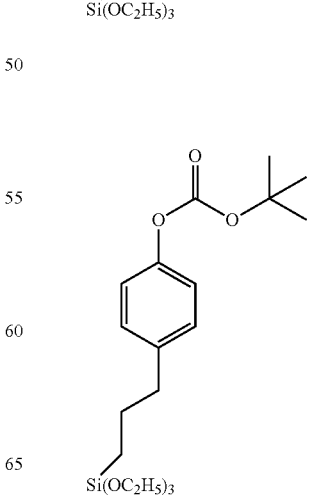

Formula (A-33)

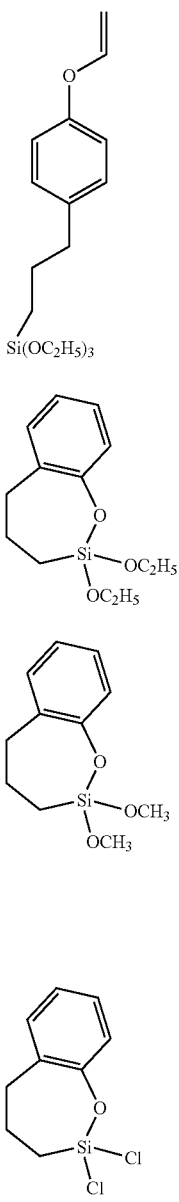

Formula (A-34)

Formula (A-35)

Formula (A-36)

Formula (A-37)

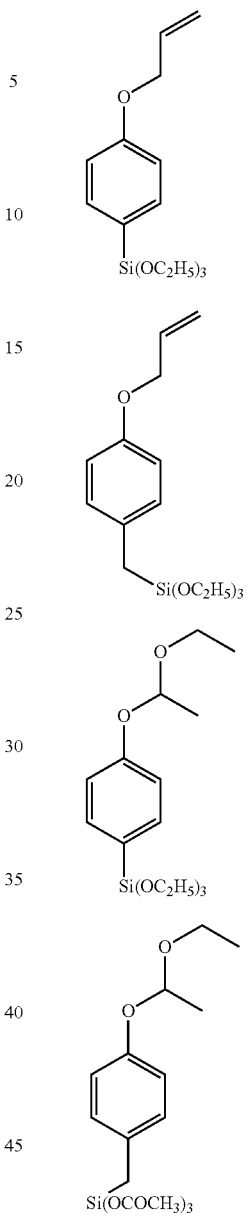

Formula (A-38)

Formula (A-39)

Formula (A-40)

Formula (A-41)

Examples of the hydrolyzable silane of Formula (2) include a hydrolyzable silane of Formula (2) in which a phenolic hydroxy group portion is protected with an alkyl group having an alkoxy group (an alkoxyalkyl group). When a protective group of a polysiloxane obtained by hydrolyzing and condensing the hydrolyzable silane of Formula (2) together with the hydrolyzable silane of Formula (1) and other hydrolyzable silane by using an alkaline catalyst is deprotected using an acid catalyst, the structure of the polysiloxane can contain a structure originated from the above-mentioned silane of Formula (2) having a phenolic hydroxy group.

Examples of the hydrolyzable silane of Formula (3) include tetramethoxysilane, tetrachlorosilane, tetraacetoxysilane, tetraethoxysilane, tetra-n-propoxysilane, tetraisopropoxysilane, tetra-n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, dimethyldimethoxysilane, phenylmethyldimethoxysilane, dimethyldiethoxysilane, phenylmethyldiethoxysilane, dimethyldiacetoxysilane, γ-mercaptopropylmethyldimethoxysilane, γ-mercaptomethyldiethoxysilane, methylvinyldimethoxysilane, and methylvinyldiethoxysilane.

Examples of the hydrolyzable silane of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Furthermore, as the hydrolyzable silane of the present invention, a silane having a sulfone group and a silane having a sulfonamide group may also be used, and examples of the silanes are as follows.

Formula (B-1)

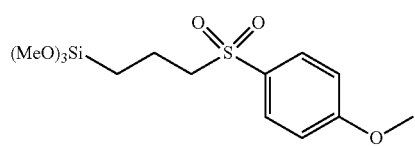

Formula (B-2)

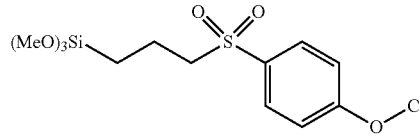

Formula (B-3)

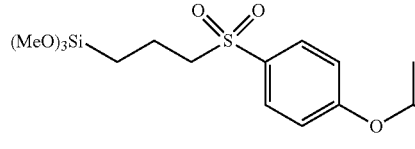

Formula (B-4)

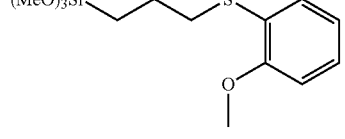

Formula (B-5)

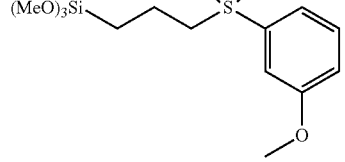

Formula (B-6)

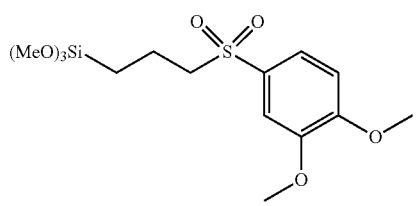

Formula (B-7)

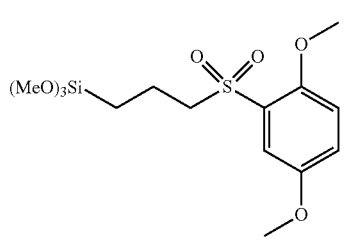

Formula (B-8)

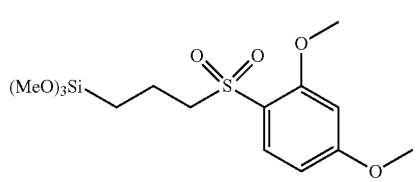

Formula (B-9)

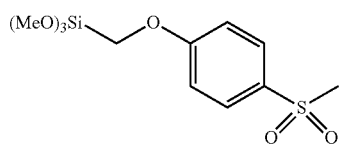

Formula (B-10)

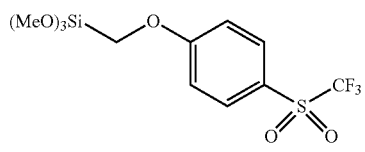

Formula (B-11)

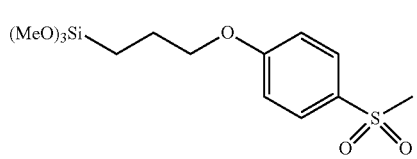

Formula (B-12)

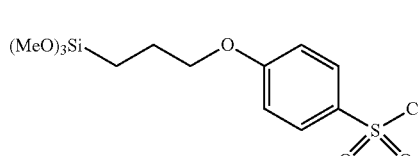

Formula (B-13)

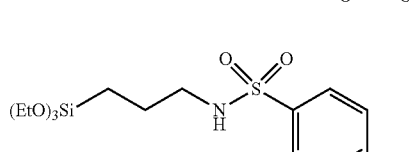

Formula (B-14)

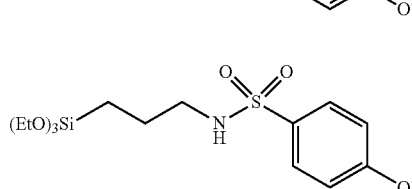

Formula (B-15)
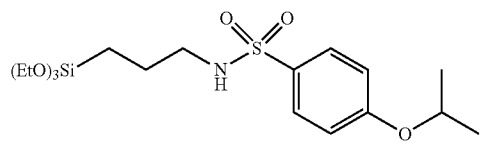
Formula (B-16)
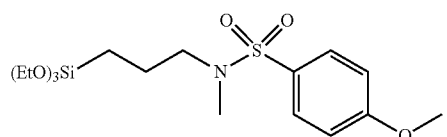
Formula (B-17)
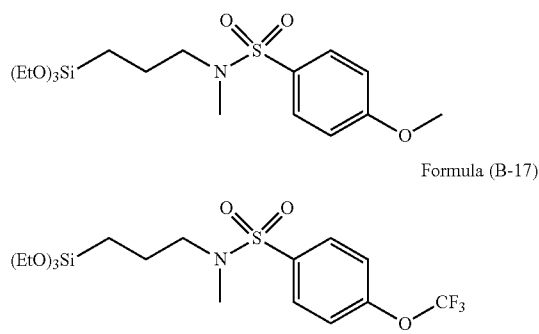
Formula (B-18)
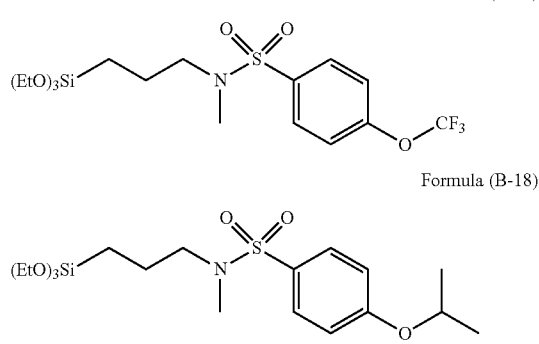
Formula (B-19)
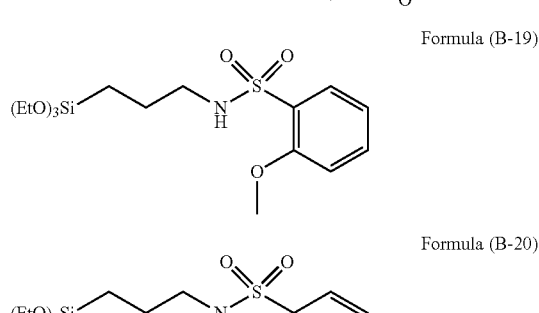
Formula (B-20)
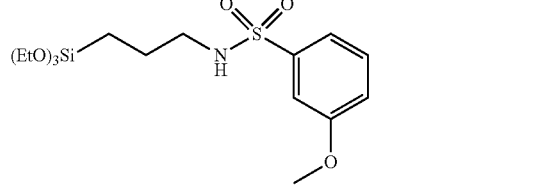
Formula (B-21)
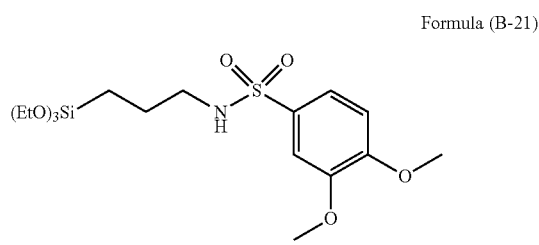
Formula (B-22)
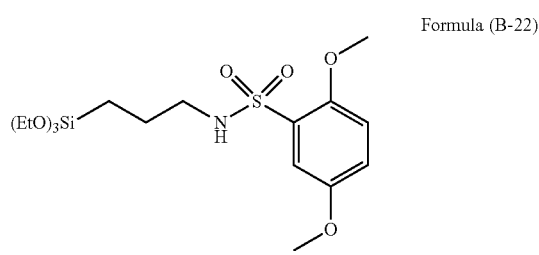
Formula (B-23)
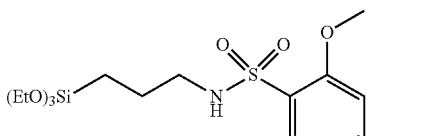
Formula (B-24)
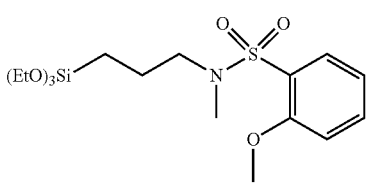
Formula (B-25)
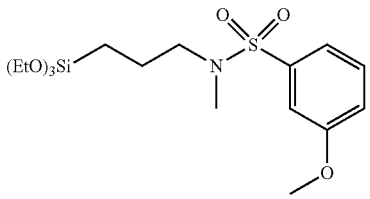
Formula (B-26)
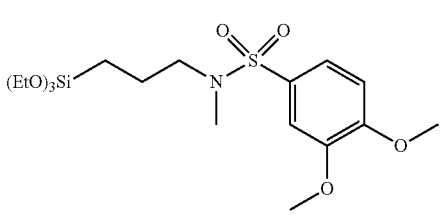
Formula (B-27)
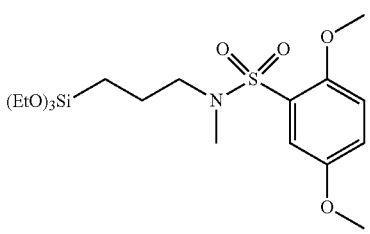
Formula (B-28)
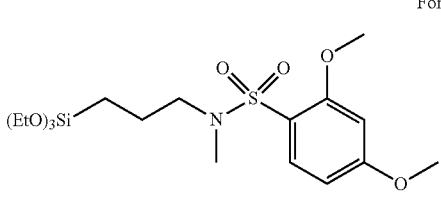
Formula (B-29)
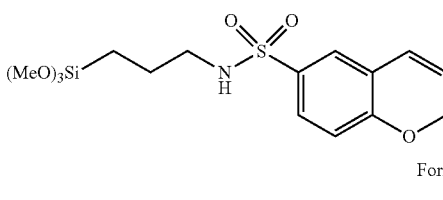
Formula (B-30)
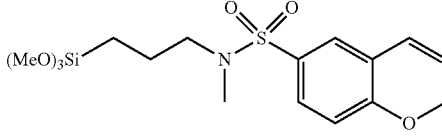

Formula (B-31)
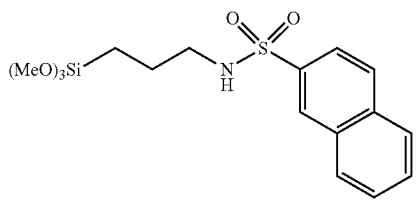
Formula (B-32)
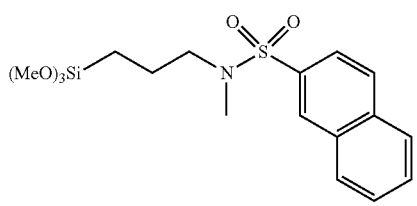
Formula (B-33)
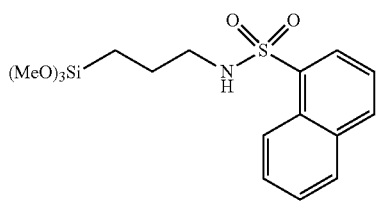
Formula (B-34)
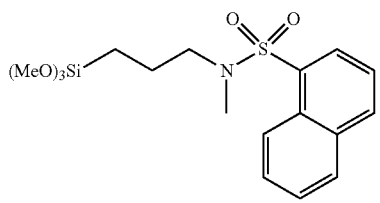
Formula (B-35)
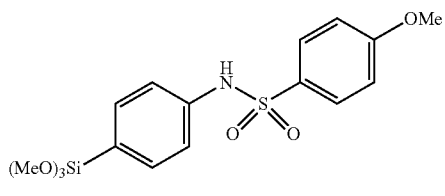
Formula (B-36)
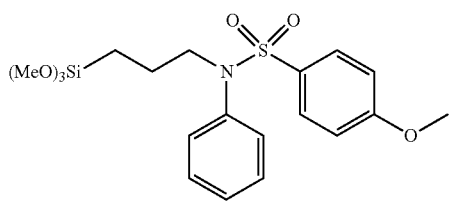
Specific examples of the hydrolysis-condensation product (polysiloxane) used in the present invention are as follows.
Formula (3-1)
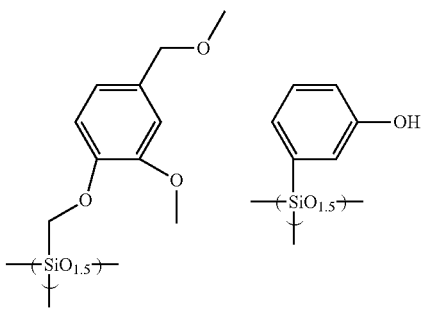
Formula (3-2)
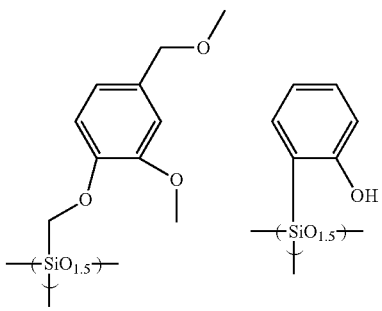
Formula (3-3)
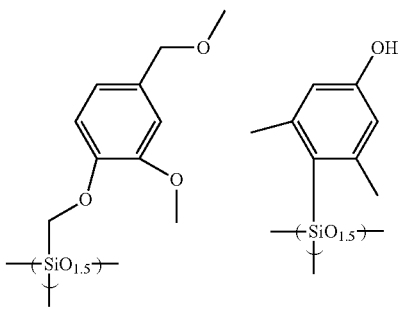
Formula (3-4)
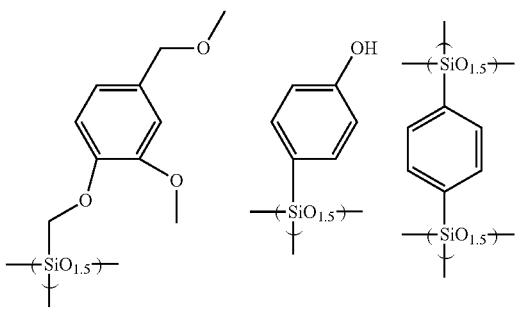
Formula (3-5)
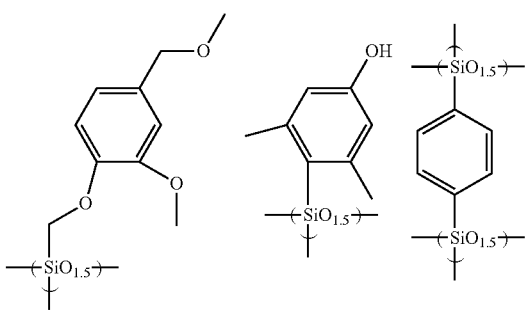

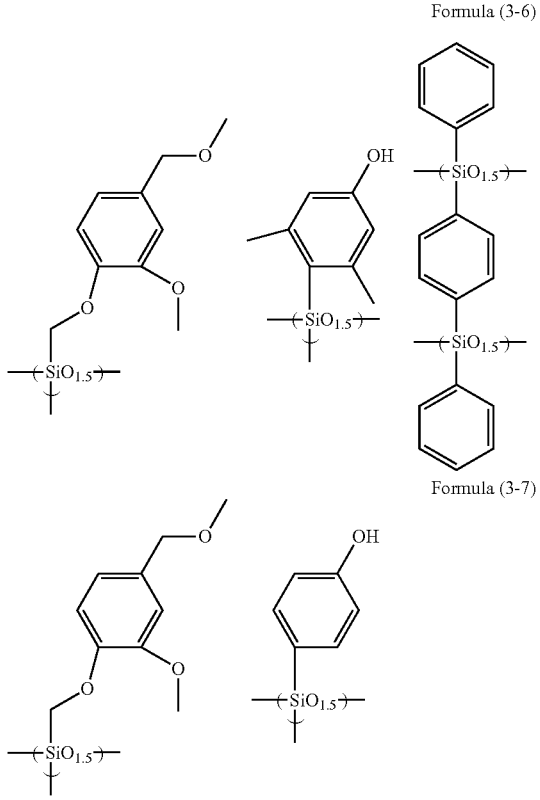

Formula (3-6)

Formula (3-7)

The above-mentioned hydrolysis-condensation product (polyorganosiloxane) of the hydrolyzable silane can be obtained as a condensation product having a weight average molecular weight of 1,000 to 1,000,000, or 1,000 to 100,000. The molecular weight is obtained by a GPC analysis in terms of polystyrene.

Measurement conditions for the GPC analysis are, for example, the use of: a GPC apparatus (trade name: HLC-8220GPC, manufactured by Tosoh Corporation); a GPC column (trade name: Shodex KF803L, KF802, or KF801, manufactured by Showa Denko K.K.); a column temperature of 40° C.; tetrahydrofuran as an eluting liquid (eluting solvent); a flow amount (flow rate) of 1.0 ml/min; and a polystyrene (manufactured by Showa Denko K.K.) as a standard sample.

For hydrolysis of an alkoxysilyl group, an acyloxysilyl group, or a halogenated silyl group, water is used in an amount of 0.5 mol to 100 mol, preferably 1 mol to 10 mol per 1 mol of a hydrolyzable group.

A hydrolysis catalyst may be used in an amount of 0.001 mol to 10 mol, preferably 0.001 mol to 1 mol per 1 mol of a hydrolyzable group.

The reaction temperature for performing the hydrolysis and condensation is usually 20° C. to 80° C.

The hydrolysis may be performed either completely or partially. In other words, a hydrolysis product or a monomer may remain in a hydrolysis-condensation product. For the hydrolysis and condensation, a catalyst may be used.

Examples of the hydrolysis catalyst include metal chelate compounds, organic acids, inorganic acids, organic bases, and inorganic bases. In particular, a basic catalyst is preferable, and examples of such a basic catalyst include organic bases.

Examples of the metal chelate compounds as the hydrolysis catalyst include: titanium chelate compounds, such as triethoxy mono(acetylacetonato)titanium, tri-n-propoxy mono(acetylacetonato)titanium, tri-i-propoxy mono(acetylacetonato)titanium, tri-n-butoxy mono(acetylacetonato)titanium, tri-sec-butoxy mono(acetylacetonato)titanium, tri-t-butoxy mono(acetylacetonato)titanium, diethoxy bis(acetylacetonato)titanium, di-n-propoxy bis(acetylacetonato)titanium, di-i-propoxy bis(acetylacetonato)titanium, di-n-butoxy bis(acetylacetonato)titanium, di-sec-butoxy bis(acetylacetonato)titanium, di-t-butoxy bis(acetylacetonato)titanium, monoethoxy tris(acetylacetonato)titanium, mono-n-propoxy tris(acetylacetonato)titanium, mono-i-propoxy tris(acetylacetonato)titanium, mono-n-butoxy tris(acetylacetonato)titanium, mono-sec-butoxy tris(acetylacetonato)titanium, mono-t-butoxy tris(acetylacetonato)titanium, tetrakis(acetylacetonato)titanium, triethoxy mono(ethylacetoacetate)titanium, tri-n-propoxy mono(ethylacetoacetate)titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy bis(ethylacetoacetate)titanium, di-n-propoxy bis(ethylacetoacetate)titanium, di-i-propoxy bis(ethylacetoacetate)titanium, di-n-butoxy bis(ethylacetoacetate)titanium, di-sec-butoxy bis(ethylacetoacetate)titanium, di-t-butoxy bis(ethylacetoacetate)titanium, monoethoxy tris(ethylacetoacetate)titanium, mono-n-propoxy tris(ethylacetoacetate)titanium, mono-i-propoxy tris(ethylacetoacetate)titanium, mono-n-butoxy tris(ethylacetoacetate)titanium, mono-sec-butoxy tris(ethylacetoacetate)titanium, mono-t-butoxy tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium, and tris(acetylacetonato)mono(ethylacetoacetate)titanium; zirconium chelate compounds, such as triethoxy mono(acetylacetonato)zirconium, tri-n-propoxy mono(acetylacetonato)zirconium, tri-i-propoxy mono(acetylacetonato)zirconium, tri-n-butoxy mono(acetylacetonato)zirconium, tri-sec-butoxy mono(acetylacetonato)zirconium, tri-t-butoxy mono(acetylacetonato)zirconium, diethoxy bis(acetylacetonato)zirconium, di-n-propoxy bis(acetylacetonato)zirconium, di-i-propoxy bis(acetylacetonato)zirconium, di-n-butoxy bis(acetylacetonato)zirconium, di-sec-butoxy bis(acetylacetonato)zirconium, di-t-butoxy bis(acetylacetonato)zirconium, monoethoxy tris(acetylacetonato)zirconium, mono-n-propoxy tris(acetylacetonato)zirconium, mono-i-propoxy tris(acetylacetonato)zirconium, mono-n-butoxy tris(acetylacetonato)zirconium, mono-sec-butoxy tris(acetylacetonato)zirconium, mono-t-butoxy tris(acetylacetonato)zirconium, tetrakis(acetylacetonato)zirconium, triethoxy mono(ethylacetoacetate)zirconium, tri-n-propoxy mono(ethylacetoacetate)zirconium, tri-i-propoxy mono(ethylacetoacetate)zirconium, tri-n-butoxy mono(ethylacetoacetate)zirconium, tri-sec-butoxy mono(ethylacetoacetate)zirconium, tri-t-butoxy mono(ethylacetoacetate)zirconium, diethoxy bis(ethylacetoacetate)zirconium, di-n-propoxy bis(ethylacetoacetate)zirconium, di-i-propoxy bis(ethylacetoacetate)zirconium, di-n-butoxy bis(ethylacetoacetate)zirconium, di-sec-butoxy bis(ethylacetoacetate)zirconium, di-t-butoxy bis(ethylacetoacetate)zirconium, monoethoxy tris(ethylacetoacetate)zirconium, mono-n-propoxy tris(ethylacetoacetate)zirconium, mono-i-propoxy tris(ethylacetoacetate)zirconium, mono-n-butoxy tris (ethylacetoacetate)zirconium, mono-sec-butoxy tris(ethylacetoacetate)zirconium, mono-t-butoxy tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; and aluminum chelate compounds, such as tris(acetylacetonato)aluminum and tris(ethylacetoacetate)aluminum.

Examples of the organic acids as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, methanesulfonic acid, phthalic acid, fumaric acid, citric acid, and tartaric acid.

Examples of the inorganic acids as the hydrolysis catalyst include hydrochloric acid, nitric acid, sulfuric acid, hydrofluoric acid, and phosphoric acid.

Examples of the organic bases as the hydrolysis catalyst include ammonia, pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, trimethylphenylammonium hydroxide, benzyltrimethylammonium hydroxide, benzyltriethylammonium hydroxide, and triphenylsulfonium hydroxide.

Examples of the inorganic bases include sodium hydroxide, potassium hydroxide, barium hydroxide, and calcium hydroxide. Among these catalysts, the metal chelate compounds, the organic acids, and the inorganic acids are preferable, and these catalysts may be used singly or in combination of two or more of them. Furthermore, from a viewpoint of the remaining of these metals, the organic bases are preferably used for semiconductors and electronic devices.

Examples of the organic solvent used for the hydrolysis include: aliphatic hydrocarbon-based solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon-based solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol-based solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol-based solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether-based solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester-based solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used singly or in combination of two or more of them.

From a hydrolysis-condensation product (a polymer) obtained by hydrolyzing and condensing a hydrolyzable silane in a solvent using a catalyst, alcohol as a by-product, the used hydrolysis catalyst, and water can be removed at the same time by distillation under reduced pressure, for example. Furthermore, an acid or a base catalyst that is used for the hydrolysis can be removed by neutralization or ion exchange. In the radiation sensitive composition of the present invention, an organic acid, water, and alcohol, or a combination thereof may be added for the purpose of stabilizing a resist underlayer film-forming composition including the hydrolysis-condensation product.

Examples of the organic acid include acetic acid, oxalic acid, malonic acid, methylmalonic acid, succinic acid, maleic acid, malic acid, tartaric acid, phthalic acid, citric acid, glutaric acid, citric acid, lactic acid, and salicylic acid. Among these organic acids, for example, oxalic acid and maleic acid are preferable. The amount of the organic acid added is 0.1 part by mass to 5.0 parts by mass with respect to 100 parts by mass of the condensation product (polyorganosiloxane). Furthermore, pure water, ultrapure water, or ion exchange water may be used as water to be added, and the amount of water added may be 1 part by mass to 20 parts by mass with respect to 100 parts by mass of the resist underlayer film-forming composition.

As the alcohol to be added, alcohol that can easily disperse by heating after application is preferable, and examples of the alcohol include methanol, ethanol, propanol, isopropanol (2-propanol), and butanol. The amount of the alcohol added may be 1 part by mass to 20 parts by mass with respect to 100 parts by mass of the resist underlayer film-forming composition.

In the present invention, an acid may be added to deprotect a phenolic hydroxy group of Formula (2) that is protected with an alkoxy alkyl group. Examples of the acid to be added include organic acids, and inorganic acid such as hydrochloric acid. An inorganic acid, such as hydrochloric acid, is preferably used.

Besides the above-mentioned components, the radiation sensitive composition of the present invention may contain an organic polymer compound, a photoacid generator, and a surfactant, as necessary.

The organic polymer compound is not limited to a particular compound, and various kinds of organic polymers may be used. For example, polycondensation polymers and addition polymerization polymers may be used. Examples of the addition polymerization polymers and the polycondensation polymers to be used include polyesters, polystyrenes, polyimides, acrylic polymers, methacrylic polymers, polyvinyl ethers, phenol novolacs, naphthol novolacs, polyethers, polyamides, and polycarbonates. An organic polymer having an aromatic ring structure that functions as a light absorbing moiety, such as a benzene ring, a naphthalene ring, an anthracene ring, a triazine ring, a quinoline ring, or a quinoxaline ring, is preferably used.

As the organic polymer compound, a polymer compound having a weight average molecular weight of, for example, 1,000 to 1,000,000, 3,000 to 300,000, 5,000 to 200,000, or 10,000 to 100,000 may be used.

The organic polymer compounds may be used singly or in combination of two or more of them.

In the case of using the organic polymer compound, the proportion of the organic polymer compound is 1 part by mass to 200 parts by mass, 5 parts by mass to 100 parts by mass, 10 parts by mass to 50 parts by mass, or 20 parts by mass to 30 parts by mass with respect to 100 parts by mass of the condensation product (polyorganosiloxane).

The radiation sensitive composition of the present invention includes a compound (a photoacid generator) that senses active rays or radiation to generate an acid. As the photoacid generator component, any compound that generates an acid when irradiated with high energy beam may be employed.

Preferred examples of the photoacid generator include sulfonium salts, iodonium salts, sulfonyldiazomethane, N-sulfonyloxyimide, a benzoinsulfonate type photoacid generator, a pyrogallol trisulfonate type photoacid generator, a sulfone type photoacid generator, a glyoxime derivative type photoacid generator, an oxime-O-sulfonate type acid generator, and a bisoxime sulfonate type acid generator. Although described in detail below, these photoacid generators may be used singly or in combination of two or more of them.

The sulfonium salt is a salt composed of a sulfonium cation, and sulfonate, bis(substituted alkylsulfonyl)imide, or tris(substituted alkylsulfonyl)methide.

Examples of the sulfonium cation include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium.

Examples of the sulfonate include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-thfluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodeca-3-en-8-yl)ethanesulfonate.

Examples of the bis(substituted alkylsulfonyl)imide include bistrifluoromethylsulfonylimide, bispentafluoroethylsulfonylimide, bisheptafluoropropylsulfonylimide, and 1,3-propylenebissulfonylimide.

Examples of the tris(substituted alkylsulfonyl)methide include tristrifluoromethylsulfonylmethide. Examples of the sulfonium salt include sulfonium salts composed of combinations of the above-mentioned sulfonium cations, and the above-mentioned sulfonates, bis(substituted alkylsulfonye-imides, or tris(substituted alkylsulfonyl)methides.

The iodonium salt is a salt composed of an iodonium cation, and sulfonate, bis(substituted alkylsulfonyl)imide, or tris(substituted alkylsulfonyl)methide.

Examples of the iodonium cation include aryl iodonium cations, such as diphenyliodonium, bis(4-tert-butylphenyl) iodonium, 4-tert-butoxyphenylphenyliodonium, and 4-methoxyphenylphenyliodonium. Examples of the sulfonate, the bis(substituted alkylsulfonyl)imide, and the tris(substituted alkylsulfonyl)methide include the above-mentioned examples. Examples of the iodonium salt include iodonium salts composed of combinations of the above-mentioned iodonium cations, and the above-mentioned sulfonates, bis(substituted alkylsulfonyl)imides, or tris(substituted alkylsulfonyl)methides.

Examples of the sulfonyldiazomethane include bissulfonyldiazomethanes and sulfonyl-carbonyldiazomethanes, such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dirnethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

Examples of the N-sulfonyloxyimide type photoacid generator include a combination of a sulfonate and an imide skeleton such as succinimide, naphthalenedicarboxylic acid imide, phthalimide, cyclohexyldicarboxylic acid imide, 5-norbornene-2,3-dicarboxylic acid imide, or 7-oxabicyclo[2.2.1]-5-heptene-2,3-dicarboxylic acid imide.

Examples of the sulfonate include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adarnantanecarbonyloxy-1, 1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodeca-3-en-8-yl)ethanesulfonate, and compounds of combinations thereof.

Examples of the benzoinsulfonate type photoacid generator include benzoin tosylate, benzoin mesylate, and benzoin butanesulfonate.

Examples of the pyrogallol trisulfonate type photoacid generator include compounds formed by substituting all hydroxy groups of pyrogallol, fluoroglycinol, catechol, resorcinol, or hydroquinone with a substituent mentioned below. Examples of the substituent include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1, 1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodeca-3-en-8-yl)ethanesulfonate, and examples of the pyrogallol trisulfonate type photoacid generator include compounds obtained by substitution with these substituents.

Examples of the sulfone type photoacid generator include bis(phenylsulfonyl)methane, bis(4-methylphenylsulfonyl)methane, bis(2-naphthylsulfonyl)methane, 2,2-bis(phenylsulfonyl)propane, 2,2-bis (4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Examples of the glyoxime derivative type photoacid generator include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-

(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Examples of the oxime-O-sulfonate type photoacid generator include (5-(4-toluenesulfonyl)oxyimino-5H-thiophen-2-ylidene)phenyl acetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, and (5-n-octanesulfonyloxyimino-5H-thiophen-2-ylidene)(2-methylphenyl)acetonitrile.

Further examples thereof include (5-(4-(4-toluenesulfonyloxy)benzenesulfonyl)oxyimino-5H-thiophen-2-ylidene) phenylac etonitrile, and (5-(2,5-bis(4-toluenesulfonyloxy)benzenesulfonyl)oxyirnino-5H-thiophen-2-ylidene)phen ylacetonitrile.

Further examples of the oxime-O-sulfonate type photoacid generator include 2,2,2-trifluoro-1-phenyl-ethanoneoxime-O-methylsulfonate, 2,2,2-trifluoro-1-phenyl-ethanoneoxime-O-(10-camphorylsulfonate), 2,2,2-trifluoro-1-phenyl-ethanoneoxime-O-(4-methoxyphenylsulfonate), 2,2,2-trifluoro-1-phenyl-ethanoneoxime-O-(1-naphthylsulfonate), 2,2,2-trifluoro-1-phenyl-ethanoneoxime-O-(2-naphthylsulfonate), 2,2,2-trifluoro-1-phenyl-ethanoneoxime-O-(2,4,6-trimethylphenylsulfonate), 2,2,2-trifluoro-1-(4-methylphenyl)-ethanoneoxime-O-(10-camphorylsulfonate), 2,2,2-trifluoro-1-(4-methylphenyl)-ethanoneoxime-O-(methylsulfonate), 2,2,2-trifluoro-1-(2-methylphenyl)-ethanoneoxime-O-(10-camphorylsulfonate), 2,2,2-tfifluoro-1-(2,4-dimethylphenyl)-ethanoneoxime-O-(10-camphorylsulfonate), 2,2,2-trifluoro-1-(2,4-dimethylphenyl)-ethanoneoxime-O-(1-naphthylsulfonate), 2,2,2-trifluoro-1-(2,4-dimethylphenyl)-ethanoneoxime-O-(2-naphthylsulfonate), 2,2,2-trifluoro-1-(2,4,6-trimethylphenyl)-ethanoneoxime-O-(10-camphorylsulfonate), 2,2,2-trifluoro-1-(2,4,6-trimethylphenyl)-ethanoneoxime-O-(1-naphthylsulfonate), 2,2,2-trifluoro-1-(2,4,6-trimethylphenyl)-ethanoneoxime-O-(2-naphthylsulfonate), 2,2,2-trifluoro-1-(4-methoxyphenyl)-ethanoneoxime-O-methylsulfonate, 2,2,2-trifluoro-1-(4-methylthiophenyl)-ethanoneoxime-O-methylsulfonate, 2,2,2-trifluoro-1-(3,4-dimethoxyphenyl)-ethanoneoxime-O-methylsulfonate, 2,2,3,3,4,4,4-heptafluoro-1-phenyl-butanoneoxime-O-(10-camphorylsulfonate), 2,2,2-trifluoro-1-(phenyl)-ethanoneoxime-O-methylsulfonate, 2,2,2-trifluoro-1-(phenyl)-ethanoneoxime-O-10-camphorylsulfonate, 2,2,2-trifluoro-1-(phenyl)-ethanoneoxime-O-(4-methoxyphenyl)sulfonate, 2,2,2-trifluoro-1-(phenyl)-ethanoneoxime-O-(1-naphthyl) sulfonate, 2,2,2-trifluoro-1-(phenyl)-ethanoneoxime-O-(2-naphthyl)sulfonate, 2,2,2-trifluoro-1-(phenyl)-ethanoneoxime-O-(2,4,6-trimethylphenypsulfonate, 2,2,2-trifluoro-1-(4-methylphenyl)-ethanoneoxime-O-(10-camphoryl)sulfonate, 2,2,2-trifluoro-1-(4-methylphenyl)-ethanoneoxime-O-methylsulfonate, 2,2,2-trifluoro-1-(2-methylphenyl)-ethanoneoxime-O-(10-camphoryl)sulfonate, 2,2,2-trifluoro-1-(2,4-dimethylphenyl)-ethanoneoxime-O-(1-naphthyl)sulfonate, 2,2,2-trifluoro-1-(2,4-dimethylphenyl)-ethanoneoxime-O-(2-naphthyl)sulfonate, 2,2,2-trifluoro-1-(2,4,6-trimethylphenyl)-ethanoneoxime-O-(10-camphoryl)sulfonate, 2,2,2-trifluoro-1-(2,4,6-trimethylphenyl)-ethanoneoxime-O-(1-naphthyl)sulfonate, 2,2,2-trifluoro-1-(2,4,6-trimethylphenyl)-ethanoneoxime-O-(2-naphthyl)sulfonate, 2,2,2-trifluoro-1-(4-methoxyphenyl)-ethanoneoxime-O-methylsulfonate, 2,2,2-trifluoro-1-(4-thiomethylphenyl)-ethanoneoxime-O-methylsulfonate, 2,2,2-trifluoro-1-(3,4-dimethoxyphenyl)-ethanoneoxime-O-methylsulfonate, 2,2,2-trifluoro-1-(4-methoxyphenyl)-ethanoneoxime-O-(4-methylphenyl)sulfonate, 2,2,2-ttifluoro-1-(4-methoxyphenyl)-ethanoneoxime-O-(4-methoxyphenyl) sulfonate, 2,2,2-trifluoro-1-(4-methoxyphenyl) ethanoneoxime-O-(4-dodecylphenyl)sulfonate, 2,2,2-trifluoro-1-(4-methoxyphenyl)-ethanoneoxime-O-octylsulfonate, 2,2,2-trifluoro-1-(4-thiomethylphenyl)-ethanoneoxime-O-(4-methoxyphenyl)sulfonate, 2,2,2-trifluoro-1-(4-thiomethylphenyl)-ethanoneoxime-O-(4-dodecylphenyl)sulfonate, 2,2,2-trifluoro-1-(4-thiomethylphenyl)-ethanoneoxime-O-octylsulfonate, 2,2,2-trifluoro-1-(4-thiomethylphenyl)-ethanoneoxime-O-(2-naphthyl)sulfonate, 2,2,2-trifluoro-1-(2-methylphenyl)-ethanoneoxime-O-methylsulfonate, 2,2,2-trifluoro-1-(4-methylphenyl)-ethanoneoxime-O-phenylsulfonate, 2,2,2-trifluoro-1-(4-chlorophenyl)-ethanoneoxime-O-phenylsulfonate, 2,2,3,3,4,4,4-heptafluoro-1-(phenyl)-butanoneoxime-O-(10-camphoryl)sulfonate, 2,2,2-trifluoro-1-naphthyl-ethanoneoxime-O-methylsulfonate, 2,2,2-trifluoro-2-naphthyl-ethanoneoxime-O-methylsulfonate, 2,2,2-trifluoro-1-[4-benzylphenyl]-ethanoneoxime-O-methylsulfonate, 2,2,2-trifluoro-1-[4-(phenyl-1,4-dioxa-but-1-yl)phenyl]ethanoneoxime-O-methylsulfonat e, 2,2,2-trifluoro-1-naphthyl-ethanoneoxime-O-propylsulfonate, 2,2,2-trifluoro-2-naphthyl-ethanoneoxime-O-propylsulfonate, 2,2,2-trifluoro-1-[4-benzylphenyl]-ethanoneoxime-O-propylsulfonate, 2,2,2-trifluoro-1-[4-methylsulfonylphenyl]-ethanoneoxime-O-propylsulfonate, 1,3-bis[1-(4-phenoxyphenyl)-2,2,2-trifluoroethanoneoxime-O-sulfonyl]phenyl, 2,2,2-trifluoro-1-[4-methylsulfonyloxyphenyl]-ethanoneoxime-O-propylsulfonate, 2,2,2-trifluoro-1-[4-methylcarbonyloxyphenyl]-ethanoneoxime-O-propylsulfonate, 2,2,2-trifluoro-1-[6H,7H-5,8-dioxonaphth-2-yl]-ethanoneoxime-O-propylsulfonate, 2,2,2-trifluoro-1-[4-methoxycarbonylmethoxyphenyl]-ethanoneoxime-O-propylsulfonate, 2,2,2-trifluoro-1-[4-(methoxycarbonyl)-(4-amino-1-oxa-pent-1-yl)-phenyl]-ethanoneoxime-O-propylsulfonate, 2,2,2-trifluoro-1-[3,5-dimethyl-4-ethoxyphenyl]-ethanoneoxime-O-propylsulfonate, 2,2,2-trifluoro-1-[4-benzyloxyphenyl]-ethanoneoxime-O-propylsulfonate, 2,2,2-trifluoro-1-[2-thiophenyl]ethanoneoxime-O-propylsulfonate, 2,2,2-trifluoro-1-[1-dioxa-thiophen-2-yl]-ethanoneoxime-O-propylsulfonate, 2,2,2-trifluoro-1-(4-(3-(4-(2,2,2-trifluoro-1-(trifluoromethanesulfonyloxyimino)-ethyl)-ph enoxy)-propoxy)-phenypethanoneoxime(trifluoromethanesulfonate), 2,2,2-trifluoro-1-(4-(3-(4-(2,2,2-trifluoro-1-(1-propanesulfonyloxyimino)-ethyl)-phenoxy)-propoxy)-phenyl)ethanoneoxime(1-propanesulfonate), and 2,2,2-trifluoro-1-(4-(3-(4-(2,2,2-trifluoro-1-(1-butanesulfonyloxyimino)-ethyl)-phenoxy)-propoxy)-phenyl)ethanoneoxime(1-butanesulfonate). Further examples thereof include 2,2,2-trifluoro-1-(4-(3-(4-(2,2,2-trifluoro-1-(4-(4-methylphenylsulfonyloxy)phenylsulfon yloxyimino)-ethyl)-phenoxy)-propoxy)-phenyl)ethanoneoxime(4-(4-methylphenylsulfon yloxy)phenylsulfonate), and 2,2,2-trifluoro-1-(4-(3-(4-(2,2,2-trifluoro-1-(2,5-bis(4-methylphenylsulfonyloxy)benzene sulfonyloxy) phenylsulfonyloxyimino)-ethyl)-phenoxy)-propoxy)-phenyl) ethanoneoxime (2,5-bis(4-methylphenylsulfonyloxy) benzenesulfonyloxy)phenylsulfonate).

Further examples of the oxime-O-sulfonate type photoacid generator include α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Further examples of the oxime-O-sulfonate type photoacid generator include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, 2-[2,2,3,3,4,4,5,5,6,6-decafluoro-1-(nonafluorobutylsulfonyloxyimino)-hexyl]-fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl Examples of the bisoxime sulfonate type photoacid generator include, in particular, bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylenediacetonitrile, and bis(α-(4-methoxybenzenesulfonyloxy)imino)-m-phenylenediacetonitrile.

In particular, sulfonium salts, bissulfonyldiazomethane, N-sulfonyloxyimide, oxime-O-sulfonate, and glyoxime derivative photoacid generators are preferably used as the photoacid generator. Sulfonium salts, bissulfonyldiazomethane, N-sulfonyloxyimide, oxime-O-sulfonate type photoacid generators are more preferably used as the photoacid generator.

Specific examples of the photoacid generator include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium-2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butanesulfonate, 4-tert-butylphenyldiphenylsulfonium pentafluoroethylperfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornan-2-yl)ethanesulfonate, bis(tert-butylsulfonyl)diazomethane, bis(cyclohexylsulfonyl)diazomethane, bis(2,4-dimethylphenylsulfonyl)diazomethane, bis(4-n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, and 2-[2,2,3,3,4,4,5,5,6,6-decafluoro-1-(nonafluorobutylsulfonyloxyimino)-hexyl]-fluorene.

In the radiation sensitive composition of the present invention, the amount of a photoacid generator added may be arbitrarily set, but is 0.1 part by mass to 20 parts by mass, preferably 0.1 part by mass to 10 parts by mass with respect to 100 parts by mass of polysiloxane contained in the radiation sensitive composition. When the amount of the photoacid generator added is 20 parts by mass or less, a photoresist film has a sufficiently high transmittance and accordingly the resolution performance is less likely to deteriorate. The above-mentioned photoacid generators may be used singly or in combination of two or more of them. Furthermore, by using a photoacid generator having a low transmittance at an exposure wavelength, the transmittance of the resist film can be controlled with the amount of the photoacid generator added.

Furthermore, to the radiation sensitive composition of the present invention, a compound (an acid amplifier compound) that is decomposed by an acid and generates an acid may be added.

These compounds are described in J. Photopolym. Sci. and Tech., 8.43-44, 45-46 (1995), and J. Photopolym. Sci. and Tech., 9.29-30 (1996). Examples of the acid amplifier compound include, but are not limited to, tert-butyl 2-methyl 2-tosyloxymethylacetoacetate and 2-phenyl 2-(2-tosyloxyethyl) 1,3-dioxolane. Among well-known photoacid generators, compounds with inferior stability, especially inferior thermal stability often have characteristics specific to acid amplifier compounds.

In the radiation sensitive composition of the present invention, the amount of an acid amplifier compound added is 2 parts by mass or less, preferably 1 part by mass or less with respect to 100 parts by mass of polysiloxane contained in the radiation sensitive composition. For examples, when the addition amount is 0.0001 part by mass to 2 parts by mass, diffusion is controlled, whereby the deterioration of resolution and pattern shape are less likely to be caused.

As the organic solvent used in the present invention, any organic solvent capable of dissolving a base resin (polysiloxane), an acid generator, and other additives may be employed. Examples of such an organic solvent include: ketones, such as cyclohexanone and methyl-2-n-amyl ketone; alcohols, such as 3-methoxybutanol, 3-methyl-3-methoxybutanol, 1-methoxy-2-propanol, 1-ethoxy-2-propanol, and 4-methyl-2-pentanol; ethers, such as propylene glycol monomethyl ether, ethylene glycol monomethyl ether, propylene glycol monoethyl ether, propylene glycol monopropyl ether, ethylene glycol monoethyl ether, propylene glycol dimethyl ether, and diethylene glycol dimethyl ether; esters, such as propylene glycol monomethyl ether acetate, propylene glycol monoethyl ether acetate, ethyl lactate, ethyl pyruvate, butyl acetate, methyl 3-methoxypropinoate, ethyl 3-ethoxypropionate, and tert-butyl acetate, tert-butyl propionate, and propylene glycol mono-tert-butyl ether acetate; and lactones, such as γ-butyrolactone. These organic solvents may be used singly or in combination of two or more of them, but not limited to them. In the present invention, among these organic solvents, use are preferably made of diethylene glycol dimethyl ether, 1-ethoxy-2-propanol, propylene glycol monomethyl ether acetate, and a mixed solvent thereof, each having the highest solubility for an acid generator in resist components.

The amount of the organic solvent used is 200 parts by mass to 3,000 parts by mass, preferably 400 parts by mass to 2,500 parts by mass with respect to 100 parts by mass of the base resin.

Into a resist material of the present invention, one or two or more of nitrogen-containing organic compounds may be blended as a basic compound (a quencher).

As the nitrogen-containing organic compound, a compound capable of controlling a diffusion rate at which an acid generated by an acid generator diffuses into a resist film is suitable. When the nitrogen-containing organic compound is blended into the resist material, the diffusion rate of an acid in the resist film is controlled, so that resolution is increased, a change in sensitivity after exposure is inhibited, dependence on substrates and environments is reduced, and, for example, exposure latitude and pattern profiles can be improved.

Examples of such a nitrogen-containing organic compound (quencher) include primary, secondary, and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, ammonia, ammonium salts, and sulfonium salts.

Such a nitrogen-containing organic compound is expressed by the following general formula.

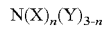  Formula (C-1)

In Formula (C-1), n is an integer of 0, 1, 2, or 3. X may be the same or different, and are expressed by Formula (X-1), (X-2), or (X-3). Y are the same or different, and are each a hydrogen atom, or a linear, branched, or cyclic alkyl group having a carbon atom number of 1 to 20 or 1 to 10, and may have an ether group or a hydroxy group. Examples of the alkyl group include the above-mentioned examples.

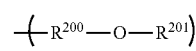  Formula (X-1)

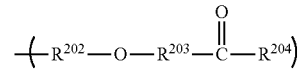  Formula (X-2)

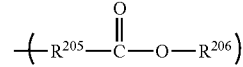  Formula (X-3)

In Formulae (X-1) to (X-3), $R^{200}$, $R^{202}$, and $R^{205}$ are each a linear or branched alkylene group having a carbon atom number of 1 to 10; and $R^{201}$ and $R^{204}$ are each a hydrogen atom, or a linear, branched, or cyclic alkyl group having a carbon atom number of 1 to 20 or 1 to 10, and may have one or a plurality of hydroxy groups, ether groups, ester groups, or lactone rings.

$R^{203}$ is a single bond or a linear or branched alkylene group having a carbon atom number of 1 to 10.

$R^{206}$ is a linear, branched, or cyclic alkyl group having a carbon atom number of 1 to 20 or 1 to 10, and may have one or a plurality of hydroxy groups, ether groups, ester groups, or lactone rings.

It should be noted that the alkyl group is as described above, and the alkylene group is a functional group derived from the alkyl group.

Furthermore, examples of the nitrogen-containing organic compound may include nitrogen-containing organic compounds of the following formula, having a cyclic structure.

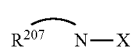  Formula (C-2)

In Formula (C-2), X is as described above; and $R^{207}$ is a linear or branched alkylene group having a carbon atom number of 1 to 20, 1 to 10, or 2-20, and may have one or a plurality of carbonyl groups, ether groups, ester groups, or sulfide groups. The alkylene group is a functional group derived from the alkyl group, and examples of the alkyl group include the above-mentioned examples.

Furthermore, examples of the nitrogen-containing organic compound may include nitrogen-containing organic compounds of the following formulae, having a cyano group.

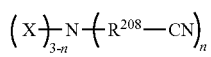  Formula (C-3)

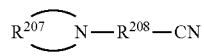  Formula (C-4)

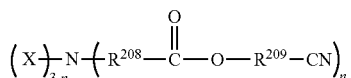  Formula (C-5)

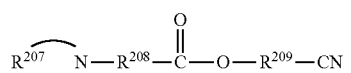  Formula (C-6)

In Formulae (C-3) to (C-6), X and $R^{207}$ are each defined as the same as those described above; and n is an integer of 1, 2, or 3. $R^{208}$ and $R^{209}$ are each the same or different, and are each a linear or branched alkylene group having a carbon atom number of 1 to 10 or 1 to 4.

Furthermore, examples of the nitrogen-containing organic compound may include nitrogen-containing organic compounds of the following formula, having an imidazole skeleton.

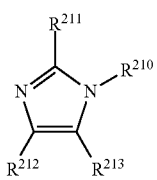

Formula (C-7)

In Formula (C-7), $R^{210}$ is a linear, branched, or cyclic alkyl group having a carbon atom number of 1 to 20, 1 to 10, or 2-20 having a polar functional group, in which the polar functional group is a hydroxy group, a carbonyl group, an ester group, an ether group, a sulfide group, a carbonate group, a cyano group, or an acetal group. $R^{211}$, $R^{212}$, and $R^{213}$ are each individually a hydrogen atom, a linear, branched, or cyclic alkyl group having a carbon atom number of 1 to 10, an aryl group, or an aralkyl group.

Furthermore, examples of the nitrogen-containing organic compound may include nitrogen-containing organic compounds of the following formula, having a benzimidazole skeleton.

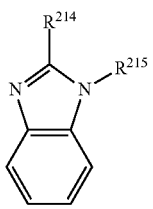

Formula (C-8)

In Formula (C-8), $R^{214}$ is a hydrogen atom, a linear, branched, or cyclic alkyl group having a carbon atom number of 1 to 10, a $C_{6-40}$ aryl group, or an aralkyl group; and $R^{215}$ is a linear, branched, or cyclic alkyl group having a carbon atom number of 1 to 20 or 1 to 10 having a polar functional group. The aralkyl group is composed of a combination of the aryl group and the alkyl group, and examples of the aryl group and the alkyl group include the above-mentioned examples. Examples of the polar functional group include the above-mentioned examples.

Furthermore, examples of the nitrogen-containing organic compound may include nitrogen-containing organic compounds of the following formulae, having the polar functional group.

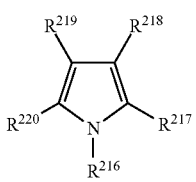

Formula (C-9)

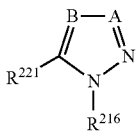

Formula (C-10)

In Formulae (C-9) and (C-10), A is a nitrogen atom or $=C-R^{222}$; B is a nitrogen atom or $=C-R^{223}$; $R^{216}$ is a linear, branched, or cyclic alkyl group having a carbon atom number of 1 to 20, 1 to 10, or 2-20 having a polar functional group; $R^{217}$, $R^{218}$, $R^{219}$, and $R^{220}$ are each independently a hydrogen atom, a linear, branched, or cyclic alkyl group having a carbon atom number of 1 to 10, or a $C_{6-40}$ aryl group, and $R^{217}$ may be bonded to $R^{218}$, and $R^{219}$ may be bonded to $R^{220}$, thereby forming a benzene ring, a naphthalene ring, or a pyridine ring; $R^{221}$ is a hydrogen atom, a linear, branched, or cyclic alkyl group having a carbon atom number of 1 to 10, or an aryl group; $R^{222}$ and $R^{223}$ are each independently a hydrogen atom, a linear, branched, or cyclic alkyl group having a carbon atom number of 1 to 10, or an aryl group; and $R^{221}$ may be bonded to $R^{223}$ to form a benzene ring or a naphthalene ring.

Furthermore, examples of the nitrogen-containing organic compound may include nitrogen-containing organic compounds of the following formulae, having an aromatic carboxylic ester structure.

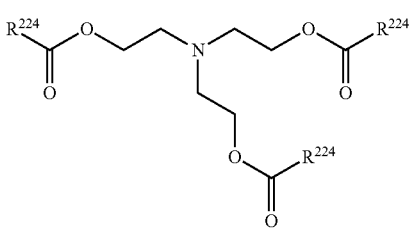

Formula (C-11)

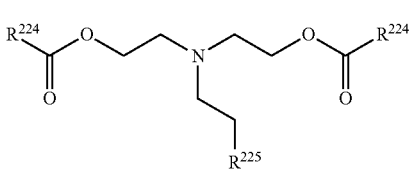

Formula (C-12)

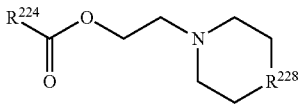

Formula (C-13)

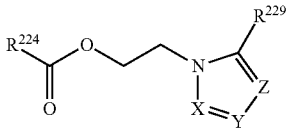

Formula (C-14)

In Formulae (C-11) to (C-14), $R^{224}$ is a $C_{6-40}$ aryl group or a $C_{4-20}$ heteroaromatic group, and some or all of hydrogen atoms thereof are optionally substituted with halogen atoms, linear, branched, or cyclic alkyl groups having a carbon atom number of 1 to 10 or 2 to 10, $C_{6-40}$ aryl groups, $C_{7-20}$ aralkyl groups, $C_{1-10}$ alkoxy groups, $C_{1-10}$ or $C_{2-10}$ acyloxy groups, or $C_{1-10}$ alkylthio groups. $R^{225}$ is $COOR^{226}$, $OR^{227}$, or a cyano group. $R^{226}$ is a $C_{1-10}$ alkyl group in which some methylene groups are optionally substituted with oxygen atoms. $R^{227}$ is a $C_{1-10}$ alkyl group in which some methylene groups are optionally substituted with oxygen atoms, or an acyl group. $R^{228}$ is a single bond, a methylene group, an ethylene group, a sulfur atom, or a —O(CH$_2$CH$_2$O)$_n$— group in which n is an integer of 0 to 4. $R^{229}$ is a hydrogen atom, a methyl group, an ethyl group, or a phenyl group. X is a nitrogen atom or $CR^{230}$. Y is a nitrogen atom or $CR^{231}$. Z is a nitrogen atom or $CR^{232}$. $R^{230}$, $R^{231}$, and $R^{232}$ are each independently a hydrogen atom, a methyl group, or a phenyl group; or $R^{230}$ may be bonded to $R^{231}$ or $R^{231}$ may be bonded to $R^{232}$, thereby forming a heteroaromatic ring.

Furthermore, examples of the nitrogen-containing organic compound may include nitrogen-containing organic compounds of the following formula, having a 7-oxanorbornane-2-carboxylic ester structure.

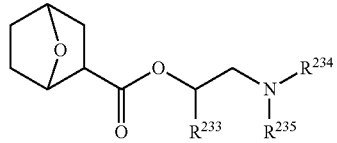

Formula (C-15)

In Formula (C-15), $R^{233}$ is a hydrogen atom, or a linear, branched, or cyclic alkyl group having a carbon atom number of 1 to 10. $R^{234}$ and $R^{235}$ are each a $C_{1-20}$ or $C_{1-10}$ alkyl group optionally having a polar functional group, a $C_{6-40}$ aryl group, or a $C_{7-20}$ aralkyl group, and some of hydrogen atoms thereof are optionally substituted with halogen atoms. $R^{234}$ and $R^{235}$ may be bonded to each other to form a $C_{2-20}$ heterocycle or a heteroaromatic ring.

Furthermore, examples of the nitrogen-containing organic compound may include nitrogen-containing organic compounds of the following formula, having a group that leaves under the action of an acid.

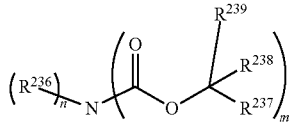

Formula (C-16)

In Formula (C-16), $R^{236}$ is a hydrogen atom, a $C_{1-10}$ alkyl group, a cycloalkyl group, a $C_{6-40}$ aryl group, or an aralkyl group. When n is two or more, two $R^{236}$ may be bonded to each other to form a heterocyclic hydrocarbon group. $R^{237}$, $R^{238}$, and $R^{239}$ are each a hydrogen atom, a $C_{1-10}$ alkyl group, a cycloalkyl group, a $C_{6-40}$ aryl group, an aralkyl group, or an alkoxyalkyl group. n=0 to 2; m=1 to 3; and n+m=3.

Examples of these nitrogen-containing organic compounds may be as follows.

Examples of the primary aliphatic amines include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, ticyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the mixed amines include dimethylethylamine, methylethylpropylamine, benzylamine, phenethylamine, and benzyldimethylamine.

Specific examples of the aromatic amines and the heterocyclic amines include aniline derivatives (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (such as pyrrole, 2H-pyrrole, 1-methylpyrrole, 2,4-dimethylpyrrole, 2,5-dimethylpyrrole, and N-methylpyrrole), oxazole derivatives (such as oxazole and isoxazole), thiazole derivatives (such as thiazole and isothiazole), imidazole derivatives (such as imidazole, 4-methylimidazole, and 4-methyl-2-phenylimidazole), pyrazole derivatives, furazan derivatives, pyrroline derivatives (such as pyrroline and 2-methyl-1-pyrroline), pyrrolidine derivatives (such as pyrrolidine, N-methylpyrrolidine, pyrrolidinone, and N-methylpyrrolidone), imidazoline derivatives, imidazolidine derivatives, pyridine derivatives (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (such as quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compounds having a carboxy group include aminobenzoic acid, indole carboxylic acid, and amino acid derivatives (such as nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxyalanine).

Examples of the nitrogen-containing compounds having a sulfonyl group include 3-pyridinesulfonic acid and pyridinium p-toluenesulfonate.

Examples of the nitrogen-containing compounds having a hydroxy group, the nitrogen-containing compounds having a hydroxyphenyl group, and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of the amides include formamide, N-methylformamide, N,N-dimethylformamide, acetamide, N-methylacetamide, N,N-dimethylacetamide, propionamide, benzamide, and 1-cyclohexylpyrrolidone. Examples of the imides include phthalimide, succinimide, and maleimide. Examples of the carbamates include N-t-butoxycarbonyl-N,N-dicyclohexylamine, N-t-butoxycarbonylbenzimidazole, and oxazolidinone.

Furthermore, use may be made of onium salts, such as a sulfonium salt of sulfonic acid, nitric acid, or carboxylic acid whose α-position is not fluorinated; an iodonium salt of sulfonic acid, nitric acid, or carboxylic acid whose a-position is not fluorinated; an ammonium salt of sulfonic acid, nitric acid, or carboxylic acid whose α-position is not fluorinated; halogenated ammonium; halogenated sulfonium; and halogenated iodonium. Examples of the carboxylic acid include maleic acid, acetic acid, propionic acid, and formic acid. Examples of the halogen include fluorine, chlorine, bromine, and iodine, and chlorine is preferably used.

Specific examples of the sulfonium cation include triphenylsulfonium, 4-hydroxyphenyldiphenylsulfonium, bis(4-hydroxyphenyl)phenylsulfonium, tris(4-hydroxyphenyl)sulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl 2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium. More preferred examples thereof include triphenylsulfonium, 4-tert-butylphenyldiphenylsulfonium, 4-tert-butoxyphenyldiphenylsulfonium, tris (4-tert-butylphenyl)sulfonium, and (4-tert-butoxycarbonylmethyloxyphenyl)diphenylsulfonium.

Further examples of the sulfonium cation include 4-(methacryloyloxy)phenyldiphenylsulfonium, 4-(acryloyloxy)phenyldiphenylsulfonium, 4-(methacryloyloxy)phenyldimethylsulfonium, and 4-(acryloyloxy)phenyldimethylsulfonium.

Examples of the ammonium cation include: ammonium cations formed by proton addition to nitrogen atoms of, for example, ammonia, primary, secondary, and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, and alcoholic nitrogen-containing compounds; and quaternary ammonium cations. Examples of the quaternary ammonium cations include tetraethylammonium and benzyltriethylammonium.

The radiation sensitive composition of the present invention may contain a crosslinking agent.

Examples of the crosslinking agent include melamine-based crosslinking agents, substituted-urea-based crosslinking agents, and polymer-based crosslinking agents thereof. A crosslinking agent having at least two crosslinkage-forming substituents is preferably used, and examples of such a crosslinking agent include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Furthermore, condensation products of these compounds may also be used.

Furthermore, as the above-mentioned crosslinking agent, a crosslinking agent having high heat resistance may be used. As the crosslinking agent having high heat resistance, a compound containing a crosslinkage-forming substituent having an aromatic ring (such as a benzene ring or a naphthalene ring) in its molecule may be preferably used.

Examples of such a compound include a compound having a partial structure of Formula (5) below and a polymer or oligomer having a repeating unit of Formula (6) below.

Formula (5)

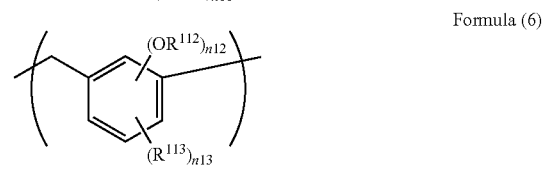

Formula (6)

In Formula (5), $R^{110}$ and $R^{111}$ are each independently a hydrogen atom, a $C_{1-10}$ alkyl group, or a $C_{6-20}$ aryl group; n10 is an integer of 1 to 4; n11 is an integer of 1 to (5−n10); and (n10+n11) is an integer of 2 to 5.

In Formula (6), $R^{112}$ is a hydrogen atom or a $C_{1-10}$ alkyl group; $R^{113}$ is a $C_{1-10}$ alkyl group; n12 is an integer of 1 to 4; n13 is an integer of 0 to (4−n12); and (n12+n13) is an integer of 1 to 4. The oligomer and the polymer may be each used when having 2 to 100, or 2 to 50 repeating-unit structures.

Examples of these alkyl and aryl groups include the above-mentioned alkyl and aryl groups.

Examples of the compounds of Formula (5) and the polymer and the oligomer of Formula (6) are as follows.

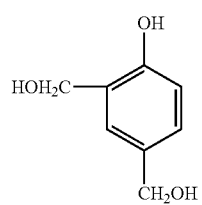

Formula (4-1)

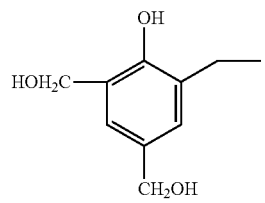

Formula (4-2)

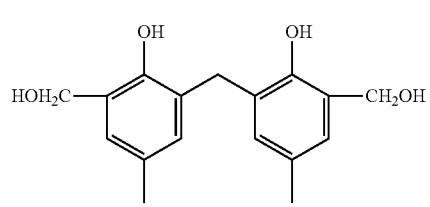

Formula (4-3)

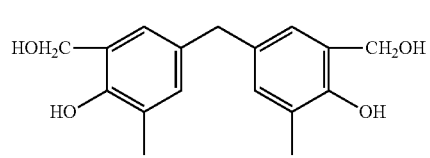

Formula (4-4)

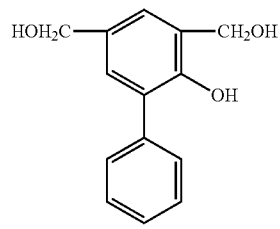

Formula (4-5)

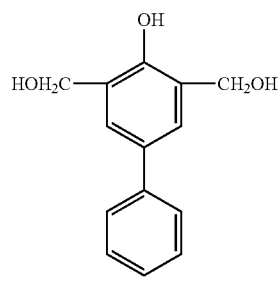

Formula (4-6)

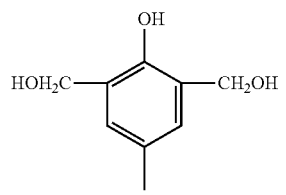

Formula (4-7)

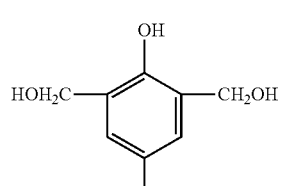

Formula (4-8)

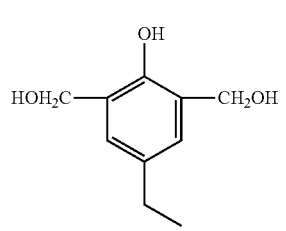

Formula (4-9)

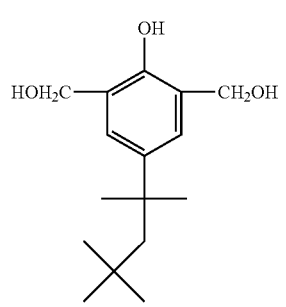

Formula (4-10)

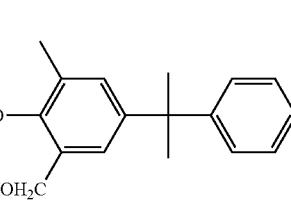

Formula (4-11)

Formula (4-12)

Formula (4-13)

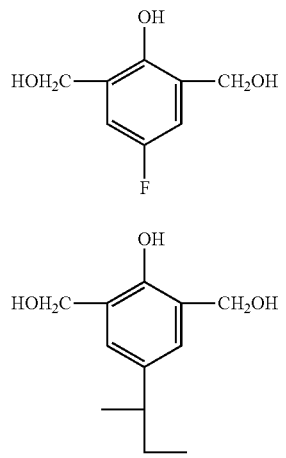

Formula (4-14)
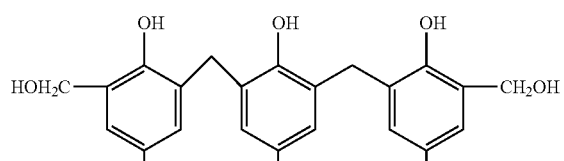

Formula (4-15)
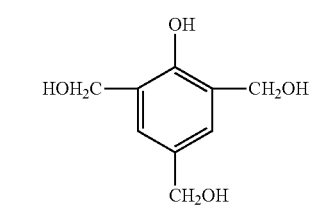

Formula (4-16)
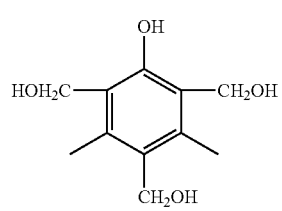

Formula (4-17)
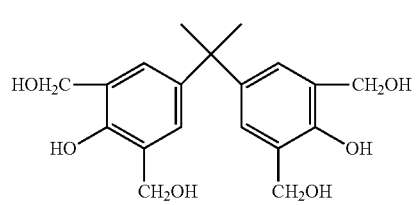

Formula (4-18)
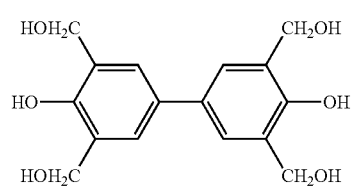

Formula (4-19)
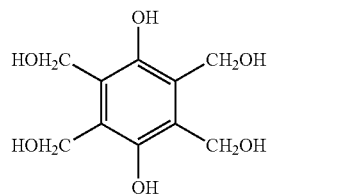

Formula (4-20)
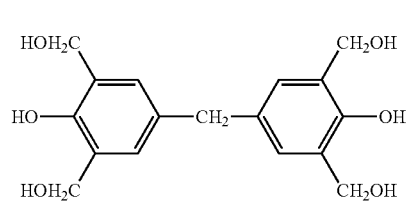

Formula (4-21)
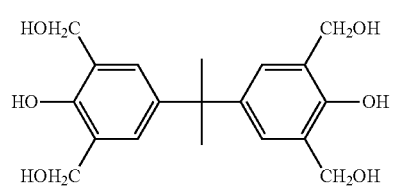

Formula (4-22)
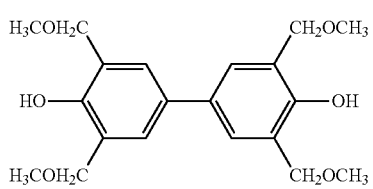

Formula (4-23)
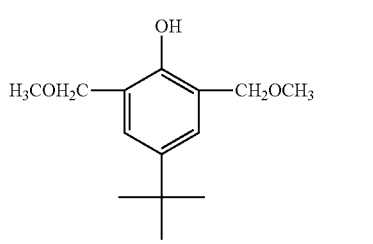

Formula (4-24)
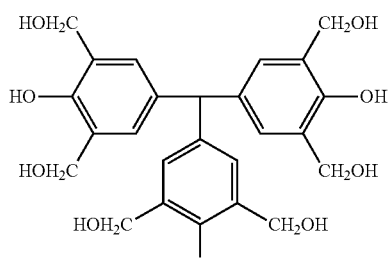

Formula (4-25)
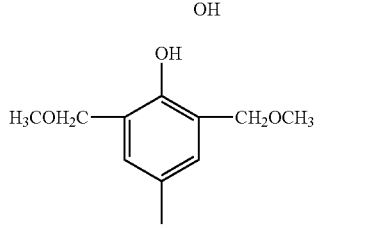

Formula (4-26)
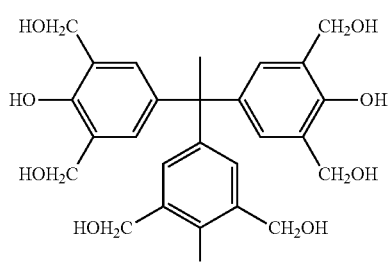

Formula (4-27)
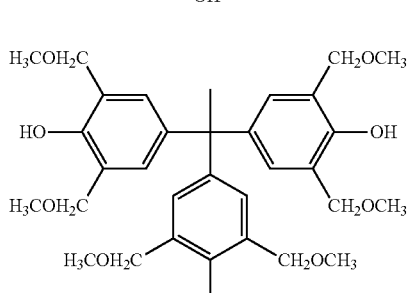

The above-mentioned compounds are available as products of ASAHI YUKIZAI CORPORATION and Honshu Chemical Industry Co., Ltd. For example, among the above-mentioned crosslinking agents, the compound of Formula (4-21) is available as a compound trade-named TM-BIP-A, manufactured by ASAHI YUKIZAI CORPORATION.

For example, among the above-mentioned crosslinking agents, the compound of Formula (4-22) is available as a compound trade-named TMOM-BP, manufactured by Honshu Chemical Industry Co., Ltd.

Although the amount of the crosslinking agent added varies depending on an application solvent to be used, a base substrate to be used, a required solution viscosity, a required film shape, and the like, the crosslinking agent may be used at a proportion of 0.001% by mass to 80% by mass, preferably 0.01% by mass to 50% by mass, more preferably 0.05% by mass to 40% by mass with respect to the total solid content. These crosslinking agents are sometimes self-condensed to cause a crosslinking reaction, but, in the case where a crosslinkable substituent is present in the above-mentioned polymers of the present invention, the crosslinking agents can cause a crosslinking reaction with the crosslinkable substituent.

The radiation sensitive composition of the present invention can be used as a resist composition in a lithography process.

According to the present invention, the resolution of the radiation sensitive composition including a siloxane polymer having a phenoplast crosslinking reactivity as a base resin and further including a photoacid generator and a solvent can be increased. The phenoplast reactive group of the composition of the present invention contains a methylol or a protected methylol group, and addition of the reactive group to a portion with an abundance of electrons of an aromatic ring in the polymer allows the composition to be cured at low temperature, and thus, a good negative pattern can be obtained.

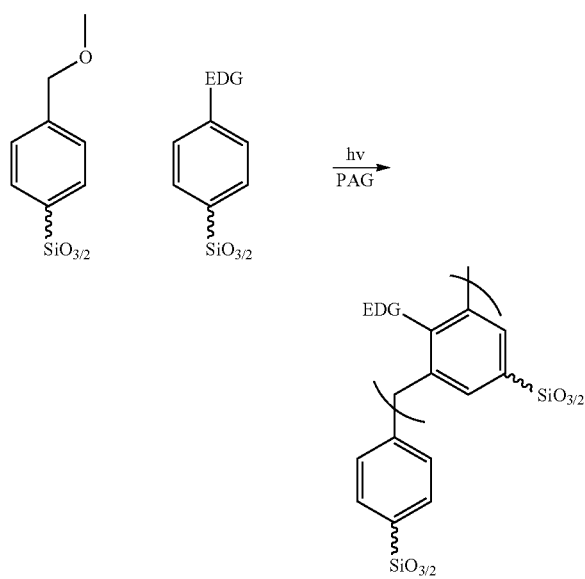

In the formula above, EDG is an electron donating group, such as hydroxy group, methoxy group, or methyl group. It is deemed that, due to an acid from a PAG (a photoacid generator), a methoxy group leaves a methoxy methyl group with which a phenyl group is substituted, and the resultant reacts with the ortho position or para position with respect to the position of the EDG with which a phenyl group is substituted, and thus, a crosslinking reaction based on a phenoplast reaction is caused. Depending on the presence of a reactive site at the ortho or para position with respect to the position of the EDG or a relative increase in electron density at the ortho or para position in the case where a plurality of EDGs are present, it is determined how easily an electrophilic substitution reaction proceeds. Furthermore, ease of reaction causes curing at lower temperature and curing with a smaller amount of exposure, and therefore leads to acid diffusion inhibition and higher sensitivity.

The present invention provides, as a radiation sensitive resin, a polysiloxane-based radiation sensitive resin that is excellent in sensitivity and resolution, the resin including polysiloxane as its skeleton and having, in its side chain, a functional group capable of undergoing a phenoplast reaction making use of a crosslinking structure formed by the reaction of a protected methylol group and phenolic hydroxy group.

A resist film can be obtained by baking the radiation sensitive composition of the present invention, and a resist pattern can be obtained by exposing the resist film to light and developing. The polysiloxane-based radiation sensitive resin is preferable because the resist pattern obtained therefrom has high resistance to oxygen-based plasma etching, and accordingly, an organic underlayer film (organic hard mask) that is an underlayer of the resist, and a substrate can be easily processed. However, since conventional negative resists mainly allow pattern formation by means of silanol condensation or radical polymerization, sufficient patterning characteristics cannot be achieved because of curing of a non-exposed portion due to the instability of silanol, inhibition of a radical reaction by oxygen, and low sensitivity. The radiation sensitive composition of the present invention includes polysiloxane as its skeleton, and furthermore, the composition is a siloxane material having a phenoplast-based functional group in a polymer, and therefore, can be easily cured and have higher sensitivity.

Furthermore, a multi-process is performed, in which, for the purpose of preventing the collapse of a finer pattern of a resist film formed from a resist material at the time of development, the film thickness of the resist film is made smaller, and an underlayer film having gas etching resistance different from that of the resist material is provided directly under the resist film.

In other words, lithography is performed using a process in which, using a dry etching gas to which a resist material has resistance and which is capable of removing an underlayer film disposed directly under the resist, a resist pattern is transferred to the underlayer film, and then, using a dry etching gas to which the underlayer film has resistance and which is capable of removing and processing a film and a substrate disposed directly under the underlayer film, the pattern is sequentially transferred to the layer and the substrate.

Examples of this include the provision of a laminated structure in which, under an organic resist, a silicon-based hard mask is disposed, and furthermore, under the silicon-based hard mask, an organic hard mask and a substrate are disposed in this order.

Alternatively, in the case of using a silicon-based resist, there is provided a laminated structure in which, under the silicon-based resist, an organic hard mask and a substrate are disposed in this order.

The radiation sensitive resin of the present invention is a polysiloxane-based radiation sensitive resin that is excellent in sensitivity and resolution, the resin including polysiloxane as its skeleton and having, in its side chain, a functional group capable of undergoing a phenoplast reaction making use of a crosslinking structure formed by the reaction of a methylol group and a phenolic hydroxy group, and hence, the radiation sensitive resin provides a resist pattern having gas etching resistance and has higher lithography characteristics.

Specifically, the present invention includes a method for forming a resist pattern, the method comprising the steps of: applying the above-described radiation sensitive composition of the present invention onto a semiconductor substrate and baking the composition to form a resist film; exposing the resist film to light; and after the exposure, developing the resist film to form a resist pattern.

Furthermore, according to the present invention, a semiconductor device can be produced using a method comprising the steps of: applying the above-described radiation sensitive composition onto a semiconductor substrate and baking the composition to form a resist film; exposing the resist film to light; after the exposure, developing the resist film to form a resist pattern; and processing the substrate using the resist pattern.

Onto a substrate used for producing a semiconductor device (such as a silicon wafer substrate, a silicon/silicon-dioxide coated substrate, a silicon nitride substrate, a glass substrate, an ITO substrate, a polyimide substrate, or a low dielectric constant material (low-k material) coated substrate), the radiation sensitive composition of the present invention is applied by appropriate application means, such as a spinner or a coater, and subsequently baked to form a resist film. The conditions for the baking are appropriately selected from heating temperatures of 80° C. to 250° C. and heating durations of 0.3 minute to 60 minutes. The baking temperature is preferably 150° C. to 250° C., and the heating duration is preferably 0.5 minute to 2 minutes. The thickness of the resist film formed herein is, for example, 50 nm to 10,000 nm, 100 nm to 2,000 nm, or 200 nm to 1,000 nm.

Next, exposure is performed through a predetermined mask. For the exposure, for example, a KrF excimer laser (with a wavelength of 248 nm), an ArF excimer laser (with a wavelength of 193 nm), or an F2 excimer laser (with a wavelength of 157 nm) may be used. After the exposure, post exposure bake may be performed, if necessary. The post exposure bake is performed under the conditions appropriately selected from heating temperatures of 70° C. to 150° C. and heating durations of 0.3 minute to 10 minutes.

Next, the resist film is developed using a developing solution (for example, an alkaline developing solution). Through this development, a non-exposed portion of the negative resist film formed from the composition of the present invention is removed to form a resist pattern.

Examples of the developing solution include alkaline solutions, such as: aqueous solutions of alkali metal hydroxides, such as potassium hydroxide and sodium hydroxide; aqueous solutions of quaternary ammonium hydroxides, such as tetramethyl ammonium hydroxide, tetraethyl ammonium hydroxide, and choline; and aqueous solutions of amines, such as ethanolamine, propylamine, and ethylenediamine. Furthermore, for example, a surfactant may be added to the developing solution. The development conditions are appropriately selected from temperatures of 5° C. to 50° C. and durations of 10 seconds to 600 seconds.

Furthermore, in the present invention, an organic solvent may be used as the developing solution. After the exposure, development is performed using the developing solution (solvent). Through the development, a non-exposed resist portion of the negative resist film formed from the composition of the present invention is removed to form a photoresist pattern.

Examples of the developing solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxy propionate, ethyl-3-methoxy propionate, ethyl-3-ethoxy propionate, and propyl-3-methoxy propionate. Furthermore, for example, a surfactant may be added to the developing solution. The development conditions are appropriately selected from temperatures of 5° C. to 50° C. and durations of 10 seconds to 600 seconds.

Furthermore, the present invention includes a method for producing a semiconductor device, the method comprising the steps of: forming an organic underlayer film on a semiconductor substrate; applying the radiation sensitive composition of the present invention onto the organic underlayer film and baking the composition to form a resist film; exposing the resist film to light; after the exposure, developing the resist film to obtain a resist pattern; etching the organic underlayer film using the resist pattern; and processing the semiconductor substrate using the patterned organic underlayer film.

More specifically, an organic underlayer film is film-formed on a substrate, and then the organic underlayer film is coated with a resist, that is, the radiation sensitive composition of the present invention. The use of the radiation sensitive composition of the present invention allows the substrate to be processed using an appropriately selected etching gas, even when the pattern width of a resist film is narrower and accordingly the resist is applied thinly for the purpose of preventing pattern collapse. For example, the use of an oxygen-based gas as an etching gas, which offers a sufficiently higher etching rate for the organic underlayer film than that for the resist, allows the organic underlayer film to be processed. Furthermore, the use of a fluorine-based gas as an etching gas, which offers a sufficiently higher etching rate for the substrate than that for the organic underlayer film, allows the substrate to be processed.

For the dry etching of the resist film according to the present invention, use may be made of gases, such as tetrafluoromethane ($CF_4$), parfluorocyclobutane ($C_4F_8$), parfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane, and dichloroborane.

The dry etching of the organic underlayer film (underlayer) is preferably performed using an oxygen-based gas. This is because the resist film formed of the radiation sensitive composition of the present invention that contains many silicon atoms is difficult to remove by dry etching using an oxygen-based gas.

Subsequently, the semiconductor substrate is processed. The processing of the semiconductor substrate is preferably performed by dry etching using a fluorine-based gas.

Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

The present invention further relates to, among the compounds of Formula (2), a novel silane compound of Formula (5-1), Formula (5-2), or Formula (5-3). In the formulae, $R^{17}$, $R^{19}$, $R^{21}$, $R^{22}$, and $R^{23}$ are each independently an alkyl group; and $R^{16}$, $R^{18}$, and $R^{20}$ are each independently an alkoxy group, an acyloxy group, or a halogen group. Here, examples of the alkyl group include $C_{1-10}$ alkyl groups, and specific examples thereof include the above-mentioned examples. Likewise, examples of the alkoxy group include $C_{1-20}$ alkoxy groups, and examples of the acyloxy group include $C_{1-20}$ or $C_{2-20}$ acyloxy groups, and furthermore, examples of these alkoxy and acyloxy groups and the halogen group include the above-mentioned examples.

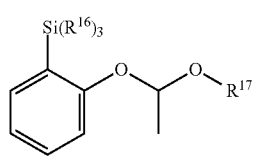

Formula (5-1)

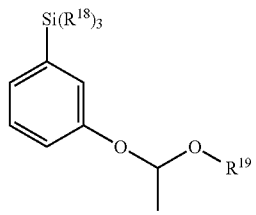

Formula (5-2)

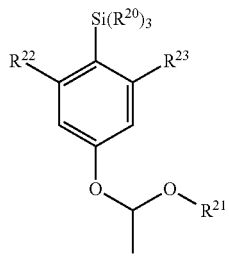

Formula (5-3)

EXAMPLES

Synthesis of (4-(1-ethoxyethoxy)phenyl)trimethoxysilane

Into a 300-ml eggplant flask equipped with a magnetic stirrer, 42.0 g of 4-bromophenol, 94.6 g of tetrahydrofuran (hereinafter, sometimes referred to as THF) (dehydrated), and 1.83 g of pyridinium p-toluenesulfonate (hereinafter, sometimes referred to as PPTS) were introduced and dissolved. To the resultant solution, 26.26 g of ethyl vinyl ether was added, and the resultant solution was allowed to react at room temperature for 20 hours. The resultant solution was neutralized using 0.74 g of triethylamine (hereinafter, sometimes referred to as TEA) to prepare Reaction Solution A. Into a 500-ml three-neck flask equipped with a stirrer chip, 7.08 g of dried magnesium powder, 0.62 g of iodine, and 189.2 g of tetrahydrofuran (dehydrated) were introduced, and the mixture was heated in an oil bath at 60° C. until the color of the iodine disappeared. Subsequently, the resultant solution was cooled to room temperature, and Reaction Solution A was added dropwise thereto at room temperature and the resultant solution was allowed to react for 2 hours to obtain Reaction Solution B. Into a 1,000-ml three-neck flask equipped with a stirrer chip, 110.86 g of tetramethoxysilane (hereinafter, sometimes referred to as TMOS) and 189.2 g of tetrahydrofuran (dehydrated) were introduced, and stirred. To the resultant solution, Reaction Solution B was added dropwise at room temperature, and the resultant solution was allowed to react for 2 hours. The obtained solution was concentrated by evaporation, and then, 500 ml of a heptane solution was added thereto, followed by stirring and filtration. The obtained filtrate was concentrated, and then purified by distillation under reduced pressure to obtain 27 g of (4-(1-ethoxyethoxy)phenyl)trimethoxysilane as a target product.

$^1$H-NMR (500 MHz, DMSO-$d_6$): 1.06 ppm (t, 3H), 1.37 ppm (d, 3H), 3.48 ppm (s, 9H), 3.55 ppm (multi, 2H), 5.49 ppm (q, 1H), 7.01 ppm (d, 2H), 7.45 ppm (d, 2H)

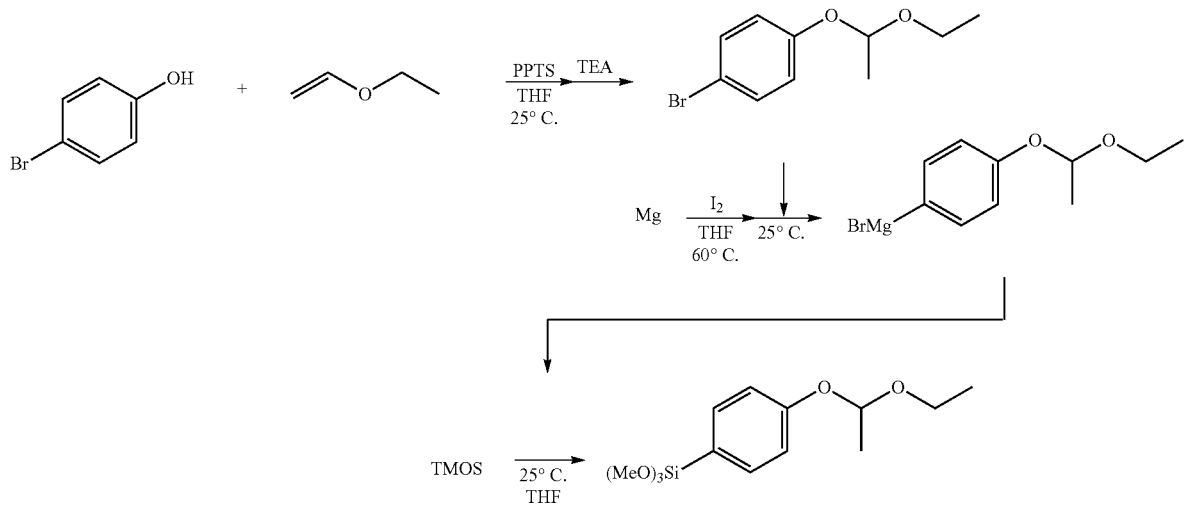

Synthesis of (3-(1-ethoxyethoxy)phenyl)trimethoxysilane

Into a 300-ml eggplant flask equipped with a magnetic stirrer, 42.0 g of 3-bromophenol, 94.6 g of tetrahydrofuran (dehydrated), and 1.83 g of pyridinium p-toluenesulfonate were introduced and dissolved. To the resultant solution, 26.26 g of ethyl vinyl ether was added, and the resultant solution was allowed to react at room temperature for 20 hours. The resultant solution was neutralized using 0.74 g of triethylamine to prepare Reaction Solution A. Into a 500-ml three-neck flask equipped with a stirrer chip, 7.08 g of dried magnesium powder, 0.62 g of iodine, and 189.2 g of tetrahydrofuran (dehydrated) were introduced, and heated in an oil bath at 60° C. until the color of the iodine disappeared. Subsequently, the resultant solution was cooled to room temperature, and Reaction Solution A was added dropwise thereto at room temperature and the resultant solution was allowed to react for 2 hours to obtain Reaction Solution B. Into a 1,000-ml three-neck flask equipped with a stirrer chip, 110.86 g of tetramethoxysilane and 189.2 g of tetrahydrofuran (dehydrated) were introduced, and stirred. To the resultant solution, Reaction Solution B was added dropwise at room temperature, and the resultant solution was allowed to react for 2 hours. The obtained solution was concentrated by evaporation, and then, 500 ml of a heptane solution was added thereto, followed by stirring and filtration. The obtained filtrate was concentrated, and then purified by distillation under reduced pressure to obtain 30 g of Compound 2 as a target product.

$^1$H-NMR (500 MHz, DMSO-$d_6$): 1.10 ppm (t, 3H), 1.40 ppm (d, 3H), 3.54 ppm (s, 9H), 3.59 ppm (multi, 2H), 5.47 ppm (q, 1H), 7.15 ppm (multi, 3H), 7.36 ppm (t, 1H)

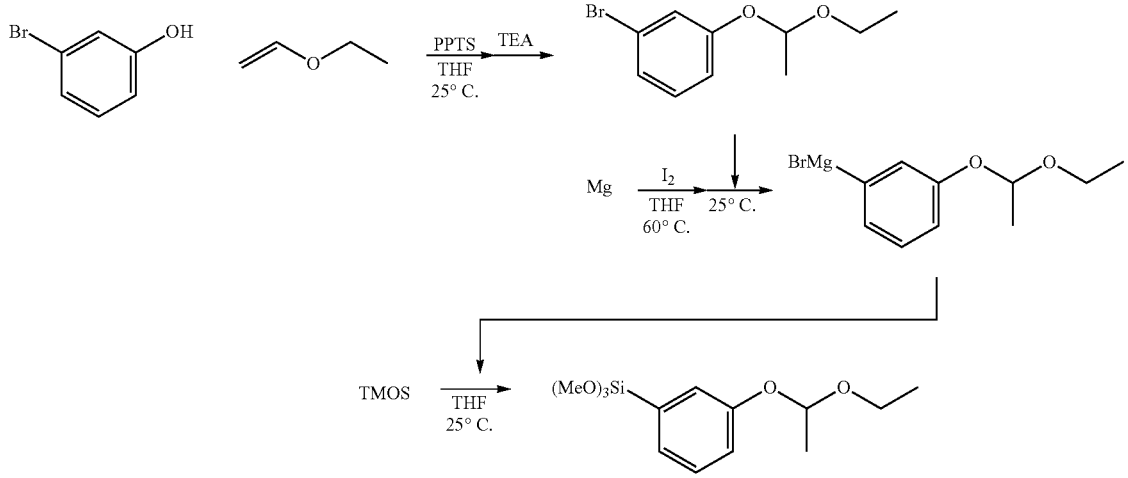

Synthesis of (2-(1-ethoxyethoxy)phenyl)trimethoxysilane

Into a 300-ml eggplant flask equipped with a magnetic stirrer, 42.0 g of 2-bromophenol, 94.6 g of tetrahydrofuran (dehydrated), and 1.83 g of pyridinium p-toluenesulfonate were introduced and dissolved. To the resultant solution, 26.26 g of ethyl vinyl ether was added, and the resultant solution was allowed to react at room temperature for 20 hours. The resultant solution was neutralized using 0.74 g of triethylamine to prepare Reaction Solution A. Into a 500-ml three-neck flask equipped with a stirrer chip, 7.08 g of dried magnesium powder, 0.62 g of iodine, and 189.2 g of tetrahydrofuran (dehydrated) were introduced, and heated in an oil bath at 60° C. until the color of the iodine disappeared. Subsequently, the resultant solution was cooled to room temperature, and Reaction Solution A was added dropwise thereto at room temperature and the resultant solution was allowed to react for 2 hours to obtain Reaction Solution B. Into a 1,000-ml three-neck flask equipped with a stirrer chip, 110.86 g of tetramethoxysilane and 189.2 g of tetrahydrofuran (dehydrated) were introduced, and stirred. To the resultant solution, Reaction Solution B was added dropwise at room temperature, and the resultant solution was allowed to react for 2 hours. The obtained solution was concentrated by evaporation, and then, 500 ml of a heptane solution was added thereto, followed by stirring and filtration. The obtained filtrate was concentrated, and then purified by distillation under reduced pressure to obtain 25 g of Compound 3 as a target product.

$^1$H-NMR (500 MHz, DMSO-$d_6$): 1.12 ppm (t, 3H), 1.43 ppm (d, 3H), 3.53 ppm (s, 9H), 3.60 ppm (multi, 2H), 5.57 ppm (q, 1H), 6.98 (t, 1H), 7.10 ppm (d, 1H), 7.42 ppm (t, 1H), 7.50 ppm (d, 1H)

tetrahydrofuran (dehydrated), and 1.57 g of pyridinium p-toluenesulfonate were introduced and dissolved. To the resultant solution, 22.59 g of ethyl vinyl ether was added, and the resultant solution was allowed to react at room temperature for 20 hours. The resultant solution was neutralized using 0.63 g of triethylamine to prepare Reaction Solution A. Into a 500-ml three-neck flask equipped with a stirrer chip, 6.09 g of dried magnesium powder, 0.53 g of iodine, and 189.2 g of tetrahydrofuran (dehydrated) were introduced, and heated in an oil bath at 60° C. until the color of the iodine disappeared. Subsequently, the resultant solution was cooled to room temperature, and Reaction Solution A was added dropwise thereto at room temperature, and the resultant solution was allowed to react for 2 hours to obtain Reaction Solution B. Into a 1,000-ml three-neck flask equipped with a stirrer chip, 95.39 g of tetramethoxysilane and 189.2 g of tetrahydrofuran (dehydrated) were introduced, and stirred. To the resultant solution, Reaction Solution B was added dropwise at room temperature, and the resultant solution was allowed to react for 2 hours. The obtained solution was concentrated by evaporation, and then, 500 ml of a heptane solution was added thereto, followed by stirring and filtration. The obtained filtrate was

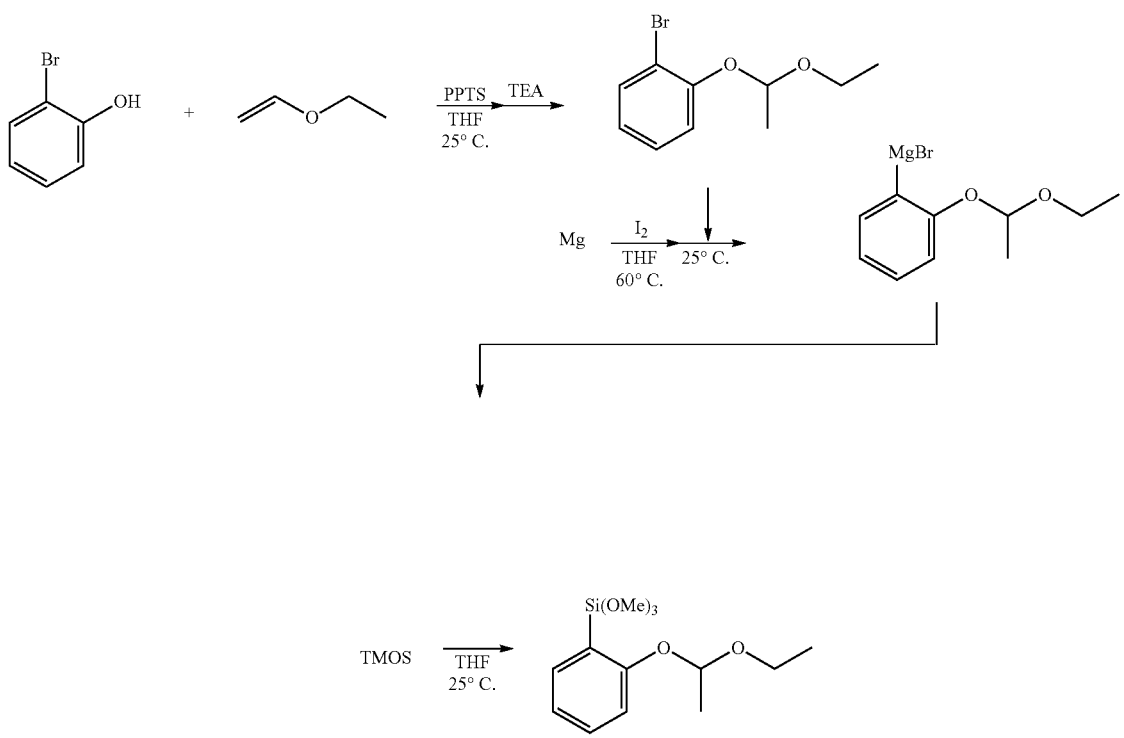

Synthesis of (4-(1-ethoxyethoxy)-2,6-dimethylphenyl)trimethoxysilane

Into a 300-ml eggplant flask equipped with a magnetic stirrer, 42.0 g of 4-bromo-3,5-dimethylphenol, 94.6 g of concentrated, and then purified by distillation under reduced pressure to obtain 35 g of Compound 4 as a target product.

$^1$H-NMR (500 MHz, DMSO-$d_6$): 1.06 ppm (t, 3H), 1.34 ppm (d, 3H), 2.36 ppm (s, 6H), 3.47 ppm (s, 9H), 3.53 ppm (multi, 2H), 5.46 ppm (q, 1H), 6.61 (s, 2H)

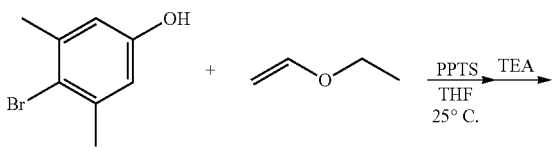

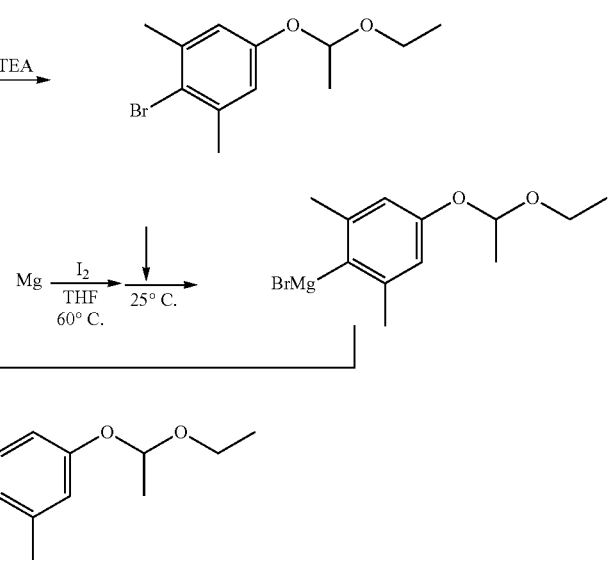

Synthesis of Phenoplast Crosslinkable Silane

Into a 1,000-ml eggplant flask equipped with a magnetic stirrer, 20.0 g of vanillyl alcohol and 400.0 g of methanol were introduced and dissolved. To the resultant solution, 0.25 g of concentrated sulfuric acid was added, and the resultant solution was heated to reflux for 1 hour. The resultant solution was cooled to room temperature, and neutralized using sodium hydroxide, and subsequently, methanol was removed therefrom by evaporation. The resultant solution was transferred into a 300-ml three-neck flask, and 5.19 g of sodium hydroxide, 40 g of toluene, and 40 g of NMP (N-methylpyrrolidone) were added thereto, and the resultant solution was allowed to react in an oil bath at 130° C. for 4 hours while water and the toluene were removed. To the resultant solution, 27.60 g of chloromethyltriethoxysilane was added dropwise, and the resultant solution was heated and stirred at 130° C. for 4 hours. The obtained solution was cooled to room temperature, and transferred into a separating funnel, and 120 g of toluene and 90 g of water were added thereto to wash an organic layer. After the washing was repeated 3 times, magnesium sulfate was added to the organic layer and dried, followed by filtration, and the solvent was removed by evaporation to obtain an intermediate product. The intermediate product was then purified by distillation under reduced pressure to obtain 15 g of (2-methoxy-4-(methoxymethyl)phenoxy)methyltriethoxysilane as a target product.

$^1$H-NMR (500 MHz, DMSO-$d_6$): 1.20 ppm (t, 9H), 3.26 ppm (s, 3H), 3.68 ppm (s, 2H), 3.75 ppm (s, 3H), 3.87 ppm (q, 6H), 4.32 (s, 2H), 6.83 ppm (d, 1H), 6.89 ppm (s, 1H), 7.00 ppm (d, 2H)

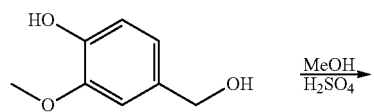

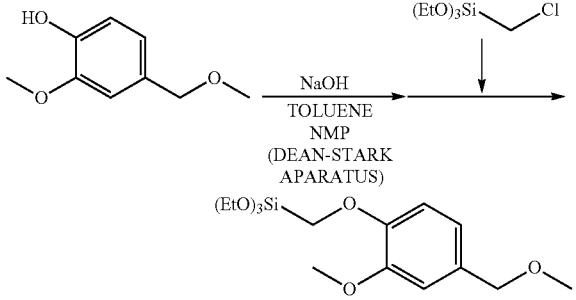

Synthesis Example 1

(Polymerization Reaction)

Into a 100-ml reaction flask, 4.90 g of a 35%-by-mass tetraethyl ammonium hydroxide solution (hereinafter, sometimes referred to as TEAOH), 26.01 g of isopropanol (hereinafter, sometimes referred to as IPA), and 26.01 g of tetrahydrofuran were introduced, and stirred. To the resultant solution, 10.00 g of (2-methoxy-4-(methoxymethyl)phenoxy)methyltriethoxysilane (50 mol % of all the silanes) and 8.31 g of (3-(1-ethoxyethoxy)phenyl)trimethoxysilane (50 mol % of all the silanes) were added at room temperature, and the resultant solution was heated to 40° C. and allowed to react for 4 hours. The resultant solution was cooled to room temperature, and 109.88 g of ethyl acetate and 54.94 g of water were added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate (hereinafter, sometimes referred to as PGMEA) was added and the organic layer was concentrated to perform solvent substitution. The obtained polymer had a solid content of 40.20% by weight.

(Deprotection Reaction)

Into a 100-ml reaction flask, 25 g of the obtained polymer solution was transferred, and 10.18 g of propylene glycol monomethyl ether and 25.13 g of acetone were added thereto, and furthermore, 2.41 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 39.11% by weight and the polymer had a molecular weight of 1,850.

chloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 33.54% by weight.

(Deprotection Reaction)

Into a 100-ml reaction flask, 30 g of the obtained polymer solution was transferred, and 5.22 g of propylene glycol monomethyl ether and 25.16 g of acetone were added thereto, and furthermore, 2.41 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 35.43% by weight and the polymer had a molecular weight of 1,500.

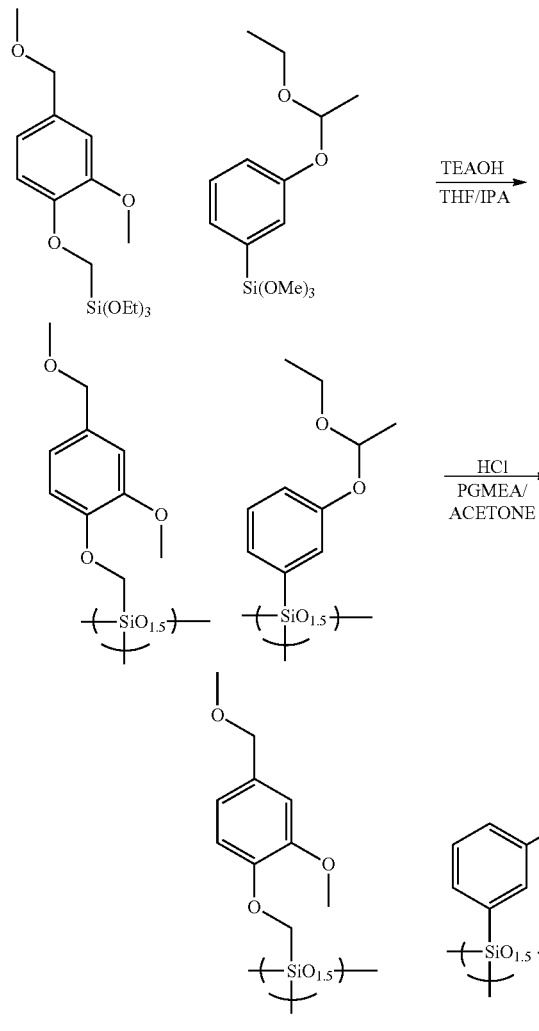

Synthesis Example 2

(Polymerization Reaction)

Into a 100-ml reaction flask, 4.90 g of a 35%-by-mass tetraethyl ammonium hydroxide solution, 26.01 g of isopropanol, and 26.01 g of tetrahydrofuran were introduced, and stirred. To the resultant solution, 10.00 g of (2-methoxy-4-(methoxymethyl)phenoxy)methyltriethoxysilane (50 mol % of all the silanes) and 8.31 g of (2-(1-ethoxyethoxy)phenyl) trimethoxysilane (50 mol % of all the silanes) were added at room temperature, and the resultant solution was heated to 40° C. and allowed to react for 4 hours. The resultant solution was cooled to room temperature, and 109.88 g of ethyl acetate and 54.94 g of water were added thereto, and the resultant solution was neutralized using a 0.2N hydro-

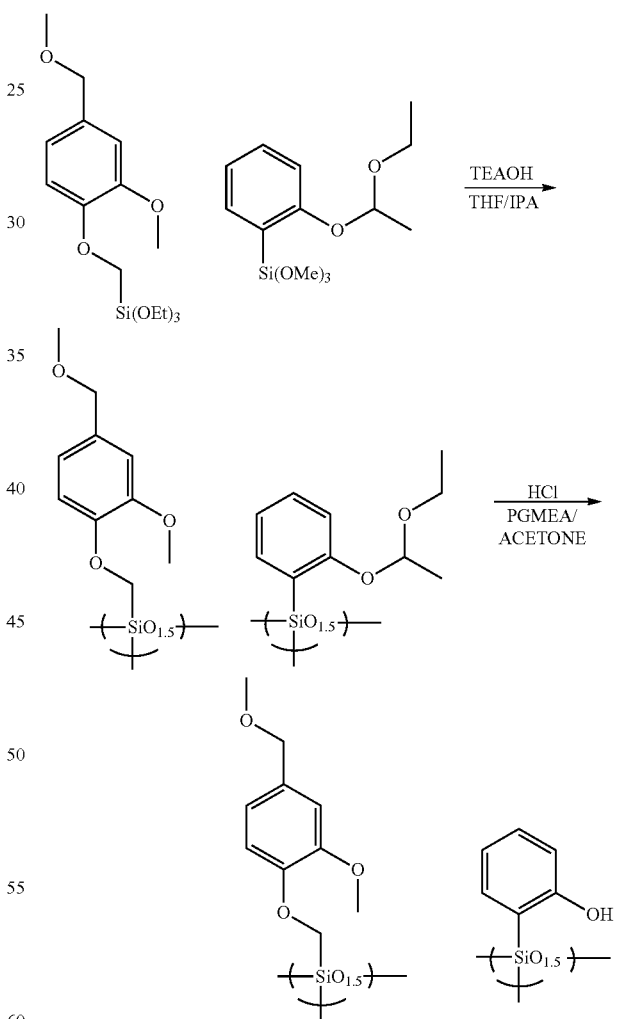

Synthesis Example 3

(Polymerization Reaction)

Into a 100-ml reaction flask, 0.25 g of a 35%-by-mass tetraethyl ammonium hydroxide solution, 0.777 g of ultrapure water, 7.33 g of isopropanol, and 4.02 g of tetrahydrofuran were introduced, and stirred. To the resultant solution, 5.00 g of (2-methoxy-4-(methoxymethyl)phenoxy)methyltriethoxysilane (50 mol % of all the silanes) and 4.57 g of (4-(1-ethoxyethoxy)-2,6-dimethylphenyl)trimethoxysilane (50 mol % of all the silanes) were added at room temperature, and the resultant solution was heated to 40° C. and allowed to react for 4 hours. The resultant solution was cooled to room temperature, and 57.38 g of ethyl acetate and 28.69 g of water were added thereto, and the resultant solution was neutralized using a 0.1N acetic acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 59.03% by weight.

(Deprotection Reaction)

Into a 50-ml reaction flask, 8 g of the obtained polymer solution was transferred, and 8.53 g of propylene glycol monomethyl ether and 11.81 g of acetone were added thereto, and furthermore, 1.07 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 36.56% by weight and the polymer had a molecular weight of 2,000.

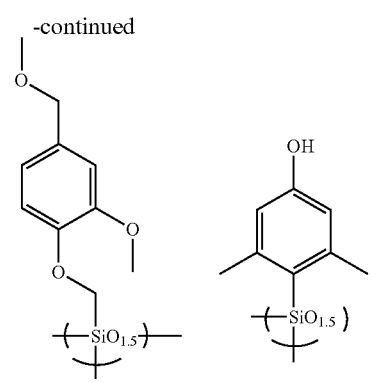

Synthesis Example 4

(Polymerization Reaction)

Into a 100-ml reaction flask, 1.63 g of a 35%-by-mass tetraethyl ammonium hydroxide solution, 8.68 g of isopropanol, and 8.68 g of tetrahydrofuran were introduced, and stirred. To the resultant solution, 3.00 g of (2-methoxy-4-(methoxymethyl)phenoxy)methyltriethoxysilane (45 mol % of all the silanes), 2.49 g of (4-(1-ethoxyethoxy)phenyl)trimethoxysilane (45 mol % of all the silanes), and 0.62 g of 1,4-bis(trimethoxysilyl)benzene (10 mol % of all the silanes) were added, and heated to 40° C. and the resultant solution was allowed to react for 4 hours. The resultant solution was cooled to room temperature, and 36.66 g of ethyl acetate and 18.33 g of water were added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 51.65% by weight.

(Deprotection Reaction)

Into a 50-mi reaction flask, 5 g of the obtained polymer solution was transferred, and 4.04 g of propylene glycol monomethyl ether and 6.46 g of acetone were added thereto, and furthermore, 0.62 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 32.74% by weight and the polymer had a molecular weight of 5,300.

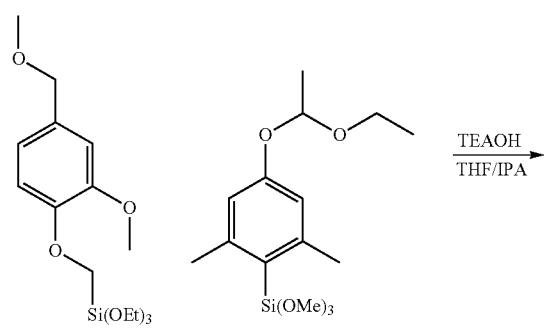

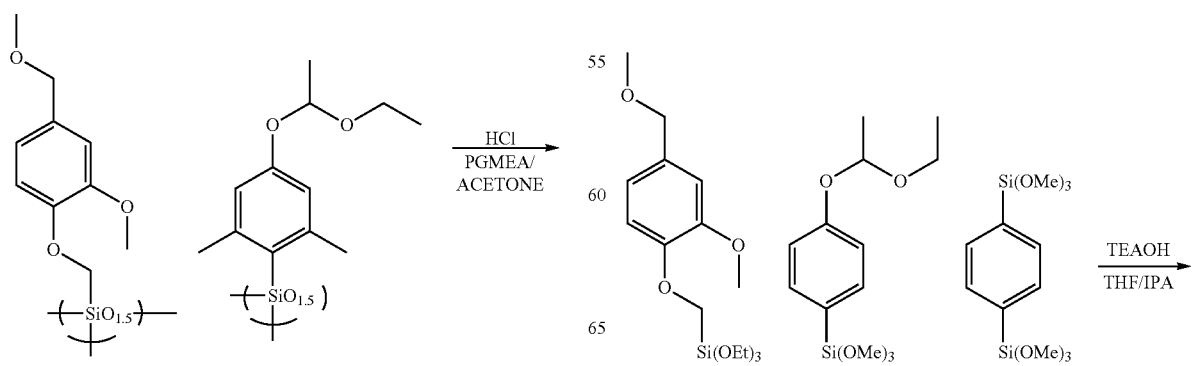

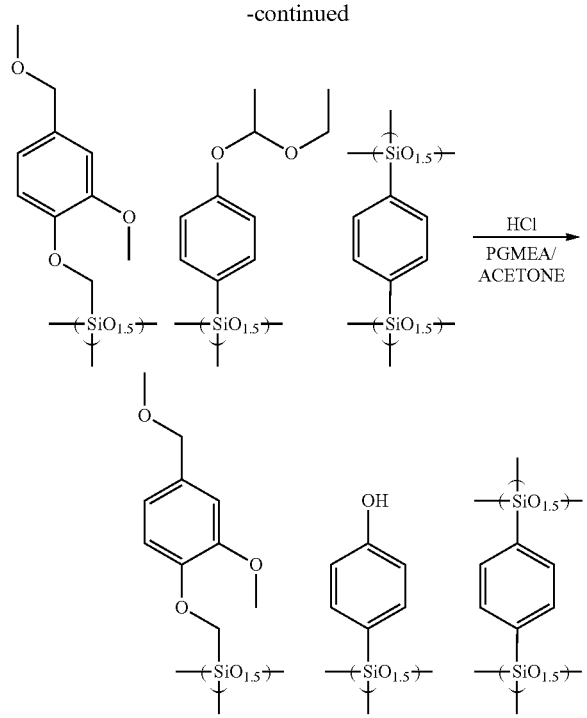

Synthesis Example 5

(Polymerization Reaction)

Into a 100-ml reaction flask, 1.63 g of a 35%-by-mass tetraethyl ammonium hydroxide solution, 9.02 g of isopropanol, and 9.02 g of tetrahydrofuran were introduced, and stirred. To the resultant mixture, 3.00 g of (2-methoxy-4-(methoxymethyl)phenoxy)methyltriethoxysilane (45 mol % of all the silanes), 2.74 g of (4-(1-ethoxyethoxy)-2,6-dimethylphenyl)trimethoxysilane (45 mol % of all the silanes), and 0.62 g of 1,4-bis(trimethoxysilyl)benzene (10 mol % of all the silanes) were added at room temperature, and the resultant solution was heated to 40° C. and allowed to react for 4 hours. The resultant solution was cooled to room temperature, and 36.66 g of ethyl acetate and 18.33 g of water were added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 41.97% by weight.

(Deprotection Reaction)

Into a 50-ml reaction flask, 8 g of the obtained polymer solution was transferred, and 3.75 g of propylene glycol monomethyl ether and 8.39 g of acetone were added thereto, and furthermore, 0.81 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 25.37% by weight and the polymer had a molecular weight of 3,700.

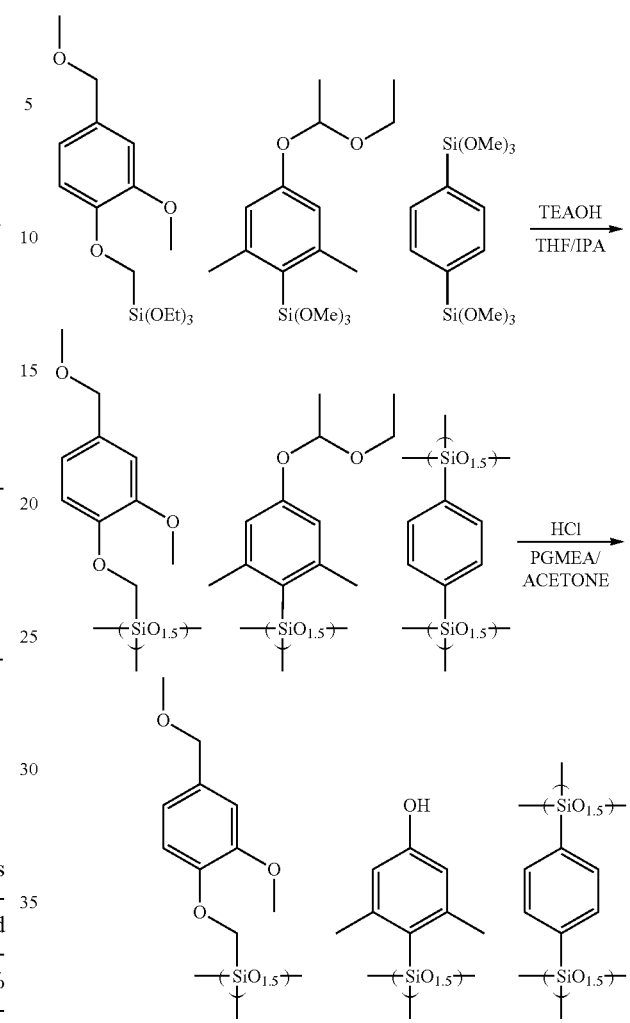

Synthesis Example 6

(Polymerization Reaction)

Into a 100-ml reaction flask, 1.63 g of a 35%-by-mass tetraethyl ammonium hydroxide solution, 8.93 g of isopropanol, and 8.93 g of tetrahydrofuran were introduced, and stirred. To the resultant solution, 3.00 g of (2-methoxy-4-(methoxymethyl)phenoxy)methyltriethoxysilane (45 mol % of all the silanes), 2.49 g of (4-(1-ethoxyethoxy)phenyl)trimethoxysilane (45 mol % of all the silanes), and 0.79 g of 1,4-bis(dimethoxy(phenyl)silyl)benzene (10 mol % of all the silanes) were added at room temperature, and the resultant solution was heated to 40° C. and allowed to react for 4 hours. The resultant solution was cooled to room temperature, and 36.66 g of ethyl acetate and 18.33 g of water were added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 54.47% by weight.

(Deprotection Reaction)

Into a 50-ml reaction flask, 5 g of the obtained polymer solution was transferred, and 4.53 g of propylene glycol monomethyl ether and 6.81 g of acetone were added thereto, and furthermore, 0.65 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 32.85% by weight and the polymer had a molecular weight of 3,300.

Synthesis Example 7

(Polymerization Reaction)

Into a 100-ml reaction flask, 2.72 g of a 35%-by-mass tetraethyl ammonium hydroxide solution, 14.17 g of isopropanol, and 14.17 g of tetrahydrofuran were introduced, and heated to 40° C. with stirring. To the resultant solution, 5.00 g of (2-methoxy-4-(methoxymethyl)phenoxy)methyltriethoxysilane (45 mol % of all the silanes), 4.16 g of (4-(1-ethoxyethoxy)phenyl)trimethoxysilane (45 mol % of all the silanes), and 0.82 g of 1-(trimethoxysilyl)-2-(dimethoxymethylsilyl)ethane (10 mol % of all the silanes) were added, and the resultant solution was allowed to react for 4 hours. The resultant solution was cooled to room temperature, and 59.87 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 30.53% by weight.

(Deprotection Reaction)

Into a 50-ml reaction flask, 15 g of the obtained polymer solution was transferred, and 1.03 g of propylene glycol monomethyl ether and 11.45 g of acetone were added thereto, and furthermore, 1.15 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 35.15% by weight and the polymer had a molecular weight of 2,800.

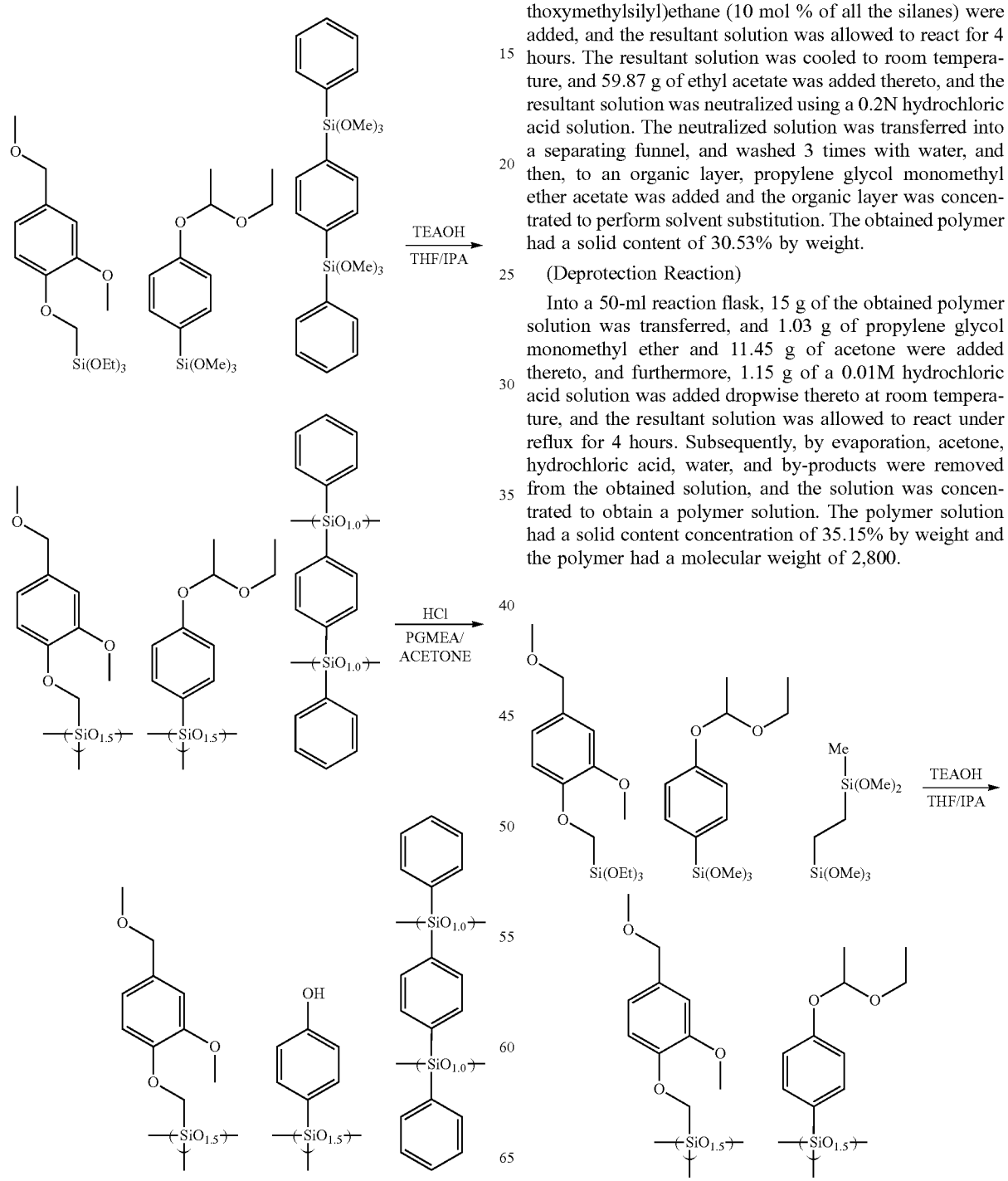

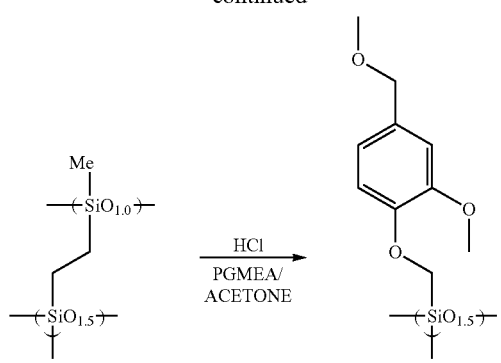

Synthesis Example 8

(Polymerization Reaction)

Into a 100-ml reaction flask, 4.90 g of a 35%-by-mass tetraethyl ammonium hydroxide solution, 21.51 g of isopropanol, and 21.51 g of tetrahydrofuran were introduced, and heated to 40° C. with stirring. To the resultant solution, 5.00 g of (2-methoxy-4-(methoxymethyl)phenoxy)methyltriethoxysilane (25 mol % of all the silanes), 4.16 g of (4-(1-ethoxyethoxy)phenyl)trimethoxysilane (25 mol % of all the silanes), 1.85 g of 1,4-bis(trimethoxysilyl)benzene (10 mol % of all the silanes), and 4.14 g of methyltriethoxysilane (40 mol % of all the silanes) were added, and the resultant solution was allowed to react for 4 hours. The resultant solution was cooled to room temperature, and 90.88 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 35.31% by weight.

(Deprotection Reaction)

Into a 50-ml reaction flask, 15 g of the obtained polymer solution was transferred, and 3.544 g of propylene glycol monomethyl ether and 13.24 g of acetone were added thereto, and furthermore, 1.82 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 35.53% by weight and the polymer had a molecular weight of 7,100.

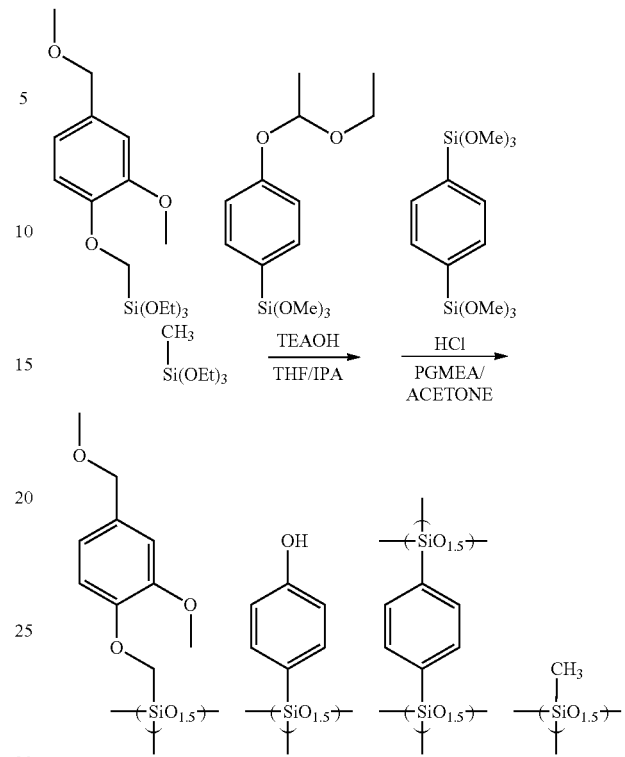

Synthesis Example 9

(Polymerization Reaction)

Into a 100-ml reaction flask, 4.90 g of a 35%-by-mass tetraethyl ammonium hydroxide solution, 26.01 g of isopropanol, and 26.01 g of tetrahydrofuran were introduced, and stirred. To the resultant solution, 10.00 g of (2-methoxy-4-(methoxymethyl)phenoxy)methyltriethoxysilane (50 mol % of all the silanes) and 8.31 g of (4-(1-ethoxyethoxy)phenyl)trimethoxysilane (50 mol % of all the silanes) were added at room temperature, and the resultant solution was heated to 40° C. and allowed to react for 4 hours. The resultant solution was cooled to room temperature, and 109.88 g of ethyl acetate and 54.94 g of water were added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 44.52% by weight.

(Deprotection Reaction)

Into a 100-ml reaction flask, 25 g of the obtained polymer solution was transferred, and 13.96 g of propylene glycol monomethyl ether and 27.83 g of acetone were added thereto, and furthermore, 2.67 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 40.45% by weight and the polymer had a molecular weight of 2,100.

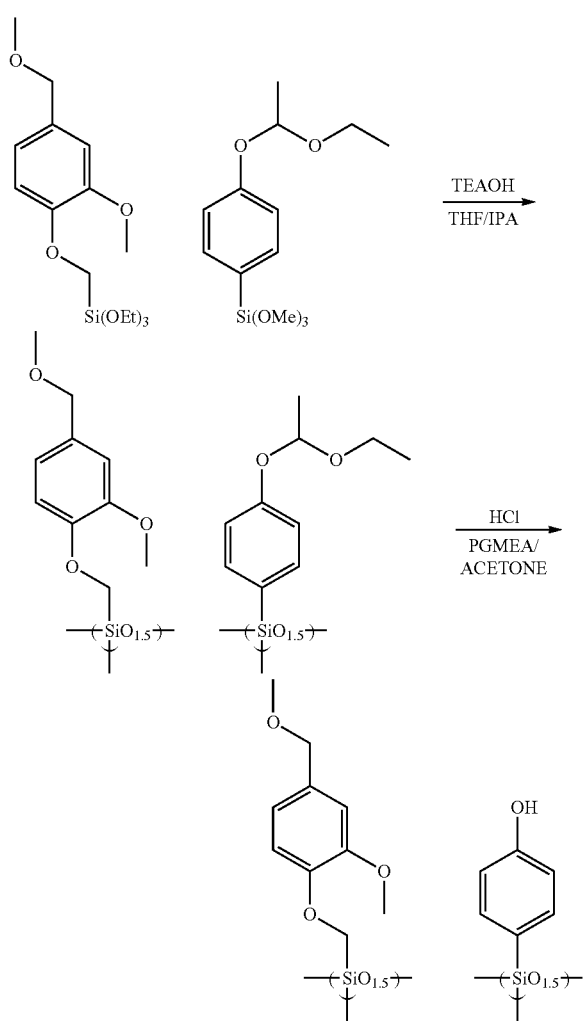

Synthesis Example 10

(Polymerization Reaction)

Into a 100-ml reaction flask, 2.94 g of a 35%-by-mass tetraethyl ammonium solution, 12.67 g of isopropanol, and 12.67 g of tetrahydrofuran were introduced, and heated to 40° C. with stirring. To the resultant solution, 3.00 g of (2-methoxy-4-(methoxymethyl)phenoxy)methyltriethoxysilane (25 mol % of all the silanes), 2.49 g of (4-(1-ethoxyethoxy)phenyl)trimethoxysilane (25 mol % of all the silanes), 0.94 g of bistrimethoxysilylethane (10 mol % of all the silanes), and 2.48 g of methyltriethoxysilane (40 mol % of all the silanes) were added, and the resultant solution was allowed to react for 4 hours. The resultant solution was cooled to room temperature, and 53.42 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 34.42% by weight.

(Deprotection Reaction)

Into a 50-ml reaction flask, 12 g of the obtained polymer solution was transferred, and 3.834 g of propylene glycol monomethyl ether acetate and 11.70 g of acetone were added thereto, and furthermore, 1.51 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 30.13% by weight and the polymer had a molecular weight of 4,000.

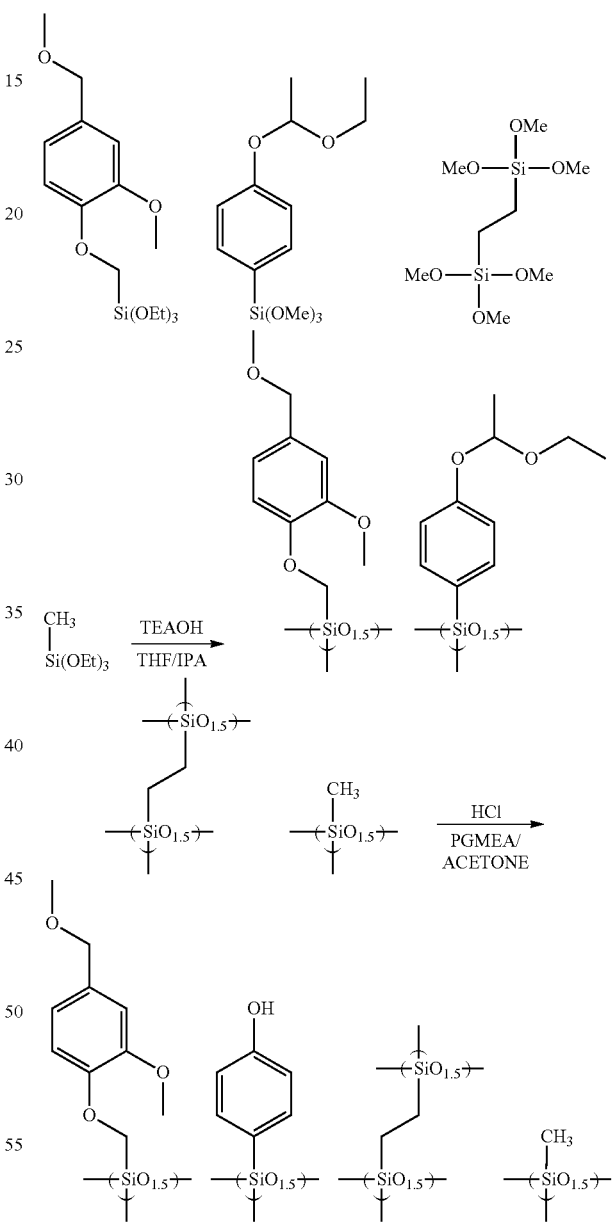

Synthesis Example 11

(Polymerization Reaction)

Into a 100-ml reaction flask, 2.94 g of a 35%-by-mass tetraethyl ammonium solution, 12.67 g of isopropanol, and 12.67 g of tetrahydrofuran were introduced, and heated to 40° C. with stirring. To the resultant solution, 3.00 g of (2-methoxy-4-(methoxymethyl)phenoxy)methyltriethoxysilane (25 mol % of all the silanes), 2.49 g of (4-(1-ethoxyethoxy)phenyl)trimethoxysilane (25 mol % of all the silanes), 0.73 g of tetraethoxysilane (10 mol % of all the silanes), and 2.48 g of methyltriethoxysilane (40 mol % of all the silanes) were added, and the resultant solution was allowed to react for 4 hours. The resultant solution was cooled to room temperature, and 52.23 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 30.72% by weight.

(Deprotection Reaction)

Into a 50-ml reaction flask, 12 g of the obtained polymer solution was transferred, and 2.134 g of propylene glycol monomethyl ether acetate and 10.44 g of acetone were added thereto, and furthermore, 1.37 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 33.63% by weight and the polymer had a molecular weight of 2,200.

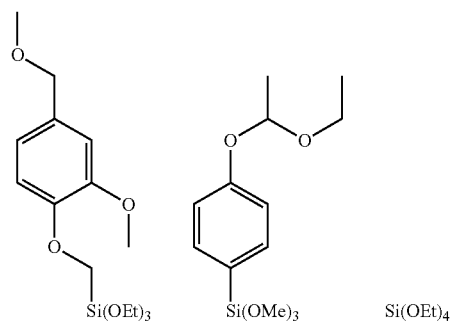

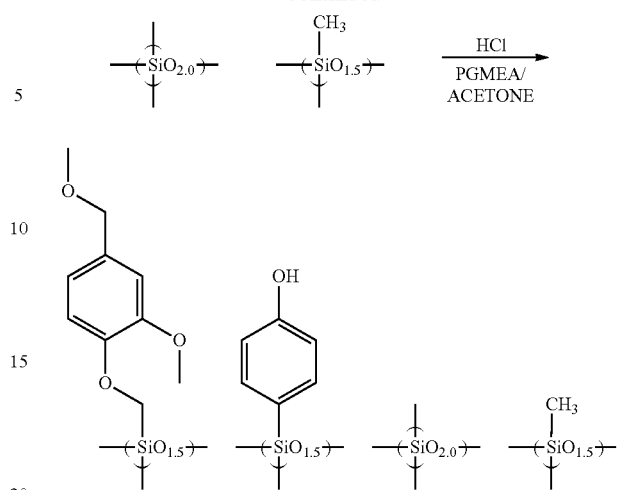

Synthesis Example 12

(Polymerization Reaction)

Into a 300-ml reaction flask, 0.98 g of a 35%-by-mass tetraethyl ammonium solution, 6.28 g of water, 23.49 g of isopropanol, and 46.98 g of methylisobutylketone were introduced, and heated to 40° C. with stirring. To the resultant solution, 10.00 g of (2-methoxy-4-(methoxymethyl)phenoxy)methyltriethoxysilane (25 mol % of all the silanes), 8.31 g of (4-(1-ethoxyethoxy)phenyl)trimethoxysilane (25 mol % of all the silanes), 7.15 g of 2-(3,4-epoxycyclohexyl)ethyltrimethoxysilane (25 mol % of all the silanes), and 5.18 g of methyltriethoxysilane (25 mol % of all the silanes) were added, and the resultant solution was allowed to react for 4 hours. To the resultant solution, 140.94 g of methylisobutylketone was added, and furthermore, 23.33 g of a 1.0M nitric acid solution was added thereto, and the resultant solution was allowed to react for 4 hours. The resultant solution was transferred into a separating funnel, and washed 3 times with water, and then, to an organic layer, propylene glycol monomethyl ether was added and the organic layer was concentrated to perform solvent substitution. The obtained polymer had a solid content of 42.24% by weight and a molecular weight of 5,800. By epoxy value titration, it was confirmed that there was no remaining-epoxy. The epoxy value was measured in accordance with JIS K-7236.

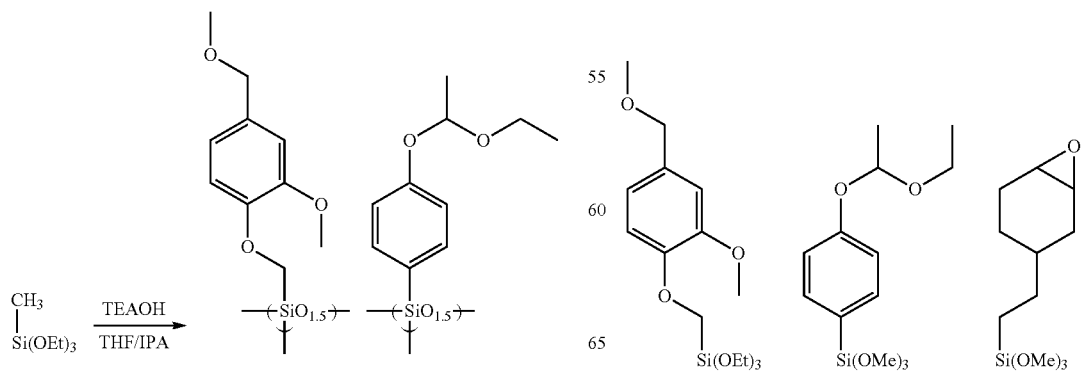

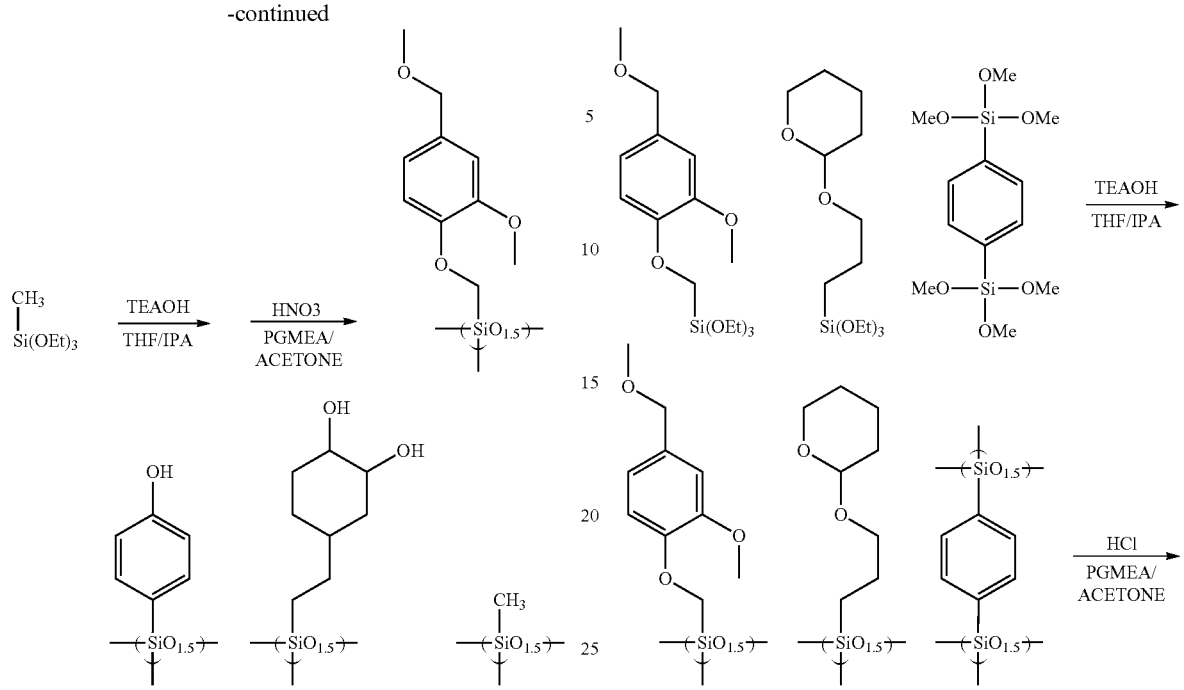

Synthesis Example 13

(Polymerization Reaction)

Into a 100-ml reaction flask, 1.63 g of a 35%-by-mass tetraethyl ammonium solution, 8.93 g of isopropanol, and 8.93 g of tetrahydrofuran were introduced, and heated to 40° C. with stirring. To the resultant solution, 3.00 g of (2-methoxy-4-(methoxymethyl)phenoxy)methyltriethoxysilane (45 mol % of all the silanes), 2.67 g of triethoxy(3-((tetrahydro-2H-pyran-2-yl)oxy)propyl)silane (45 mol % of all the silanes), and 0.62 g of 1,4-bis(trimethoxysilyl)benzene (10 mol % of all the silanes) were added, and the resultant solution was allowed to react for 4 hours. The resultant solution was cooled to room temperature, and 37.71 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 31.20% by weight.

(Deprotection Reaction)

Into a 50-ml reaction flask, 9 g of the obtained polymer solution was transferred, and 0.83 g of propylene glycol monomethyl ether acetate and 7.02 g of acetone were added thereto, and furthermore, 0.67 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 24.31% by weight and the polymer had a molecular weight of 4,700.

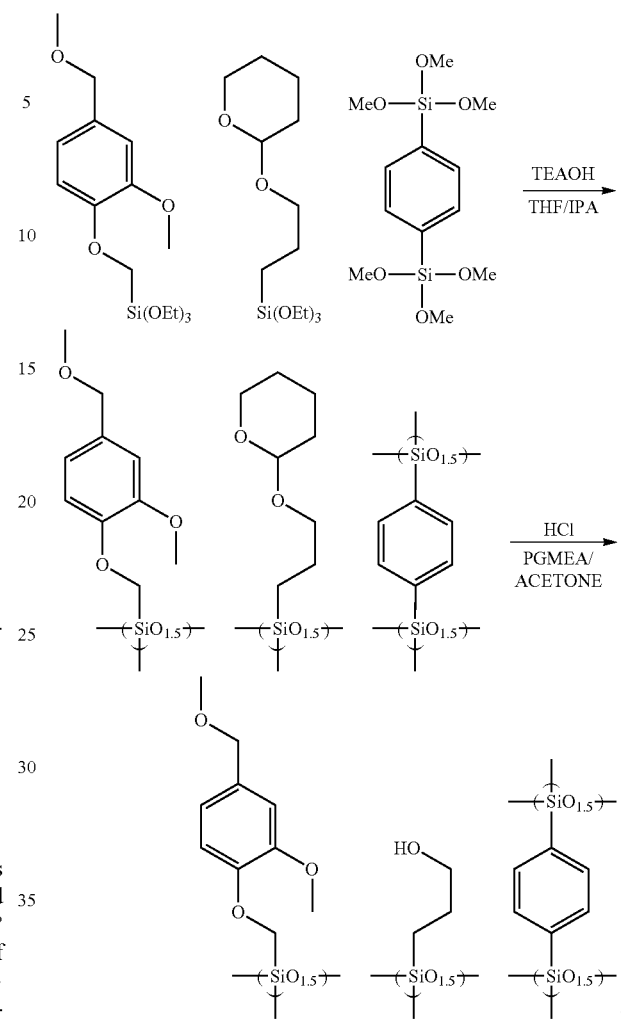

Synthesis Example 14

(Polymerization Reaction)

Into a 100-ml reaction flask, 2.94 g of a 35%-by-mass tetraethyl ammonium solution, 13.01 g of isopropanol, and 13.01 g of tetrahydrofuran were introduced, and heated to 40° C. with stirring. To the resultant solution, 3.00 g of (2-methoxy-4-(methoxymethyl)phenoxy)methyltriethoxysilane (25 mol % of all the silanes), 2.49 g of (4-(1-ethoxyethoxy)phenyl)trimethoxysilane (25 mol % of all the silanes), 1.11 g of 1,4-bis(trimethoxysilyl)benzene (10 mol % of all the silanes), 2.42 g of methyltriethoxysilane (39 mol % of all the silanes), and 0.14 g of 4-methoxy-N-(3-(triethoxysilyl)propyl)benzenesulfonamide (1 mol % of all the silanes) were added, and the resultant solution was allowed to react for 4 hours. The resultant solution was cooled to room temperature, and 54.97 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 26.60% by weight.

(Deprotection Reaction)

Into a 50-ml reaction flask, 12 g of the obtained polymer solution was transferred, and 0.24 g of propylene glycol monomethyl ether acetate and 9.04 g of acetone were added thereto, and furthermore, 1.14 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 41.03% by weight and the polymer had a molecular weight of 6,900.

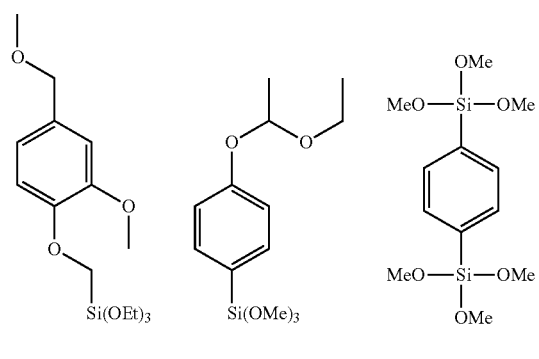

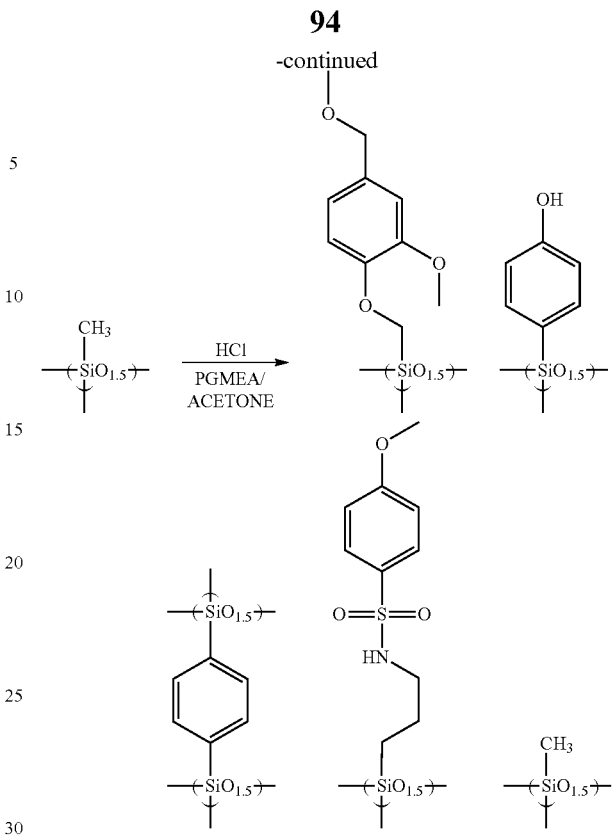

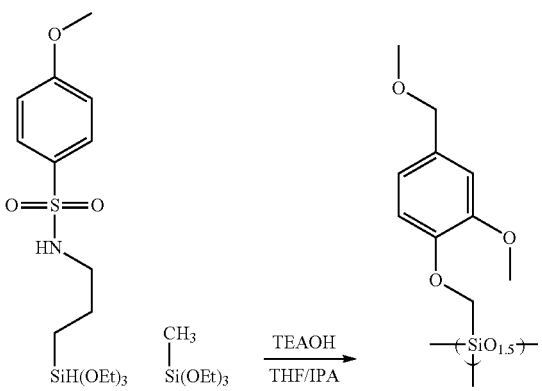

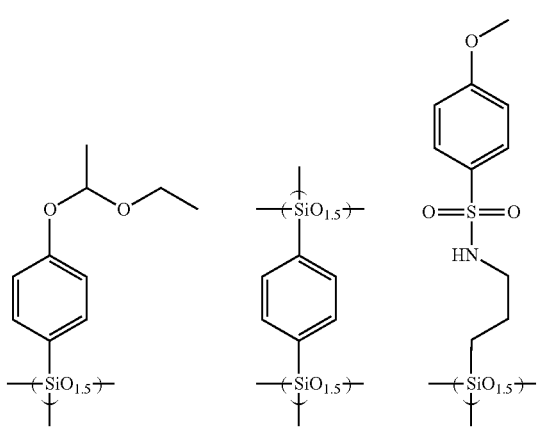

Synthesis Example 15

(Polymerization Reaction)

Into a 100-ml reaction flask, 2.94 g of a 35%-by-mass tetraethyl ammonium solution, 13.00 g of isopropanol, and 13.00 g of tetrahydrofuran were introduced, and heated to 40° C. with stirring. To the resultant solution, 3.00 g of (2-methoxy-4-(methoxymethyl)phenoxy)methyltriethoxysilane (25 mol % of all the silanes), 2.49 g of (4-(1-ethoxyethoxy)phenyl)trimethoxysilane (25 mol % of all the silanes), 1.11 g of 1,4-bis(trimethoxysilyl)benzene (10 mol % of all the silanes), 2.42 g of methyltriethoxysilane (39 mol % of all the silanes), and 0.13 g of triethoxy(3-((4-methoxyphenyl)sulfonyl)propyl)silane (1 mol % of all the silanes) were added, and the resultant solution was allowed to react for 4 hours. The resultant solution was cooled to room temperature, and 54.97 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 29.35% by weight.

(Deprotection Reaction)

Into a 50-ml reaction flask, 12 g of the obtained polymer solution was transferred, and 1.50 g of propylene glycol monomethyl ether acetate and 9.98 g of acetone were added thereto, and furthermore, 1.26 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 34.77% by weight and the polymer had a molecular weight of 6,900.

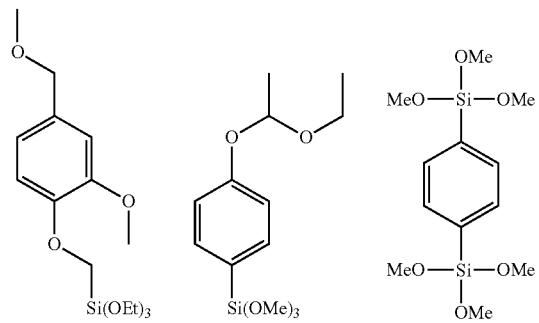

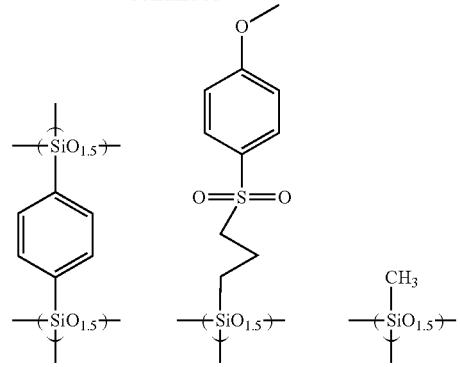

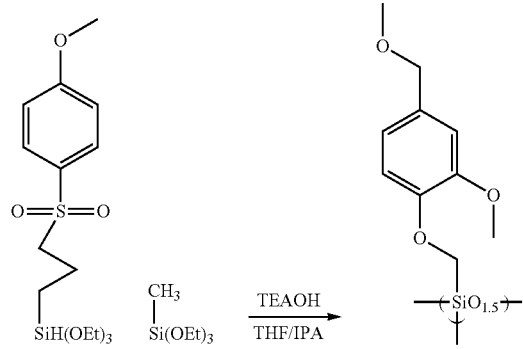

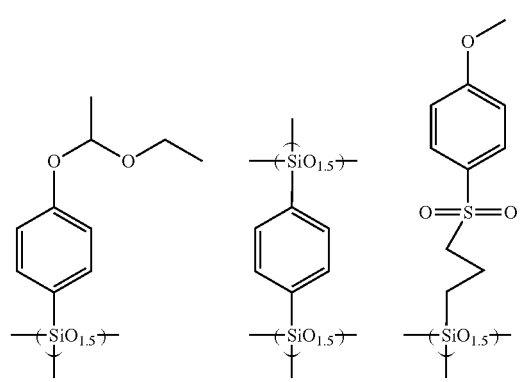

Synthesis Example 16

(Polymerization Reaction)

Into a 100-ml reaction flask, 1.03 g of a 35%-by-mass tetraethyl ammonium solution, 4.15 g of isopropanol, and 4.15 g of tetrahydrofuran were introduced, and heated to 40° C. with stirring. To the resultant solution, 1.00 g of triethoxy ((4-(ethoxymethyl)phenoxy)methyl)silane (25 mol % of all the silanes), 0.87 g of (4-(1-ethoxyethoxy)phenyl)trimethoxysilane (25 mol % of all the silanes), 0.39 g of 1,4-bis(timethoxysilyl)benzene (10 mol % of all the silanes), and 0.66 g of methyltriethoxysilane (40 mol % of all the silanes) were added, and the resultant solution was allowed to react for 4 hours. The resultant solution was cooled to room temperature, and 17.54 g of ethyl acetate was added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 24.24% by weight.

(Deprotection Reaction)

Into a 50-ml reaction flask, 5 g of the obtained polymer solution was transferred, and 3.03 g of acetone was added thereto, and furthermore, 0.47 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the solution was concentrated to obtain a polymer solution. The polymer solution had a solid content concentration of 25.98% by weight and the polymer had a molecular weight of 7,100.

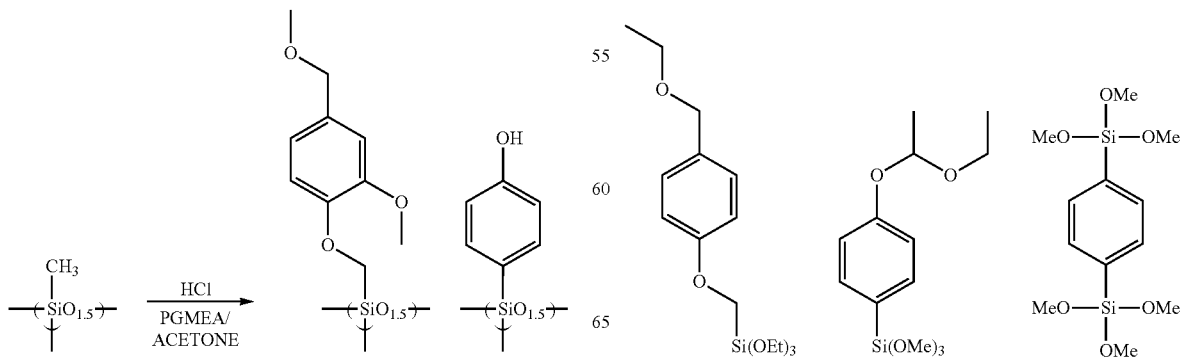

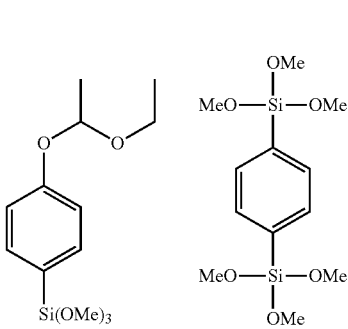

-continued

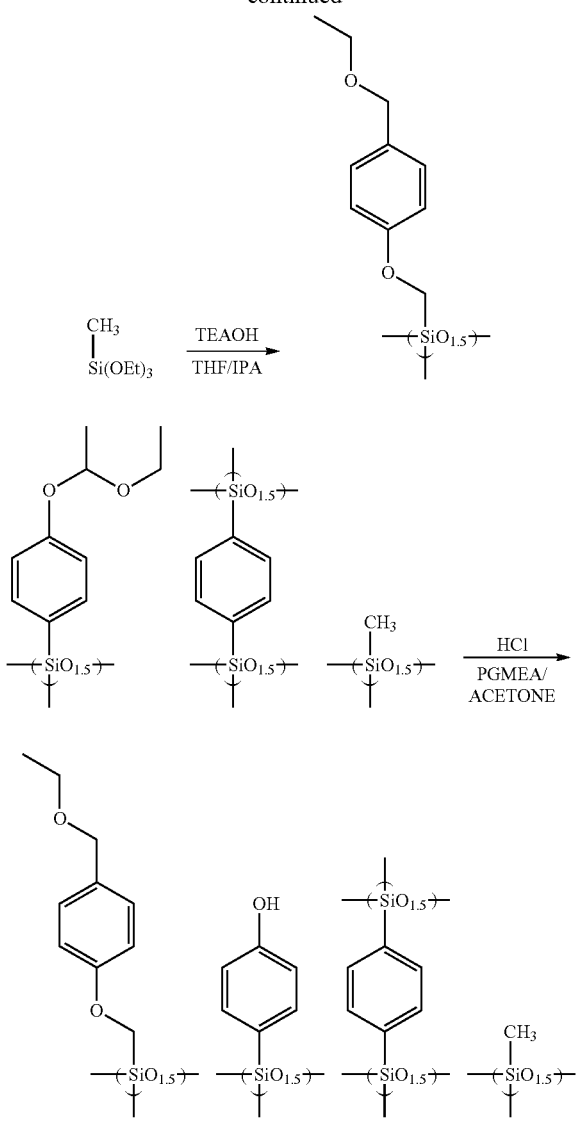

Synthesis Example 11

The same operation as in Synthesis Example 8 was conducted, except that all of the propylene glycol monomethyl ether acetate and the propylene glycol monomethyl ether in Synthesis Example 8 were changed to butyl acetate. The polymer solution had a solid content concentration of 38.69% by weight and the polymer had a molecular weight of 7,200.

Synthesis Example 18

The same operation as in Synthesis Example 8 was conducted, except that all of the propylene glycol monomethyl ether acetate and the propylene glycol monomethyl ether in Synthesis Example 8 were changed to methylisobutylcarbinol. The polymer solution had a solid content concentration of 35.69% by weight and the polymer had a molecular weight of 6,900.

Comparative Synthesis Example 1

(Polymerization Reaction)

Into a 100-ml reaction flask, 8.52 g of a 35%-by-mass tetraethyl ammonium hydroxide solution, 34.71 g of isopropanol, and 34.71 g of tetrahydrofuran were introduced, and stirred. To the resultant solution, 10.00 g of phenyltrimethoxysilane (50 mol % of all the silanes) and 14.44 g of (4-(1-ethoxyethoxy)phenyl)trimethoxysilane (50 mol % of all the silanes) were added at room temperature, and the resultant solution was heated to 40° C. and allowed to react for 4 hours. The resultant solution was cooled to room temperature, and 146.66 g of ethyl acetate and 73.33 g of water were added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 38.77% by weight.

(Deprotection Reaction)

Into a 100-ml reaction flask, 35 g of the obtained polymer solution was transferred, and 12.49 g of propylene glycol monomethyl ether and 33.92 g of acetone were added thereto, and furthermore, 4.23 g of a 0.01M hydrochloric acid solution was added dropwise thereto at room temperature, and the resultant solution was allowed to react under reflux for 4 hours. Subsequently, by evaporation, acetone, hydrochloric acid, water, and by-products were removed from the obtained solution, and the resultant solution was concentrated to obtain a polymer solution. The polymer solution had a solid content concentration of 40.80% by weight and the polymer had a molecular weight of 1,500.

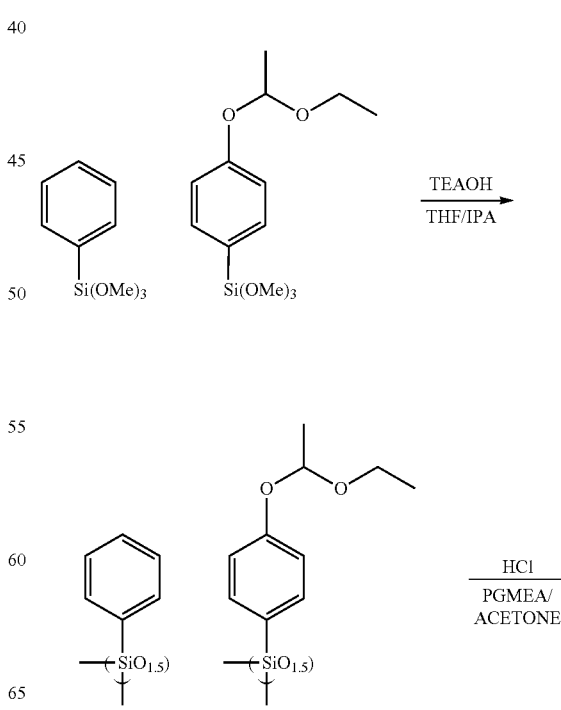

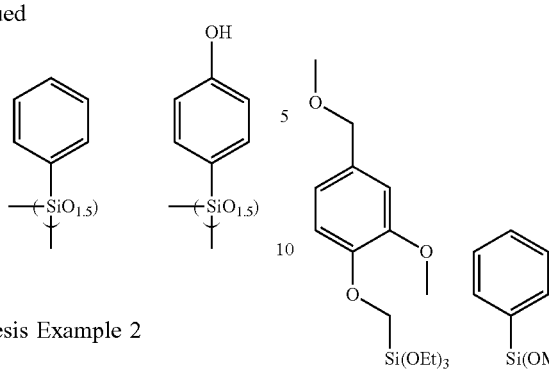

Comparative Synthesis Example 2

(Polymerization Reaction)

Into a 100-ml reaction flask, 4.26 g of a 35%-by-mass tetraethyl ammonium hydroxide solution, 19.43 g of isopropanol, and 19.43 g of tetrahydrofuran were introduced, and stirred. To the resultant solution, 10.00 g of phenyltrimethoxysilane (50 mol % of all the silanes) and 8.69 g of (2-methoxy-4-(methoxymethyl)phenoxy)methyltriethoxysilane (50 mol % of all the silanes) were added at room temperature, and the resultant solution was heated to 40° C. and allowed to react for 4 hours. The resultant solution was cooled to room temperature, and 82.12 g of ethyl acetate and 41.06 g of water were added thereto, and the resultant solution was neutralized using a 0.2N hydrochloric acid solution. The neutralized solution was transferred into a separating funnel, and washed 3 times with water, and then, to an organic layer, propylene glycol monomethyl ether acetate was added and the organic layer was concentrated to perform solvent substitution. The obtained polymer had a solid content of 41.15% by weight and a molecular weight of 1,800.

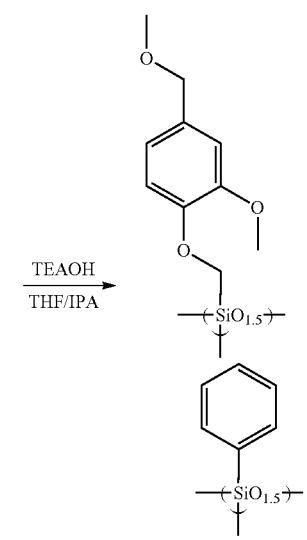

(Preparation of Radiation Sensitive Composition)

Each of the polysiloxanes obtained in Synthesis Examples 1 to 18 and Comparative Synthesis Examples 1 to 2 was mixed with a photoacid generator, a quencher, an additive, and a solvent so as to achieve a corresponding to one of ratios shown in Table 1, and each of the resultant mixtures was filtered with a 0.02-μm fluororesin filter, whereby a solution of a radiation sensitive composition was prepared. The ratio of each of the polymers in Table 1 refers not to the mass of a solution of the polymer, but to the mass of the polymer itself.

TABLE 1

|  | Polymer | Photoacid Generator | Quencher | Crosslinking Agent | Solvent | |
|---|---|---|---|---|---|---|
| Example 1 | Synthesis Example 1 | PAG-1 |  |  | PGME | PGMEA |
| (part by mass) | 6 | 0.18 |  |  | 50 | 50 |
| Example 2 | Synthesis Example 2 | PAG-1 |  |  | PGME | PGMEA |
| (part by mass) | 6 | 0.18 |  |  | 50 | 50 |
| Example 3 | Synthesis Example 3 | PAG-2 | TEA |  | PGME | PGMEA |
| (part by mass) | 6 | 0.15 | 0.011 |  | 50 | 50 |
| Example 4 | Synthesis Example 4 | PAG-2 | TEA |  | PGME | PGMEA |
| (part by mass) | 6 | 0.18 | 0.013 |  | 50 | 50 |
| Example 5 | Synthesis Example 4 | PAG-4 | TEA |  | PGME | PGMEA |
| (part by mass) | 6 | 0.17 | 0.022 |  | 50 | 50 |
| Example 6 | Synthesis Example 4 | PAG-3 | TPSMA |  | PGME | PGMEA |
| (part by mass) | 6 | 0.17 | 0.055 |  | 50 | 50 |
| Example 7 | Synthesis Example 5 | PAG-3 | TEA |  | PGME | PGMEA |
| (part by mass) | 6 | 0.17 | 0.022 |  | 50 | 50 |
| Example 8 | Synthesis Example 5 | PAG-3 | TPSNO3 |  | PGME | PGMEA |
| (part by mass) | 6 | 0.17 | 0.024 |  | 50 | 50 |
| Example 9 | Synthesis Example 6 | PAG-2 | TEA |  | PGME | PGMEA |
| (part by mass) | 6 | 0.18 | 0.013 |  | 50 | 50 |
| Example 10 | Synthesis Example 3 | PAG-2 | BTEAC |  | PGME | PGMEA |
| (part by mass) | 6 | 0.15 | 0.017 |  | 50 | 50 |
| Example 11 | Synthesis Example 5 | PAG-5 | TEA |  | PGME | PGMEA |

TABLE 1-continued

| | Polymer | Photoacid Generator | Quencher | Crosslinking Agent | Solvent | |
|---|---|---|---|---|---|---|
| (part by mass) | 6 | 0.17 | 0.011 | | 50 | 50 |
| Example 12 | Synthesis Example 7 | PAG-3 | TPSMA | | PGME | PGMEA |
| (part by mass) | 6 | 0.17 | 0.055 | | 50 | 50 |
| Example 13 | Synthesis Example 8 | PAG-3 | TPSMA | | PGME | PGMEA |
| (part by mass) | 6 | 0.17 | 0.055 | | 50 | 50 |
| Example 14 | Synthesis Example 5 | PAG-3 | TEA | TMOM-BP | PGME | PGMEA |
| (part by mass) | 6 | 0.17 | 0.022 | 0.3 | 50 | 50 |
| Example 15 | Synthesis Example 5 | PAG-3 | TEA | PWL1174 | PGME | PGMEA |
| (part by mass) | 6 | 0.17 | 0.022 | 0.3 | 50 | 50 |

TABLE 2

| | Polymer | Photoacid Generator | Quencher | Crosslinking Agent | Solvent | |
|---|---|---|---|---|---|---|
| Example 16 | Synthesis Example 10 | PAG-3 | TPSMA | | PGME | PGMEA |
| (part by mass) | 6 | 0.17 | 0.055 | | 50 | 50 |
| Example 17 | Synthesis Example 11 | PAG-3 | TPSMA | | PGME | PGMEA |
| (part by mass) | 6 | 0.17 | 0.055 | | 50 | 50 |
| Example 18 | Synthesis Example 4 | PAG-6 | TEA | | PGME | PGMEA |
| (part by mass) | 20 | 0.60 | 0.053 | | 90 | 10 |
| Example 19 | Synthesis Example 12 | PAG-7 | TEA | | PGME | PGMEA |
| (part by mass) | 20 | 0.40 | 0.057 | | 90 | 10 |
| Example 20 | Synthesis Example 17 | PAG-4 | TEA | | AcOBu | |
| (part by mass) | 6 | 0.18 | 0.019 | | 100 | |
| Example 21 | Synthesis Example 14 | PAG-3 | TPSMA | | PGME | PGMEA |
| (part by mass) | 6 | 0.17 | 0.055 | | 50 | 50 |
| Example 22 | Synthesis Example 15 | PAG-3 | TPSMA | | PGME | PGMEA |
| (part by mass) | 6 | 0.17 | 0.055 | | 50 | 50 |
| Example 23 | Synthesis Example 16 | PAG-3 | TPSMA | | PGME | PGMEA |
| (part by mass) | 6 | 0.17 | 0.055 | | 50 | 50 |
| Example 24 | Synthesis Example 18 | PAG-4 | TEA | | MIBC | |
| (part by mass) | 6 | 0.18 | 0.019 | | 100 | |
| Example 25 | Synthesis Example 13 | PAG-3 | TEA | | PGME | PGMEA |
| (part by mass) | 6 | 0.17 | 0.022 | | 50 | 50 |
| Comparative Example 1 | Comparative Synthesis Example 1 | PAG-1 | | | PGME | PGMEA |
| (part by mass) | 6 | 0.18 | | | 50 | 50 |
| Comparative Example 2 | Comparative Synthesis Example 2 | PAG-1 | | | PGME | PGMEA |
| (part by mass) | 6 | 0.18 | | | 50 | 50 |
| Comparative Example 3 | Comparative Synthesis Example 1 | PAG-1 | | TMOM-BP | PGME | PGMEA |
| (part by mass) | 6 | 0.18 | | 6 | 50 | 50 |

Abbreviations in Table 1 and Table 2 mean as follows.

PAG-1: diphenyl(4-(phenylthio)phenyl)sulfonium hexafluorophosphate

PAG-2: triphenylsulfonium 3-hydroxypropane-1-sulfonate

PAG-3: triphenylsulfonium 1,1,2-trifluoro-4-hydroxybutane-1-sulfonate

PAG-4: triphenylsulfonium perfluorobutanesulfonate

PAG-5: triphenylsulfonium 4-(2-hydroxyethyl))benzenesulfonate

PAG-6: a compound of the following formula

PAG-6

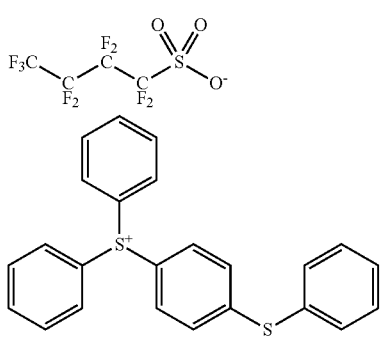

PAG-7: a compound of the following formula

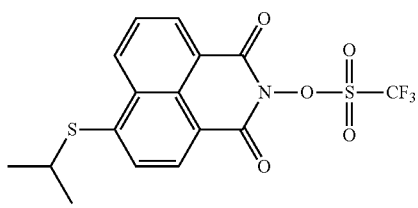

PAG-7

TEA: triethanolamine
TPSMA: triphenylsulfonium maleate
TPSNO3: triphenylsulfonium nitrate
BTEAC: benzyl triethyl ammonium chloride
Trade name TMOM-BP: (manufactured by Honshu Chemical Industry Co., Ltd., 3,3',5,5'-tetramethoxymethyl-4,4'-dihydroxybiphenyl) Formula (4-22)

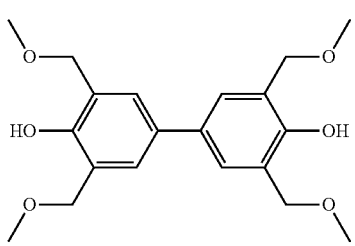

Formula (4-22)

TMOM-BP

Trade name PWL1174: tetramethoxymethylglycoluril

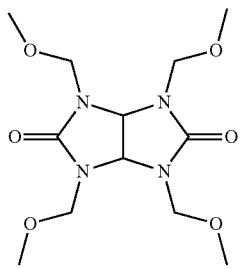

PWL1174

PGME: propylene glycol monomethyl ether
PGMEA: propylene glycol monomethyl ether acetate
AcOBu: butyl acetate
MIBC: methyl isobutyl carbinol (Preparation of Organic Underlayer Film-1-Forming Composition)

In 302.0 g of propylene glycol monomethyl ether, 40.0 g of a compound of Formula (6-1) (trade name: EHPE3150, manufactured by Daicel Chemical Industries, Ltd.), 20.3 g of 9-anthracene carboxylic acid, and 13.7 g of benzoic acid were dissolved, and subsequently, 1.5 g of benzyltriethylammonium was added thereto, and the resultant solution was allowed to react under reflux for 24 hours. The solution resulting from the reaction was purified by ion exchange to obtain a solution of a high molecular compound of Formula (6-2). A GPC analysis of the obtained high molecular compound showed that the compound had a weight-average molecular weight Mw of 4,100 in terms of standard polystyrene. To obtain a solution, 5 g of the obtained high polymer solution (the polymer had a solid content of 16% by mass) was mixed with 0.2 g of tetramethoxymethylglycoluril, 0.03 g of pyridinium p-toluenesulfonate, 0.0008 g of a fluorine-based surfactant MEGAFAC R-30N (trade name, manufactured by DIC Corporation), 6.4 g of propylene glycol monomethyl ether, and 4.5 g of propylene glycol monomethyl ether acetate. The resultant solution was then filtered with a polyethylene microfilter having a pore size of 0.10 μm, and further filtered with a polyethylene microfilter having a pore size of 0.05 μm to prepare a solution of an organic underlayer film-1-forming composition to be used for a lithography process using a multilayer film.

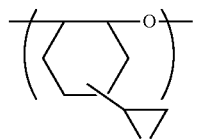

(Formula 6-1)

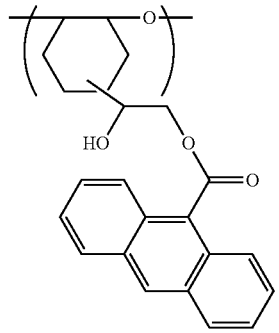

(Formula 6-2)

(Preparation of Organic Underlayer Film-2-Forming Composition)

First, 51.76 g of trade name KAYAHARD GPH-103 (biphenyl aralkyl type phenol resin, manufactured by Nippon Kayaku Co., Ltd.) was mixed with 8.02 g of tetramethoxymethylglycoluril (trade name: POWDERLINK [registered trademark] 1174, manufactured by Nihon Cytec Industries Inc.), 0.16 g of a thermal acid generator TAG-2689 (trade name, manufactured by King Industries, Inc., U.S., containing a quarternary ammonium salt of trifluoromethanesulfonic acid as a component) as a catalyst, and 0.052 g of MEGAFAC [registered trademark] R-40 (manufactured by DIC Corporation) as a surfactant. The resultant mixture was dissolved in 54.00 g of propylene glycol monomethyl ether acetate and 126.0 g of propylene glycol monomethyl ether to obtain a solution. The resultant solution was then filtered with a polyethylene microfilter having a pore size of 0.10 μm, and further filtered with a polyethylene microfilter having a pore size of 0.05 μm to prepare a solution of an organic underlayer film-2-forming composition.

(Measurements of Dry Etching Rate)

For measurements of dry etching rate, the following etcher and etching gas were used.

RIE-10NR (manufactured by SAMCO INC.): $O_2$

Each of the solutions of the radiation sensitive compositions prepared in Examples 1 to 17, 20 to 24 and Comparative Examples 1 to 3 was applied onto a silicon wafer using a spinner. The composition on the wafer was heated on a hot plate at 110° C. for 1 minute to form a radiation sensitive resin film having a film thickness of 0.12 μm. Furthermore, likewise, a coating of an organic underlayer film was formed on a silicon wafer using a spinner (with heating at 240° C. for 1 minute to achieve a film thickness of 0.30 μm).

Using $O_2$ gas as an etching gas, the dry etching rates of the films were measured, and comparisons among the dry etching rates of the radiation sensitive resin films of Examples 1 to 17 and Comparative Examples 1 to 3 and the organic underlayer film were made. Etching selectivity ratio was determined by dividing the dry etching rate of the radiation sensitive resin film by the dry etching rate of the organic underlayer film.

[Developability Evaluation]

Each of the radiation sensitive compositions prepared in Examples 1 to 17, 20 to 24 and Comparative Examples 1 to 3 was applied onto a silicon wafer using a spinner. The composition on the wafer was then heated on a hot plate at 110° C. for 1 minute to form a radiation sensitive resin film (having a film thickness of 0.12 μm). Next, using NSR-S205C, a lens scanning-type stepper manufactured by NIKON CORPORATION (with a wavelength of 248 nm, NA: 0.75, σ: 0.85 (CONVENTIONAL)), the radiation sensitive resin film was exposed to light through an open mask of 1-cm square, with varying the amount of exposure from 0 mJ to 100 mJ. Subsequently, the resulting film was "post-exposure baked" on a hot plate at a predetermined temperature, 110° C., for 1 minute. After being cooled, the film was developed using a 2.38% tetramethylammonium hydroxide solution as a developing solution. A case in which, owing to an increase in the amount of exposure, a curing reaction proceeded to form a film was evaluated as ○. A case in which a curing reaction did not proceed or a film remained at 0 mJ was evaluated as χ.

[Lithography Evaluation (Optimum Exposure Amount, Shape Evaluation)]

The organic underlayer film-1-forming composition was applied onto a silicon wafer, and baked on a hot plate at 240° C. for 60 seconds to obtain an organic underlayer film 1 having a film thickness of 215 nm. Onto the organic underlayer film 1, each of the radiation sensitive compositions prepared in Examples 1 to 17, 20 to 24 and Comparative Examples 1 to 3 was applied using a spinner. Subsequently, the composition on the organic underlayer film was baked on a hot plate at a predetermined temperature for 1 minute to form a radiation sensitive resin film (having a film thickness of 0.12 μm). Next, using NSR-S205C, a lens scanning-type stepper manufactured by NIKON CORPORATION (with a wavelength of 248 nm, NA: 0.75, σ: 0.85 (CONVENTIONAL)), the resulting film was exposed to light through a mask set so as to achieve a line width and a line spacing of 0.16 μm. Subsequently, the resulting film was "post-exposure baked" on a hot plate at a predetermined temperature for 1 minute. After being cooled, the resultant film was developed using a 2.38% tetramethylammonium hydroxide solution as a developing solution. The amount of exposure required for achieving a line width of 0.16 μm and a line-to-space ratio of 1:1 was taken as an optimum exposure amount. Here, for the measurements of line width, a scanning electron microscope ("CG-4100", manufactured by Hitachi High-Technologies Corporation) was used. Furthermore, for the sectional shape of a pattern, observations of the sectional shape of the formed line-and-space pattern having a line width of 160 nm were conducted. For the observation of the sectional shape, "S-4800", manufactured by Hitachi High-Technologies Corporation was used.

In Table 3, S. B stands for film formation temperature, and PEB stands for post-exposure bake temperature (the same applies to Table 4 to Table 6). Furthermore, as for the shapes illustrated in the sectional views of resist patterns in FIG. 1, the shape of a) is expressed in the term "undercut"; the shape of b) is expressed in the term "straight";

and the shape of c) is expressed in the term "tapered". Furthermore, the term "not cured" represents a state in which, after exposure and development, a film is not formed, and a pattern is not obtained, accordingly; and the term "not dissolved" represents a state in which a film is not dissolved in a developing solution, remains even at 0 mJ, and is not photosensitive, and accordingly, a pattern is not obtained.

TABLE 3

|  | S.B/PEB | Developability Evaluation | Optimum Exposure Amount | Shape | Etching Selectivity Ratio |
|---|---|---|---|---|---|
| Example 1 | 110° C./110° C. | ○ | 25 mJ | straight | 0.06 |
| Example 2 | 110° C./110° C. | ○ | 17 mJ | tapered | 0.06 |
| Example 3 | 110° C./110° C. | ○ | 21 mJ | straight | 0.06 |
| Example 4 | 110° C./110° C. | ○ | 24 mJ | straight | 0.05 |
| Example 5 | 80° C./80° C. | ○ | 22 mJ | straight | 0.05 |
| Example 6 | 80° C./80° C. | ○ | 22 mJ | straight | 0.05 |
| Example 7 | 80° C./80° C. | ○ | 29 mJ | straight | 0.05 |
| Example 8 | 80° C./80° C. | ○ | 20 mJ | straight | 0.05 |
| Example 9 | 110° C./110° C. | ○ | 18 mJ | straight | 0.06 |

TABLE 3-continued

|  | S.B/PEB | Developability Evaluation | Optimum Exposure Amount | Shape | Etching Selectivity Ratio |
|---|---|---|---|---|---|
| Example 10 | 110° C./110° C. | ○ | 21 mJ | straight | 0.06 |
| Example 11 | 110° C./110° C. | ○ | 11 mJ | straight | 0.05 |
| Example 12 | 80° C./80° C. | ○ | 25 mJ | straight | 0.05 |
| Example 13 | 80° C./80° C. | ○ | 30 mJ | straight | 0.04 |
| Example 14 | 80° C./80° C. | ○ | 28 mJ | straight | 0.06 |
| Example 15 | 80° C./80° C. | ○ | 29 mJ | straight | 0.06 |
| Example 16 | 80° C./80° C. | ○ | 40 mJ | straight | 0.03 |
| Example 17 | 80° C./80° C. | ○ | 60 mJ | straight | 0.04 |
| Example 20 | 80° C./80° C. | ○ | 44 mJ | straight | 0.03 |
| Example 21 | 80° C./80° C. | ○ | 33 mJ | straight | 0.03 |
| Example 22 | 80° C./80° C. | ○ | 33 mJ | straight | 0.03 |
| Example 23 | 80° C./80° C. | ○ | 64 mJ | straight | 0.03 |
| Example 24 | 80° C./80° C. | ○ | 46 mJ | straight | 0.03 |
| Comparative Example 1 | 110° C./110° C. | ○ | — | not cured | 0.04 |
| Comparative Example 2 | 110° C./110° C. | X | — | not dissolved | 0.05 |
| Comparative Example 3 | 110° C./110° C. | ○ | — | not cured | — |
| Organic Underlayer Film 1 | 240° C. | X | — | — | 1.00 |

[Evaluation of Lithography for Solvent Development Process]

The organic underlayer film-1-forming composition was applied onto a silicon wafer, and baked on a hot plate at 240° C. for 60 seconds to obtain an organic underlayer film 1 having a film thickness of 215 nm. Onto the organic underlayer film 1, each of the radiation sensitive compositions prepared in Examples 20 and 24 was applied using a spinner. Subsequently, the composition of the film was baked on a hot plate at 80° C. for 1 minute to form a radiation sensitive resin film (having a film thickness of 0.12 μm). Next, using NSR-S205C, a lens scanning-type stepper manufactured by NIKON CORPORATION (with a wavelength of 248 nm, NA: 0.75, σ: 0.85 (CONVENTIONAL)), the film was exposed to light through a mask set so as to achieve a line width and a line spacing of 0.18 μm. Subsequently, the resultant film was "post-exposure baked" on a hot plate at 80° C. for 1 minute. After being cooled, the film was developed using butyl acetate as a developing solution. The amount of exposure required for achieving a line width of 0.18 μm and a line-to-space ratio of 1:1 was taken as an optimum exposure amount. Here, for the measurements of line width, a scanning electron microscope ("CG-4100", manufactured by Hitachi High-Technologies Corporation) was used. Furtheremore, for the sectional shape of a pattern, observations of the sectional shape of the formed line-and-space pattern having a line width of 180 nm were conducted. For the observation of the sectional shape, "S-4800", manufactured by Hitachi High-Technologies Corporation was used.

TABLE 4

|  | S.B/PEB | Optimum Exposure Amount | Shape |
|---|---|---|---|
| Example 20 | 80° C./80° C. | 23 mJ | straight |
| Example 24 | 80° C./80° C. | 24 mJ | slight footing |

[Lithography Evaluation using i-Line Aligner]

Figure 2:
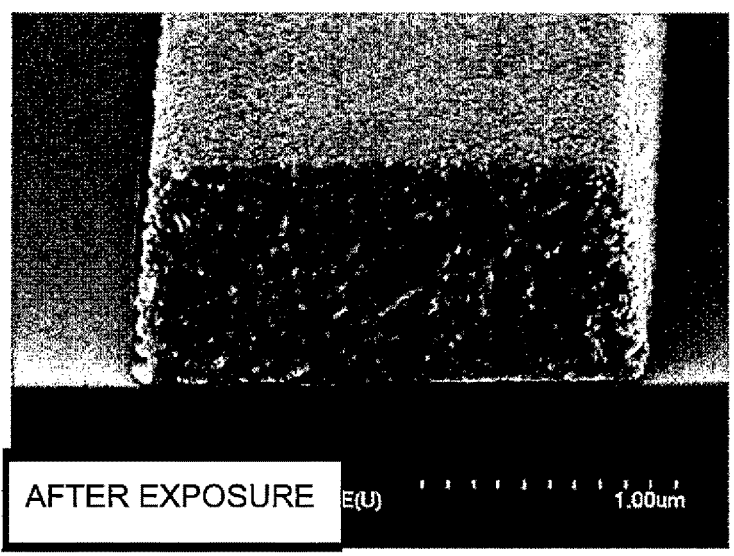
FIG. 2 illustrates a sectional shape of a resist pattern formed in Example 18 observed using a scanning electron microscope.

To a silicon wafer, 1,1,1,3,3,3-hexamethyldisilazane treatment was given at 90° C. for 60 seconds, and the radiation sensitive composition prepared in Example 18 was applied onto the wafer using a spinner. Subsequently, the composition on the wafer was baked on a hot plate at 80° C. for 1 minute to form a radiation sensitive resin film (having a film thickness of 1.0 μm). Next, the film was exposed using a mask aligner, 8-inch automatic exposure apparatus AE810e, manufactured by NANOTEC CORPORATION and equipped with a multi-lamp, USH-250BY, manufactured by USHIO INC. The exposure was performed through a mask set so as to achieve a line width and a line spacing of 2.0 μm. Subsequently, the resultant film was "post-exposure baked" on a hot plate at 80° C. for 1 minute. After being cooled, the film was developed using a 2.38% tetramethylammonium hydroxide solution as a developing solution. The amount of exposure required for achieving a line width of 2.0 μm and a line-to-space ratio of 1:1 was taken as an optimum exposure amount. Here, for the measurements of line width, a scanning electron microscope ("CG-4100", manufactured by Hitachi High-Technologies Corporation) was used. Furtheremore, for the sectional shape of a pattern, observations of the sectional shape of the formed line-and-space pattern having a line width of 2.0 μm were conducted (FIG. 2). For the observation of the sectional shape, "S-4800", manufactured by Hitachi High-Technologies Corporation was used.

[Evaluation of Heat-resistance of Pattern]

Figure 3:
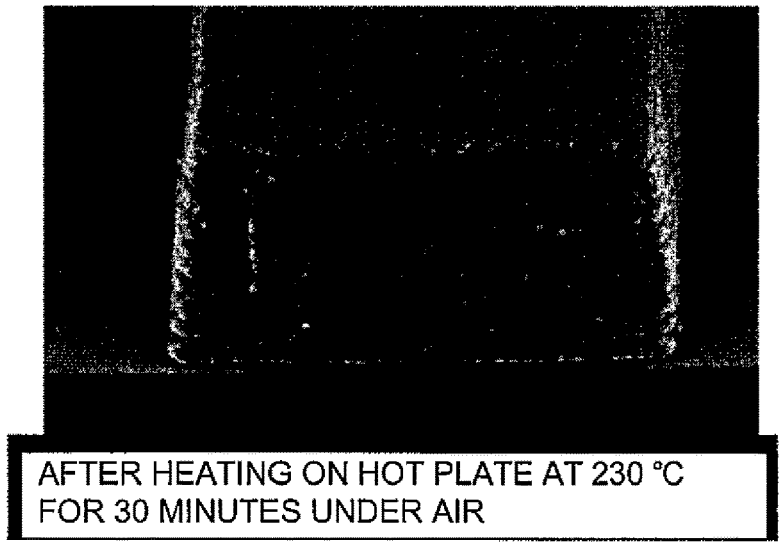
FIG. 3 illustrates a sectional shape of the resist pattern formed in Example 18 observed using a scanning electron microscope after heated on a hot plate at 230° C. for 30 minutes.

The patterned film obtained using an i-line aligner was heated on a hot plate at 230° C. for 30 minutes under air, and the line width and shape of the pattern were observed (FIG. 3). For the observation, "S-4800", manufactured by Hitachi High-Technologies Corporation was used. As a result of the measurements, a case in which the shrinkages of pattern line width and film thickness were each 5% or less was evaluated as good.

TABLE 5

|  | S.B/PEB | Optimum Exposure Amount | Shape | Heat-resistance of Pattern |
|---|---|---|---|---|
| Example 18 | 80° C./80° C. | 360 mJ | straight | good |

[Lithography Evaluation using i-Line Stepper]

The organic underlayer film-2-forming composition was applied onto a silicon wafer, and baked on a hot plate at 240° C. for 1 minute to form an organic underlayer film 2 having a film thickness of 2 μm. Onto the organic underlayer film 2, the radiation sensitive composition prepared in Example 19 was applied using a spinner. Subsequently, the composition on the film was baked on a hot plate at 80° C. for 1 minute to form a radiation sensitive resin film (having a film thickness of 1.0 μm). Next, using NSR-2205i12D (i-line stepper), manufactured by NIKON CORPORATION, the film was exposed to light through a mask set so as to achieve a line width and a line spacing of 0.30 μm. The exposure was carried out through a mask set so as to achieve a line width and a line spacing of 0.3 μm. Subsequently, the resultant film was "post-exposure baked" on a hot plate at 80° C. for 1 minute. After being cooled, the film was developed using a 2.38% tetramethylammonium hydroxide solution as a developing solution. The amount of exposure required for achieving a line width of 0.3 μm and a line-to-space ratio of 1:1 was taken as an optimum exposure amount. Here, for the measurements of line width, a scanning electron microscope ("CG-4100", manufactured by Hitachi High-Technologies Corporation) was used. Furtheremore, for the sectional shape of a pattern, observations of the sectional shape of the formed line-and-space pattern having a line width of 0.3 μm were conducted. For the observation of the sectional shape, "S-4800", manufactured by Hitachi High-Technologies Corporation was used.

TABLE 6

| | S.B/PEB | Optimum Exposure Amount | Shape |
|---|---|---|---|
| Example 19 | 80° C./80° C. | 180 mJ | straight |

(Measurements of Exposure Sensitivity)

When the electron density of the aromatic ring of phenol is high, curing reactivity is high, and the reactivity becomes higher depending on the relationship of a substitution position between Si and phenol and the substitution of an electron donating group. For example, to each polysiloxane of Synthesis Examples 1, 2, and 3 and Synthesis Example 9, 3% by mass of a photoacid generator (PAG-1) was added with respect to the solid, and the mixture was diluted with a solvent having a composition of propylene glycol monomethyl ether to propylene glycol monomethyl ether acetate of 1:1 to obtain 6% by mass of a composition. The resultant composition is applied onto an organic underlayer film, and the developability of the composition is evaluated, in which a comparison of exposure amounts at the time when curing starts is made. The comparison result is as follows.

TABLE 7

| | Composition prepared from Synthesis Example 1 | Composition prepared from Synthesis Example 2 | Composition prepared from Synthesis Example 3 | Composition prepared from Synthesis Example 9 |
|---|---|---|---|---|
| Exposure Amount at the time when curing starts | 1 mJ | 6 mJ | 3 mJ | 12 mJ |

It is revealed that polysiloxanes having unit structures having phenolic hydroxy groups derived from Formula (5-1), Formula (5-2), and Formula (5-3), respectively, are cured at smaller amounts of exposure.

In the present invention, a phenoplast crosslinking reactive unit of Formula (1) reacts also with a phenolic compound of Formula (1-2) and an aliphatic alcohol of Formula (2-2). The composition of Example 25 was subjected to "measurements of exposure sensitivity", and as a result, the composition was cured at 8 mJ. That is, as a crosslinking partner, more preferable is a combination with a unit having a hydroxy group, irrespective of whether the unit is aromatic or aliphatic.

INDUSTRIAL APPLICABILITY

The radiation sensitive composition including a siloxane polymer exhibiting phenoplast crosslinking reactivity as a base resin is excellent in resolution and can be used as a radiation sensitive composition capable of allowing a pattern having a desired-shape to be formed with sufficient precision.

The invention claimed is:

1. A radiation sensitive composition comprising:
as a silane, a hydrolysis-condensation product of a hydrolyzable silane; and
a photoacid generator,
in which the hydrolyzable silane includes hydrolyzable silanes of Formula (1) and Formula (2), $$R^1_a R^2_b Si(R^3)_{4-(a+b)} \quad \text{Formula (1)}$$

wherein $R^1$ is an organic group of Formula (1-2):

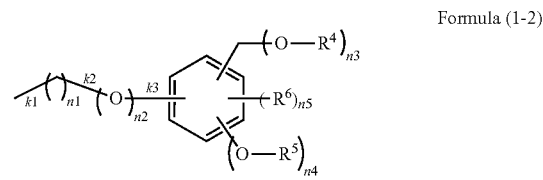

Formula (1-2)

wherein $R^4$ is a hydrogen atom, a $C_{1-10}$ alkyl group, or an acyl group; $R^5$ is a hydrogen atom, a $C_{1-10}$ alkyl group, or a $C_{1-10}$ alkyl group having a $C_{1-10}$ alkoxy group; $R^6$ is a $C_{1-10}$ alkyl group; n1 is an integer of 0 to 10; n2 is an integer of 0 or 1; n3 is an integer satisfying 1≤n3≤5; n4 is an integer satisfying 0≤n4≤4; n5 is an integer satisfying 0≤n5≤4; n3+n4+n5 is an integer satisfying 1≤n3+n4+n5≤5; k1 is an end bonded to a silicon atom when n1 is an integer of 1 to 10; k2 is an end bonded to a silicon atom when n1 is 0 and n2 is 1; and k3 is an end bonded to a silicon atom when n1 and n2 are each 0, and is bonded to a silicon atom through a Si—C bond or a Si—O bond; $R^2$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, an amino group, or a cyano group, or a combination of these groups, and is bonded to a silicon atom through a Si—C bond; $R^3$ is an alkoxy group, an acyloxy group, or a halogen group; a is an integer of 1; b is an integer of 0 to 2; and a+b is an integer of 1 to 3,

  Formula (2)

wherein $R^7$ is an organic group of Formula (2-1) or Formula (2-2):

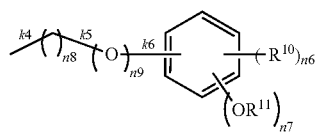  Formula (2-1)

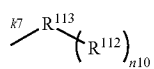  Formula (2-2)

in Formula (2-1), $R^{10}$ is a $C_{1\text{-}10}$ alkyl group; $R^{11}$ is a hydrogen atom, a $C_{1\text{-}10}$ alkyl group, or a $C_{1\text{-}10}$ alkyl group having a $C_{1\text{-}10}$ alkoxy group; n6 is an integer satisfying $0 \leq n6 \leq 3$; n7 is an integer satisfying $1 \leq n7 \leq 3$; n6+n7 is an integer satisfying $1 \leq n6+n7 \leq 4$; n8 is an integer satisfying $0 \leq n8 \leq 10$; n9 is an integer of 0 or 1; k4 is an end bonded to a silicon atom when n8 is an integer of 1 to 10; k5 is an end bonded to a silicon atom when n8 is 0 and n9 is 1; and k6 is an end bonded to a silicon atom when n8 and n9 are each 0, and in Formula (2-2), $R^{112}$ is a hydroxy group, a halogen atom, an epoxy group, an oxetane group, an acyloxy group, a (meth)acryloyl group, a silyl group, a $C_{1\text{-}10}$ alkoxy group, a $C_{1\text{-}10}$ alkoxy group having a $C_{1\text{-}10}$ alkoxy group, or a combination of these groups; $R^{113}$ is a $C_{1\text{-}10}$ alkylene group or a $C_{6\text{-}40}$ arylene group, optionally containing an oxygen atom; n10 is an integer of 1 to 4; and k7 is an end bonded to a silicon atom, and is bonded to a silicon atom through a Si—C bond; $R^8$ is an alkyl group, an aryl group, a halogenated alkyl group, a halogenated aryl group, an alkoxy aryl group, an alkenyl group, or an organic group having an epoxy group, an acryloyl group, a methacryloyl group, a mercapto group, an amino group, or a cyano group, or a combination of these groups, and is bonded to a silicon atom through a Si—C bond; $R^9$ is an alkoxy group, an acyloxy group, or a halogen group; c is an integer of 1; d is an integer of 0 to 2; and c+d is an integer of 1 to 3.

2. The radiation sensitive composition according to claim 1, wherein the hydrolyzable silane is a combination of the hydrolyzable silane of Formula (1), the hydrolyzable silane of Formula (2), and other hydrolyzable silane, and the other hydrolyzable silane is at least one hydrolyzable silane selected from the group consisting of a hydrolyzable silane of Formula (3):

  Formula (3)

wherein $R^{12}$ is an alkyl group, an aryl group, a halogenated alkyl group, a halogenated aryl group, an alkenyl group, or an organic group having a mercapto group, a sulfonamide group, or a cyano group, or a combination of these groups, and is bonded to a silicon atom through a Si—C bond; $R^{13}$ is an alkoxy group, an acyloxy group, or a halogen group; and e is an integer of 0 to 3, and a hydrolyzable silane of Formula (4):

  Formula (4)

wherein $R^{14}$ is an alkyl group or an aryl group, and is bonded to a silicon atom through a Si—C bond; $R^{15}$ is an alkoxy group, an acyloxy group, or a halogen group; Y is an alkylene group, an alkenylene group, or an arylene group; f is an integer of 0 or 1: and g is an integer of 0 or 1.

3. A radiation sensitive composition comprising, as a polymer, a hydrolysis-condensation product of a hydrolyzable silane comprising a combination of the hydrolyzable silane of Formula (1) and the hydrolyzable silane of Formula (2) as claimed in claim 1 and the hydrolyzable silane of Formula (3):

  Formula (3)

wherein $R^{12}$ is an alkyl group, an aryl group, a halogenated alkyl group, a halogenated aryl group, an alkenyl group, or an organic group having a mercapto group, a sulfonamide group, or a cyano group, or a combination of these groups, and is bonded to a silicon atom through a Si—C bond; $R^{13}$ is an alkoxy group, an acyloxy group, or a halogen group; and e is an integer of 0 to 3.

4. A radiation sensitive composition comprising, as a polymer, a hydrolysis-condensation product of a hydrolyzable silane comprising a combination of the hydrolyzable silane of Formula (1) and the hydrolyzable silane of Formula (2) as claimed in claim 1 and the hydrolyzable silane of Formula (4):

  Formula (4)

wherein $R^{14}$ is an alkyl group or an aryl group, and is bonded to a silicon atom through a Si—C bond; $R^{15}$ is an alkoxy group, an acyloxy group, or a halogen group; Y is an alkylene group, an alkenylene group, or an arylene group; f is an integer of 0 or 1: and g is an integer of 0 or 1.

5. A radiation sensitive composition comprising, as a polymer, a hydrolysis-condensation product of a hydrolyzable silane comprising a combination of the hydrolyzable silane of Formula (1) and the hydrolyzable silane of Formula (2) as claimed in claim 1 and the hydrolyzable silane of Formula (3):

  Formula (3)

wherein $R^{12}$ is an alkyl group, an aryl group, a halogenated alkyl group, a halogenated aryl group, an alkenyl group, or an organic group having a mercapto group, a sulfonamide group, or a cyano group, or a combination of these groups, and is bonded to a silicon atom through a Si—C bond; $R^{13}$ is an alkoxy group, an acyloxy group, or a halogen group; and e is an integer of 0 to 3, and the hydrolyzable silane of Formula (4):

  Formula (4)

wherein $R^{14}$ is an alkyl group or an aryl group, and is bonded to a silicon atom through a Si—C bond; $R^{15}$ is an alkoxy group, an acyloxy group, or a halogen group; Y is an alkylene group, an alkenylene group, or an arylene group; f is an integer of 0 or 1: and g is an integer of 0 or 1.

6. The radiation sensitive composition according to claim 1, further comprising a quencher.

7. The radiation sensitive composition according to claim 1, further comprising a crosslinking agent.

8. A method for forming a resist pattern, the method comprising the steps of:
 applying the radiation sensitive composition as claimed in claim 1 onto a semiconductor substrate and baking the composition to form a resist film;
 exposing the resist film to light; and
 after the exposure, developing the resist film to form a resist pattern.

9. A method for producing a semiconductor device, the method comprising the steps of:
 applying the radiation sensitive composition as claimed in claim 1 onto a semiconductor substrate and baking the composition to form a resist film;
 exposing the resist film to light;
 after the exposure, developing the resist film to form a resist pattern; and
 processing the semiconductor substrate using the resist pattern.

10. A method for producing a semiconductor device, the method comprising the steps of:
 forming an organic underlayer film on a semiconductor substrate;
 applying the radiation sensitive composition as claimed in claim 1 onto the underlayer film and baking the composition to form a resist film;
 exposing the resist film to light;
 after the exposure, developing the resist film to form a resist pattern;
 etching the organic underlayer film using the resist pattern; and
 processing the semiconductor substrate using the patterned organic underlayer film.

11. The radiation sensitive composition according to claim 1, further comprising as a silane, a hydrolyzable silane, or a hydrolysis product thereof.

* * * * *